(12) United States Patent
Tanio et al.

(10) Patent No.: US 12,126,364 B2
(45) Date of Patent: Oct. 22, 2024

(54) DELTA-SIGMA MODULATION APPARATUS, DELTA-SIGMA MODULATION METHOD, AND RECORDING MEDIUM

(71) Applicant: NEC Corporation, Tokyo (JP)

(72) Inventors: Masaaki Tanio, Tokyo (JP); Naoto Ishii, Tokyo (JP); Kazushi Muraoka, Tokyo (JP)

(73) Assignee: NEC CORPORATION, Tokyo (JP)

(\*) Notice: Subject to any disclaimer, the term of this patent is extended or adjusted under 35 U.S.C. 154(b) by 160 days.

(21) Appl. No.: 17/881,152

(22) Filed: Aug. 4, 2022

(65) Prior Publication Data

US 2023/0054311 A1 Feb. 23, 2023

(30) Foreign Application Priority Data

Aug. 18, 2021 (WO) .................. PCT/JP2021/030240
Jun. 28, 2022 (JP) .................. 2022-103703

(51) Int. Cl.
*H03M 3/00* (2006.01)
*H04B 1/04* (2006.01)

(52) U.S. Cl.
CPC .......... *H03M 3/344* (2013.01); *H04B 1/0475* (2013.01); *H03M 3/43* (2013.01); *H03M 3/458* (2013.01)

(58) Field of Classification Search
CPC ........ H03M 3/344; H03M 3/43; H03M 3/458; H04B 1/0475
USPC ................................................ 341/120, 143
See application file for complete search history.

(56) References Cited

U.S. PATENT DOCUMENTS

| | | | |
|---|---|---|---|
| 10,868,572 B2* | 12/2020 | Wang | H04B 10/2575 |
| 2013/0308960 A1 | 11/2013 | Horikoshi et al. | |
| 2015/0061773 A1 | 3/2015 | Shi et al. | |
| 2017/0331490 A1* | 11/2017 | Maehata | H03K 7/08 |
| 2020/0287553 A1 | 9/2020 | Sudo | |
| 2021/0266070 A1 | 8/2021 | Yang et al. | |

FOREIGN PATENT DOCUMENTS

| | | |
|---|---|---|
| JP | 2015-050770 A | 3/2015 |
| JP | 2017-126814 A | 7/2017 |
| JP | 2020-145528 A | 9/2020 |
| JP | 2021-164098 A | 10/2021 |
| WO | 2012/108421 A1 | 8/2012 |
| WO | 2016/103981 A1 | 6/2016 |
| WO | 2016/147530 A1 | 9/2016 |

(Continued)

OTHER PUBLICATIONS

International Search Report for PCT Application No. PCT/JP2021/030240, mailed on Nov. 16, 2021.

(Continued)

*Primary Examiner* — Khai M Nguyen
(74) *Attorney, Agent, or Firm* — Sughrue Mion, PLLC

(57) ABSTRACT

A delta-sigma modulation apparatus performs delta-sigma modulation on a first signal as an input signal and outputs a second signal, outputs, using the second signal and a third signal generated through a transmission process of the second signal, a fourth signal that is an approximated value of a signal which is generated through at least part of the transmission process, and performs the delta-sigma modulation on the first signal using the fourth signal and outputs the second signal.

19 Claims, 48 Drawing Sheets

(56) References Cited

FOREIGN PATENT DOCUMENTS

WO    2018/230112 A1    12/2018
WO    2020/083508 A1    4/2020
WO    2020/175581 A1    9/2020

OTHER PUBLICATIONS

International Search Report for PCT Application No. PCT/JP2021/030241, mailed on Nov. 22, 2021.
Written opinion for PCT Application No. PCT/JP2021/030241, mailed on Nov. 22, 2021.
T. Maehata, S. Kameda, and N. Suematsu, "1-bit feedforward distortion compensation technology for bandpass delta-sigma modulation," IEICE Trans. Commun., vol. E99-B, No. 5, pp. 1087-1092. May 2016.
A.Frappe, A.Flament, B.Stefanelli, A.Kaiser, and A.Cathelin, "An all-digital RF signal generator using high-speed SD modulators," IEEE Journal of Solid-State Circuits, vol. 44, No. 10, pp. 2722-2732, Oct. 2009.
H. Li et al., "Real-Time 100-GS/s Sigma-Delta Modulator for All-Digital Radio-over-Fiber Transmission," J. Lightw. Technol. vol. 38, No. 2, pp. 386-393, Jul. 2019.
English translation of Written opinion for PCT Application No. PCT/JP2021/030241, mailed on Nov. 22, 2021.

* cited by examiner

DELTA-SIGMA MODULATION APPARATUS, DELTA-SIGMA MODULATION METHOD, AND RECORDING MEDIUM

CROSS-REFERENCES TO RELATED APPLICATION

This application claims the benefit of priority to International Application No. PCT/JP2021/030240, filed Aug. 18, 2021, and Japanese Patent Application No. 2022-103703, filed Jun. 28, 2022, the entire contents of which are incorporated herein by reference.

BACKGROUND

Technical Field

The present disclosure relates to a delta-sigma modulation apparatus, a delta-sigma modulation method, a program, and a recording medium.

Background Art

In the field of radio communication, the development of a technology for implementing high-speed communication is pursued in order to cope with an increase in traffic. In general, a radio communication apparatus needs to include a high-speed and high-precision Digital-to-Analog Converter (DAC) in order to implement high-speed communication. However, the problem is that such an apparatus consumes a large amount of power.

To solve this problem, delta-sigma modulation is sometimes used (see, for example, Patent Literature 1, Non Patent Literature 1, and Non Patent Literature 2). Delta-sigma modulation is processing to convert an analog signal as an input signal to a quantized signal (a pulse train). Delta-sigma modulation can reduce the resolution requirement of the DAC (to 1 bit in some cases). This makes it possible to reduce power consumption of the radio communication apparatus.

On the other hand, in the radio communication apparatus, a configuration in which a plurality of functions of a radio access network apparatus are distributed between physically separated two apparatuses is known. For example, a base station is divided into a Base Band Unit (BBU) and a Remote Unit (RU). Note that the RU may be referred to as a Remote Radio Unit (RRU), a Remote Radio Head (RRH), or a Remote Antenna Unit (RAU). The BBU and the RU are connected via a communication path (for example, an optical fiber). In this configuration, Radio over Fiber (RoF) technology is used for transmission of a signal between the BBU and the RU.

In recent years, a system using delta-sigma modulation and the RoF technology has been studied (see, for example, Non Patent Literature 3). Hereinafter, such a system is referred to as the "RoF system". In the RoF system, a pulse train output by delta-sigma modulation is transmitted from the BBU to the RU via an optical fiber. In this case, the RU restores the pulse train to an original analog signal, which is not subjected to delta-sigma modulation, through an analog band-pass filter (BPF), for example. Since the RU does not have to include the DAC, it is possible to reduce power consumption of the RU.

[Patent Literature 1] WO 2016/103981
[Patent Literature 2] WO 2020/175581
[Patent Literature 3] WO 2018/230112
[Patent Literature 4] WO 2012/108421
[Patent Literature 5] JP 2021-164098 A
[Non Patent Literature 1] T. Maehata, S. Kameda, and N. Suematsu, "1-bit feedforward distortion compensation technology for bandpass delta-sigma modulation," IEICE Trans. Commun., vol. E99-B, no. 5, pp. 1087-1092, May 2016
[Non Patent Literature 2] A. Frappe, A. Flament, B. Stefanelli, A. Kaiser, and A. Cathelin, "An all-digital RF signal generator using high-speed SD modulators," IEEE Journal of Solid-State Circuits, vol. 44, no. 10, pp. 2722-2732, October 2009
[Non Patent Literature 3] H. Li et al., "Real-Time 100-GS/s Sigma-Delta Modulator for All-Digital Radio-over-Fiber Transmission," J. Lightw. Technol. vol. 38, no. 2, pp. 386-393, July 2019.

SUMMARY

Incidentally, as described in Non Patent Literature 1, it is known that a phenomenon called spectrum leakage occurs in a configuration using delta-sigma modulation due to distortion that occurs in a waveform. The spectrum leakage here is a phenomenon in which a signal component in a band around a desired frequency band (that is, a band other than a desired frequency band) appears.

Patent Literature 1 discloses a technology of compensating for distortion that occurs due to delta-sigma modulation itself. Specifically, the technology of Patent Literature 1 compensates for distortion caused by the asymmetry of a rising edge and a falling edge of a pulse in a pulse train. However, with the technology of Patent Literature 1, it is impossible to compensate for distortion that occurs in the process of transmission of a pulse train in the RoF system described above, for example.

The present disclosure provides a technology that can suppress distortion which occurs in a signal in the process of transmission of the signal (pulse train) output through delta-sigma modulation.

In one or more example embodiments, a delta-sigma modulation apparatus is provided. The delta-sigma modulation apparatus includes a memory configured to store an instruction, and at least one processor configured to execute the instruction. The processor is configured to perform delta-sigma modulation, and approximate transmission characteristics of at least part of a transmission process. The processor is configured to perform the delta-sigma modulation on a first signal as an input signal and output a second signal. The processor is configured to output, using the second signal and a third signal generated through a transmission process of the second signal, a fourth signal that is an approximated value of a signal which is generated through at least part of the transmission process. The processor is configured to perform the delta-sigma modulation on the first signal using the fourth signal and output the second signal.

In one or more example embodiments, a delta-sigma modulation method is provided. The delta-sigma modulation method includes: performing delta-sigma modulation on a first signal as an input signal, and outputting a second signal; outputting, using the second signal and a third signal generated through a transmission process of the second signal, a fourth signal that is an approximated value of a signal which is generated through at least part of the transmission process; and performing the delta-sigma modulation on the first signal using the fourth signal, and outputting the second signal.

In one or more example embodiments, a non-transitory computer-readable recording medium is provided. The non-transitory computer-readable recording has recorded a program therein, the program causing a processor to execute: performing delta-sigma modulation on a first signal as an input signal, and outputting a second signal; outputting, using the second signal and a third signal generated through a transmission process of the second signal, a fourth signal that is an approximated value of a signal which is generated through at least part of the transmission process; and performing the delta-sigma modulation on the first signal using the fourth signal, and outputting the second signal.

With the above configuration, it is possible to suppress distortion that occurs in a second signal in the process of transmission of the second signal (pulse train) output through delta-sigma modulation. A problem, a configuration, and an effect other than those described above will become apparent from the following description of example embodiments.

DESCRIPTION OF THE EXAMPLE EMBODIMENTS

Figure 1:
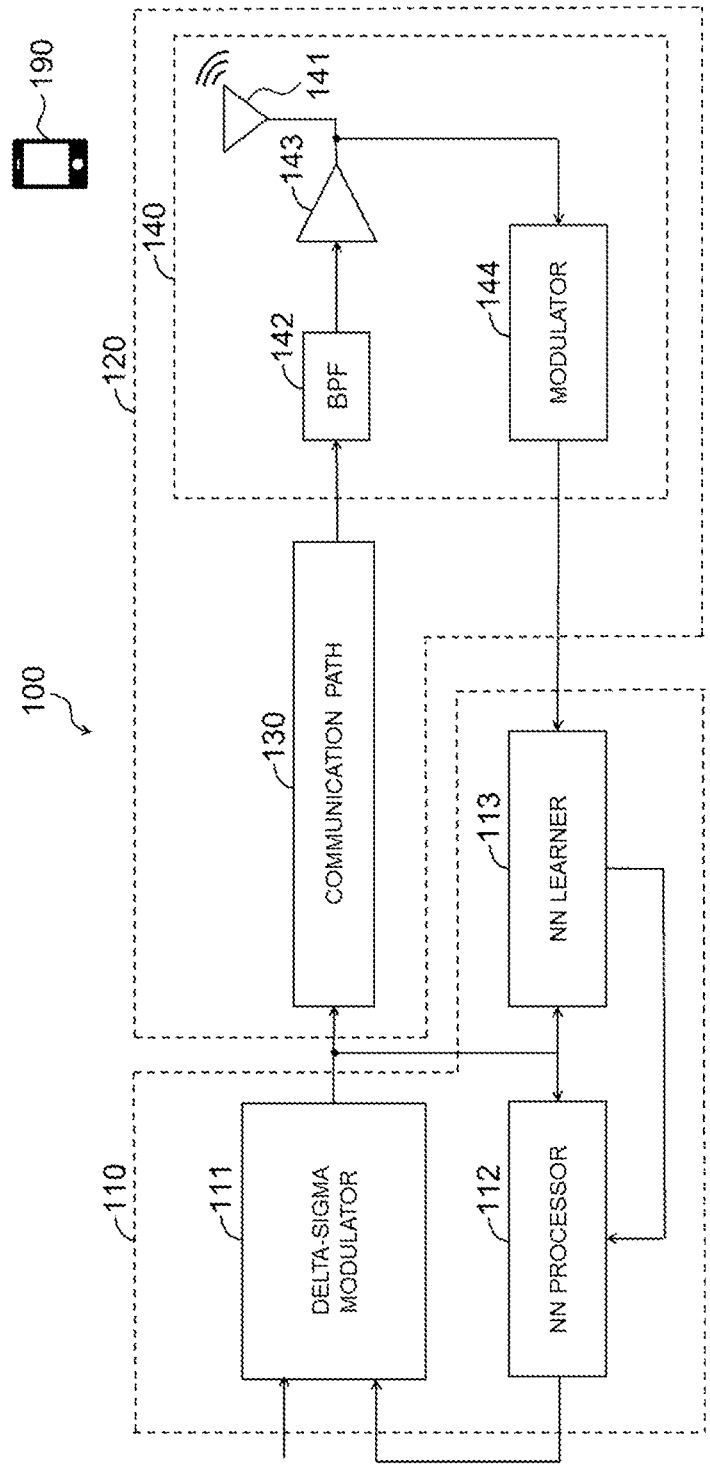
FIG. 1 is a diagram illustrating the schematic configuration of a radio communication apparatus according to a first example embodiment.

Hereinafter, one or more example embodiments will be described with reference to the accompanying drawings. Note that elements that can be described in a similar manner in the Specification and the drawings are denoted by the same sign, whereby overlapping explanations are omitted.

A description will be given in the following order.
1. Outline of example embodiments
2. First example embodiment
   2-1. Schematic configuration of a radio communication apparatus
   2-2. Configuration of a delta-sigma modulator
   2-3. Configuration of a neural network processor
   2-4. Outline of the configuration of a neural network learner
   2-5. Configuration of a communication path
   2-6. Configuration of a band-pass filter
   2-7. Configuration of a modulator
   2-8. Specific configuration of the neural network learner
   2-9. Flow of processing of a delta-sigma modulation apparatus
   2-10. Specific configuration example of a radio communication apparatus
   2-11. Configuration of a first apparatus
   2-12. Configuration of a second apparatus
   2-13. Flow of processing of the radio communication apparatus
   2-14. Example alterations
3. Second example embodiment
   3-1. Schematic configuration of a radio communication apparatus
   3-2. Configuration of a first apparatus
   3-3. Configuration of a second apparatus
   3-4. Outline of a flow of processing of the radio communication apparatus
   3-5. Flow of processing of the radio communication apparatus
   3-6. Example alterations
4. Third example embodiment
   4-1. Schematic configuration of a radio communication apparatus
   4-2. Configuration of a first apparatus
   4-3. Configuration of a second apparatus
5. Fourth example embodiment
   5-1. Schematic configuration of a radio communication apparatus
   5-2. Configuration of a first apparatus
   5-3. Configuration of a second apparatus
   5-4. Flow of processing of the radio communication apparatus
   5-5. Example alterations
6. Fifth example embodiment
   6-1. Configuration of a delta-sigma modulation apparatus
   6-2. Flow of processing of the delta-sigma modulation apparatus
7. Sixth example embodiment
   7-1. Configuration of a delta-sigma modulation apparatus
   7-2. Configuration of a model
   7-3. Flow of processing of the delta-sigma modulation apparatus
   7-4. Example alterations 1. Outline of Example Embodiments The outline of one or more example embodiments, which will be described later, is explained.

(1) Technical Problem

Figure 47:
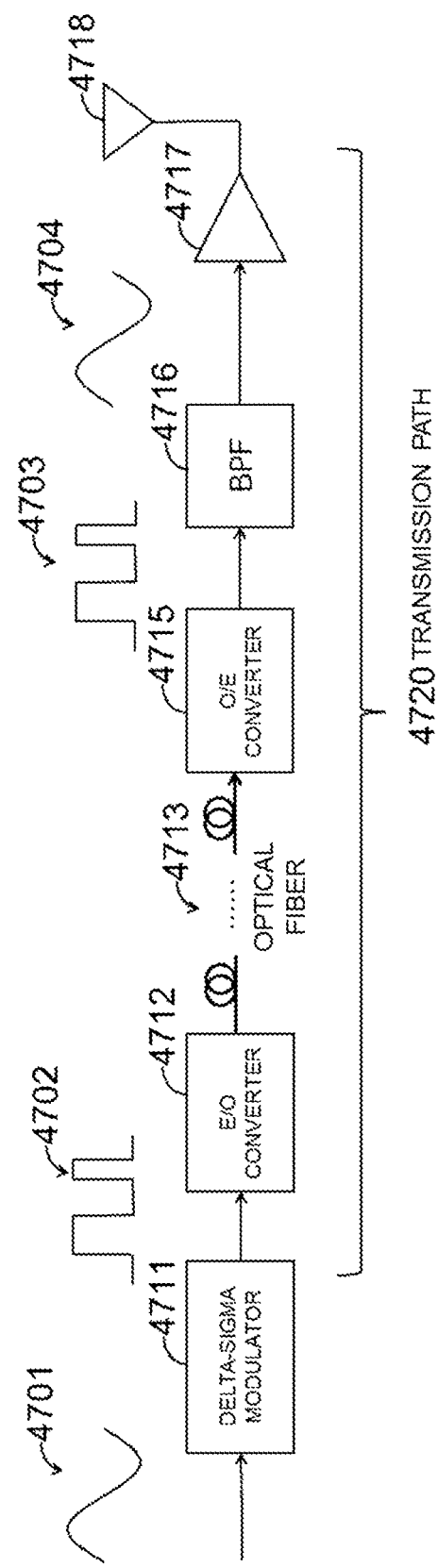
FIG. 47 is an example of a system using delta-sigma modulation and the RoF technology.

FIG. 47 is an example of a system using delta-sigma modulation and the RoF technology. An analog signal 4701 as an input signal is converted to a quantized signal (a pulse train) 4702 through a delta-sigma modulator 4711. Note that this delta-sigma modulator 4711 has a common 1-input 1-output configuration and the quantized signal (the pulse train) is fed back in the delta-sigma modulator 4711. The pulse train 4702 passes through a transmission path 4720 including an optical fiber 4713. The pulse train 4702 is first converted to an optical signal through an Electric-Optic converter (E/O converter) 4712. The optical signal is transmitted over the optical fiber 4713. Then, the optical signal is converted to an electrical signal 4703 through an Optic-Electric converter (O/E converter) 4715. The electrical signal 4703 is converted to an original analog signal 4704, which is not subjected to delta-sigma modulation, through a band-pass filter (BPF) 4716. The analog signal 4704 is amplified using an amplifier 4717. The amplified analog signal is output from an antenna 4718.

In the system of FIG. 47, ideal delta-sigma modulation is performed. Distortion does not occur in the pulse train 4702 in a transmission process of the pulse train 4702. As a result, spectrum leakage does not occur.

Figure 48:
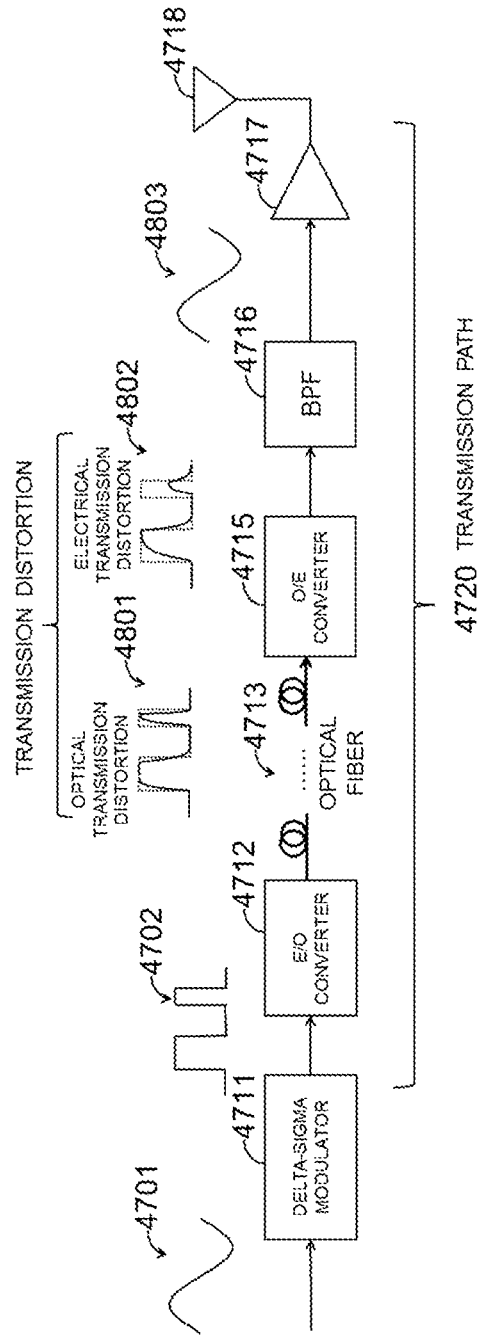
FIG. 48 is an example of a system using delta-sigma modulation and the RoF technology.

FIG. 48 is an example of a system using delta-sigma modulation and the RoF technology. In this system, distortion occurs in a pulse train 4702 in a transmission process of the pulse train 4702. For example, distortion occurs when an optical signal passes through an optical fiber 4713. Such distortion is referred to as "optical transmission distortion". A pulse train 4801 represents a state in which optical transmission distortion has occurred.

Furthermore, distortion also occurs when power reflection between an O/E converter 4715 and a BPF 4716 is large. Such distortion is referred to as "electrical transmission distortion". A pulse train 4802 represents a state in which electrical transmission distortion has occurred. Hereinafter, optical transmission distortion and electrical transmission distortion are collectively referred to as "transmission distortion".

Transmission distortion eventually affects a frequency component of an analog signal 4803 that is output via the BPF 4716. Specifically, the above-mentioned spectrum leakage occurs. The signal to noise ratio (SN ratio) of the analog signal 4803 decreases. As described above, the problem is that transmission distortion causes a reduction in signal quality. In view of these circumstances, a configuration that can suppress transmission distortion is needed.

(2) Technical Feature

In one or more example embodiments, a delta-sigma modulation apparatus is provided. The delta-sigma modulation apparatus includes a delta-sigma modulator that performs delta-sigma modulation and a modeling processor that approximates transmission characteristics of at least part of a transmission process. The delta-sigma modulator performs delta-sigma modulation on a first signal as an input signal and outputs a second signal. The modeling processor outputs, using the second signal and a third signal generated through a transmission process of the second signal, a fourth signal that is an approximated value of a signal which is generated through at least part of the transmission process. The delta-sigma modulator performs the delta-sigma modulation on the first signal using the fourth signal and outputs the second signal.

The 1-input 1-output configuration explained in FIG. 47 (that is, the delta-sigma modulator 4711 in which the quantized signal is directly fed back) is generally referred to as delta-sigma modulation. On the other hand, in one or more example embodiments of the present disclosure, the second signal is not directly fed back as the fourth signal, and the second signal and the fourth signal are separated via the modeling processor. The delta-sigma modulator has a configuration that receives two signals: the first signal and the fourth signal as input signals and outputs the second signal, that is, a 2-input 1-output configuration. In one or more example embodiments of the present disclosure, for the sake of convenience, such a 2-input 1-output configuration is defined as delta-sigma modulation.

The delta-sigma modulation apparatus having the above configuration can suppress transmission distortion that occurs in the second signal in the transmission process of the second signal. The delta-sigma modulation apparatus can reduce the possibility of the occurrence of spectrum leakage and thereby perform high-quality signal transmission.

In another example embodiment, a delta-sigma modulation apparatus includes a delta-sigma modulator that performs delta-sigma modulation on a first signal as an external input signal and outputs a second signal, a neural network processor that includes a first neural network operating according to a predetermined first parameter, and a neural network learner that calculates the first parameter.

The neural network learner calculates the first parameter using the second signal, and a third signal generated through a transmission process of the second signal.

The neural network processor updates the first parameter to the first parameter calculated by the neural network learner.

The neural network processor outputs a fourth signal using the second signal through the first neural network. The fourth signal is an approximated value of a signal which is generated through at least part of the transmission process of the second signal.

The delta-sigma modulator performs delta-sigma modulation on the first signal using the fourth signal that is output from the neural network processor, and outputs the second signal.

Also in the example embodiment, the second signal is not directly fed back as the fourth signal, and the second signal and the fourth signal are separated via the neural network processor. The delta-sigma modulator has a configuration that receives two signals: the first signal and the fourth signal as input signals and outputs the second signal, that is, a 2-input 1-output configuration.

Note that the neural network learner may calculate the first parameter using the third signal and a restored signal of the second signal generated from the third signal.

The delta-sigma modulation apparatus having the above configuration can suppress transmission distortion that occurs in the second signal in the transmission process of the second signal. The delta-sigma modulation apparatus can reduce the possibility of the occurrence of spectrum leakage and thereby perform high-quality signal transmission.

2. First Example Embodiment

Next, a first example embodiment and example alterations thereof are described with reference to FIGS. 1 to 16.

2-1. Schematic Configuration of a Radio Communication Apparatus

FIG. 1 is a diagram illustrating the schematic configuration of a radio communication apparatus 100. The radio communication apparatus 100 is an apparatus conforming to the technical specifications of the Third Generation Partnership Project (3GPP). Specifically, the radio communication apparatus 100 may be an apparatus conforming to the technical specifications of the 5th Generation (5G). It goes without saying that the radio communication apparatus 100 is not limited to this example.

The radio communication apparatus 100 includes a delta-sigma modulation apparatus 110 and a transmission path 120. The radio communication apparatus 100 converts a signal output by the delta-sigma modulation apparatus 110 to a radio signal via the transmission path 120 and transmits the radio signal to a terminal apparatus 190.

The delta-sigma modulation apparatus 110 includes a delta-sigma modulator 111, a neural network processor 112, and a neural network learner 113. Hereinafter, the neural network processor 112 is referred to as the "NN processor 112". The neural network learner 113 is referred to as the "NN learner 113".

The transmission path 120 includes a communication path 130 and a transmitter 140. The communication path 130 connects the delta-sigma modulator 111 and the transmitter 140. The transmitter 140 includes an antenna 141, a bandpass filter (BPF) 142, an amplifier 143, and a modulator 144.

The delta-sigma modulator 111 performs delta-sigma modulation on an analog signal as an external input signal and outputs a quantized signal (a 1-bit pulse train). The quantized signal is transmitted to the BPF 142 via the communication path 130. The BPF 142 performs, on the quantized signal, bandpass processing (hereinafter referred to as "BPF processing") which allows only a desired frequency band to pass therethrough. The quantized signal is converted to an analog signal through the BPF 142. That is, the quantized signal is restored to an original analog signal which is not subjected to delta-sigma modulation. The amplifier 143 amplifies the analog signal. The antenna 141 outputs the amplified analog signal. As described above, the transmitter 140 has the function of transmitting a signal to the terminal apparatus 190.

Note that the amplified analog signal is also output to the modulator 144. The modulator 144 performs modulation processing on the analog signal and outputs the modulated analog signal to the NN learner 113. As described above, the transmitter 140 also has the function of transmitting a signal generated through a transmission process of the quantized signal output by the delta-sigma modulator 111 (that is, feeding the signal back) to the delta-sigma modulation apparatus 110.

Hereinafter, an analog signal that is input to the delta-sigma modulator 111 is referred to as a "first signal". Furthermore, a quantized signal that is output by the delta-sigma modulator 111 is referred to as a "second signal". In addition, a signal that is generated through a transmission process of the second signal and is fed back to the NN learner 113 is referred to as a "third signal". In other words, the third signal is a signal generated in the process of transmission of the second signal over the transmission path 120. The third signal can contain information on transmission distortion that has occurred in the transmission path 120. Therefore, the third signal is used to feed information on transmission distortion that has occurred in the transmission path 120 back.

Figure 3:
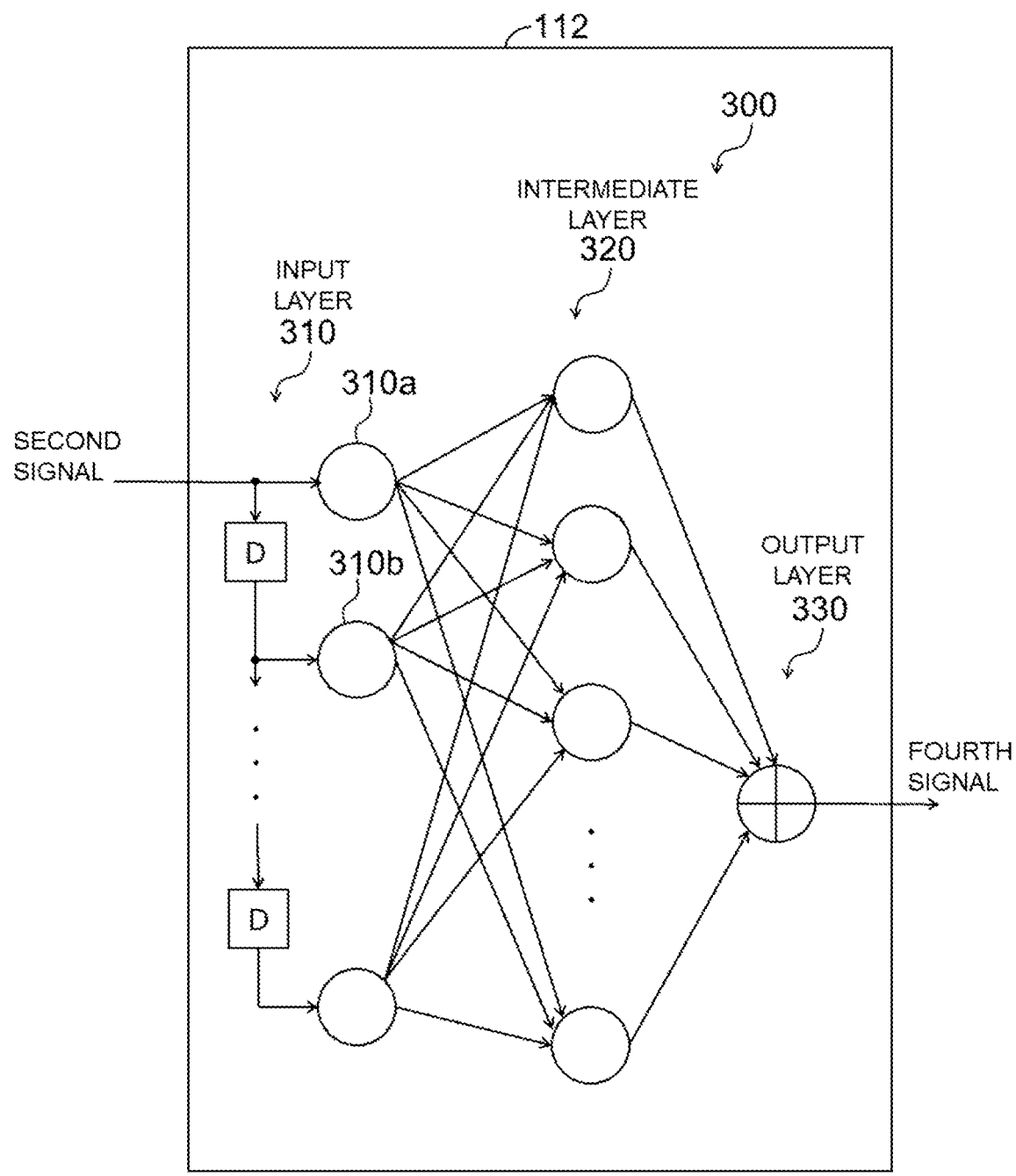
FIG. 3 is a diagram illustrating the configuration of a neural network processor according to the first example embodiment.

The NN processor 112 includes a first neural network 300 that operates according to a predetermined parameter (see FIG. 3). Hereinafter, the first neural network 300 is referred to as the "first NN 300". The parameter of the first NN 300 is referred to as a "first parameter".

The NN learner 113 receives the second signal and the third signal as input signals. The NN learner 113 calculates the first parameter using the second signal and the third signal. The NN learner 113 transmits the calculated first parameter to the NN processor 112.

The NN processor 112 receives the first parameter from the NN learner 113. The NN processor 112 updates the first parameter of the first NN 300 to the received first parameter (that is, the first parameter calculated by the NN learner 113).

The NN processor 112 receives the second signal as an input signal. The NN processor 112 outputs, using the second signal through the first NN 300, an approximated value (an analog signal) of a signal which is generated through at least part of the transmission process of the second signal. Hereinafter, this approximated value is referred to as a "fourth signal". The NN processor 112 can feed information on transmission distortion that occurs in the transmission process of the second signal back to the delta-sigma modulator 111 using the fourth signal.

The delta-sigma modulator 111 receives the first signal and the fourth signal as input signals. The delta-sigma modulator 111 performs delta-sigma modulation on the first signal using the fourth signal and outputs the second signal.

As described above, the delta-sigma modulator 111 has a configuration that receives two signals: the first signal and the fourth signal as input signals and outputs the second signal, that is, a 2-input 1-output configuration. The second signal and the fourth signal are separated by interposing the NN processor 112 between them. The NN processor 112 serves a feedback function. A feature of the present example embodiment is that the first parameter in the NN processor 112 is updated by the NN learner 113.

2-2. Configuration of a Delta-Sigma Modulator

As the type of a device incorporating the delta-sigma modulator 111, there are two types of devices: a band-pass type device (see Non Patent Literature 1) and a low-pass type device (see Non Patent Literature 2). The delta-sigma modulator 111 of the present example is a band-pass type device and is implemented using Non Patent Literature 1 for reference.

Figure 2:
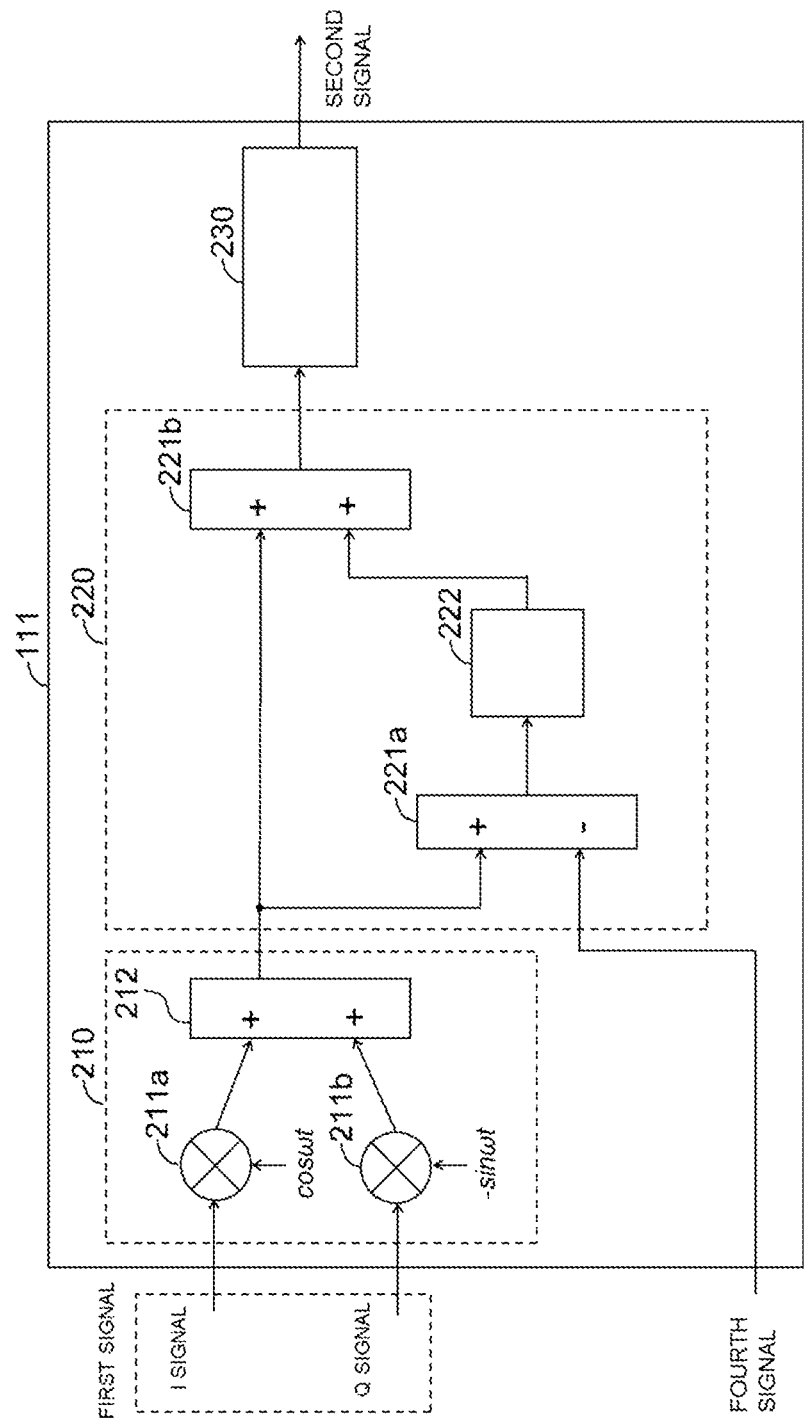
FIG. 2 is a diagram illustrating the configuration of a delta-sigma modulator according to the first example embodiment.

FIG. 2 is a diagram illustrating an example of the configuration of the delta-sigma modulator 111. The delta-sigma modulator 111 includes an up-converter 210, a loop filter 220, and a quantizer 230.

The first signal is a baseband signal and contains an in-phase component signal (hereinafter referred to as an "I signal") and a quadrature component signal (hereinafter referred to as a "Q signal").

The up-converter 210 is a 2-input 1-output constituent element. The up-converter 210 receives the I signal and the Q signal as input signals. The up-converter 210 up-converts the first signal (the I signal and the Q signal) to a desired frequency (a target frequency) f0.

The up-converter 210 includes a first multiplier 211a, a second multiplier 211b, and an adder 212. The first multiplier 211a multiplies the I signal by cos ωt and outputs the multiplication result to the adder 212. The second multiplier 211b multiplies the Q signal by −sin ωt and outputs the multiplication result to the adder 212. Here, "cos( )" is a cosine function and "sin( )" is a sine function (the same applies hereinafter). Furthermore, $\omega=2\times\pi\times f0$.

The adder 212 adds up the multiplication result of the first multiplier 211a and the multiplication result of the second multiplier 211b and outputs the addition result.

The loop filter 220 is a 2-input 1-output element. The loop filter 220 receives the output of the up-converter 210 and the fourth signal as input signals. The loop filter 220 performs processing for suppressing transmission distortion contained in a feedback component (that is, the fourth signal) of the input signals.

The loop filter 220 includes a first adder 221a, a second adder 221b, and a transfer function processor 222.

The first adder 221a adds up the output of the up-converter 210 (the output of the adder 212) and the fourth signal and outputs the addition result to the transfer function processor 222. Here, the output of the first adder 221a is the difference between the output of the up-converter 210 and the fourth signal. In other words, the output of the first adder 221a can contain a component of transmission distortion that occurs in the transmission process of the second signal.

The transfer function processor 222 applies a transfer function to the output of the first adder 221a and outputs a component for suppressing (or canceling) at least part of transmission distortion that occurs in the transmission process (the transmission path 120) of the second signal. The transfer function is a function determining the characteristics of delta-sigma modulation in the present example and is determined based on desired signal transfer function and noise transfer function, for example.

The second adder 221b adds up the output of the up-converter 210 and the output of the transfer function processor 222 and outputs the addition result to the quantizer 230.

As described above, the loop filter 220 outputs, using the output of the up-converter 210 and the fourth signal, a signal (an analog signal) containing a component for suppressing at least part of transmission distortion that occurs in the transmission process of the second signal.

The quantizer 230 is a 1-bit quantizer. The quantizer 230 quantizes the output of the loop filter 220 (the output of the second adder 221b) using 1 bit and outputs the second signal (1-bit pulse train).

As described above, the delta-sigma modulator 111 calculates, using the fourth signal, a component for suppressing at least part of transmission distortion that occurs in the transmission process of the second signal and reflects the component in the second signal.

In other examples, in the loop filter 220, the second adder 221b may be omitted. In this case, the output of the transfer function processor 222 is input to the quantizer 230. The output of the transfer function processor 222 contains the output of the up-converter 210 and a component for suppressing at least part of transmission distortion that occurs in the transmission process of the second signal.

2-3. Configuration of a Neural Network Processor

FIG. 3 is a diagram illustrating an example of the configuration of the NN processor 112. The NN processor 112 includes the first NN 300. The first NN 300 receives the second signal as an input signal and outputs the fourth signal.

In the present example, the fourth signal is an approximated value (an estimated value) of a signal which is generated in the process of passage of the second signal through part of the transmission path 120. More specifically, the fourth signal is an approximated value (an estimated value) of a signal which is generated in the process of passage of the second signal through the communication path 130, the BPF 142, and the amplifier 143. In other words, the fourth signal is an approximated value (an estimated value) of a radio signal that is output from the antenna 141.

Therefore, the fourth signal contains an approximated value of at least part of transmission distortion that occurs through the transmission process of the second signal. Specifically, the fourth signal contains an approximated value of at least part of transmission distortion that occurs in the process of passage of the second signal through the communication path 130, the BPF 142, and the amplifier 143.

The first NN 300 operates according to the first parameter. The first parameter contains a weight and a bias, for example. For example, if a function f of the following formula (1) is assumed to be an activating function in a neural network, x is an input, w is a weight, and b is a bias.

$$f(wx+b) \tag{1}$$

The first NN 300 includes an input layer 310, an intermediate layer 320, and an output layer 330. The intermediate layer 320 is one layer.

The input layer 310 includes a node 310a to which the current value of the second signal is input. Furthermore, the input layer 310 further includes a node 310b to which the past value of the second signal is input. Note that "D" represents a delay. The output layer 330 is a linear layer having no activating function. The first parameter is reflected in the intermediate layer 320. The output layer 330 outputs the sum total of the outputs of a plurality of nodes of the intermediate layer 320 as the fourth signal.

The configuration of the first NN 300 is not limited to the configuration of FIG. 3. Various neural networks that are commonly used may be applied to the present example embodiment. For example, the intermediate layer 320 of the first NN 300 may have a plurality of layers. That is, a multi-layer neural network may be adopted as the first NN 300.

The NN processor 112 receives the first parameter from the NN learner 113. The NN processor 112 updates the first parameter of the first NN 300 to the received first parameter. That is, the NN processor 112 updates the first parameter in accordance with the state of the transmission path 120. Consequently, the NN processor 112 can reflect at least part of transmission distortion that occurs in the current state of the transmission path 120 in the fourth signal.

2-4. Outline of the Configuration of a Neural Network Learner

Figure 4:
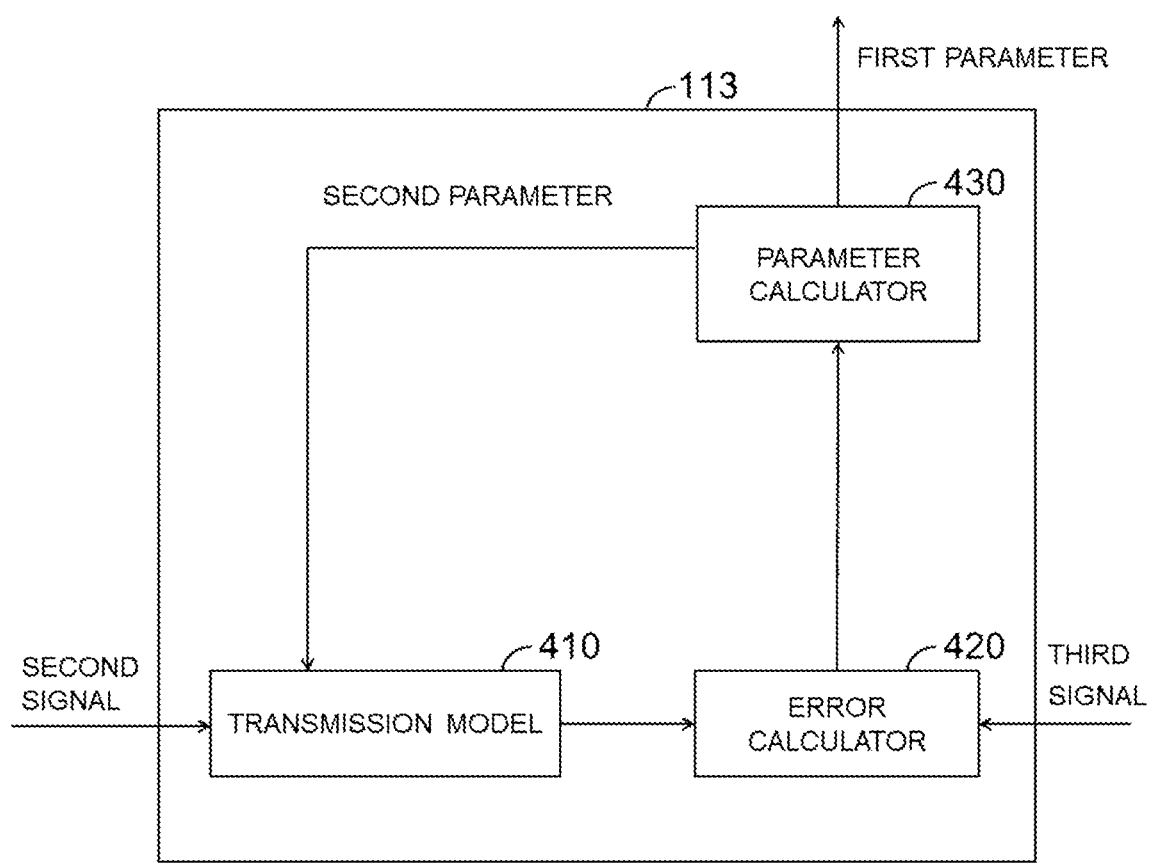
FIG. 4 is a diagram illustrating the configuration of a neural network learner according to the first example embodiment.

FIG. 4 is a diagram illustrating an example of the configuration of the NN learner 113. The NN learner 113 includes a transmission model 410, an error calculator 420, and a parameter calculator 430.

The transmission model 410 is a constituent element obtained by modeling at least part of the transmission process of the second signal. In the present example, the transmission model 410 is a constituent element obtained by modeling the transmission path 120. The transmission model 410 outputs an approximated value (an estimated value) of the third signal using the second signal.

Figure 6:
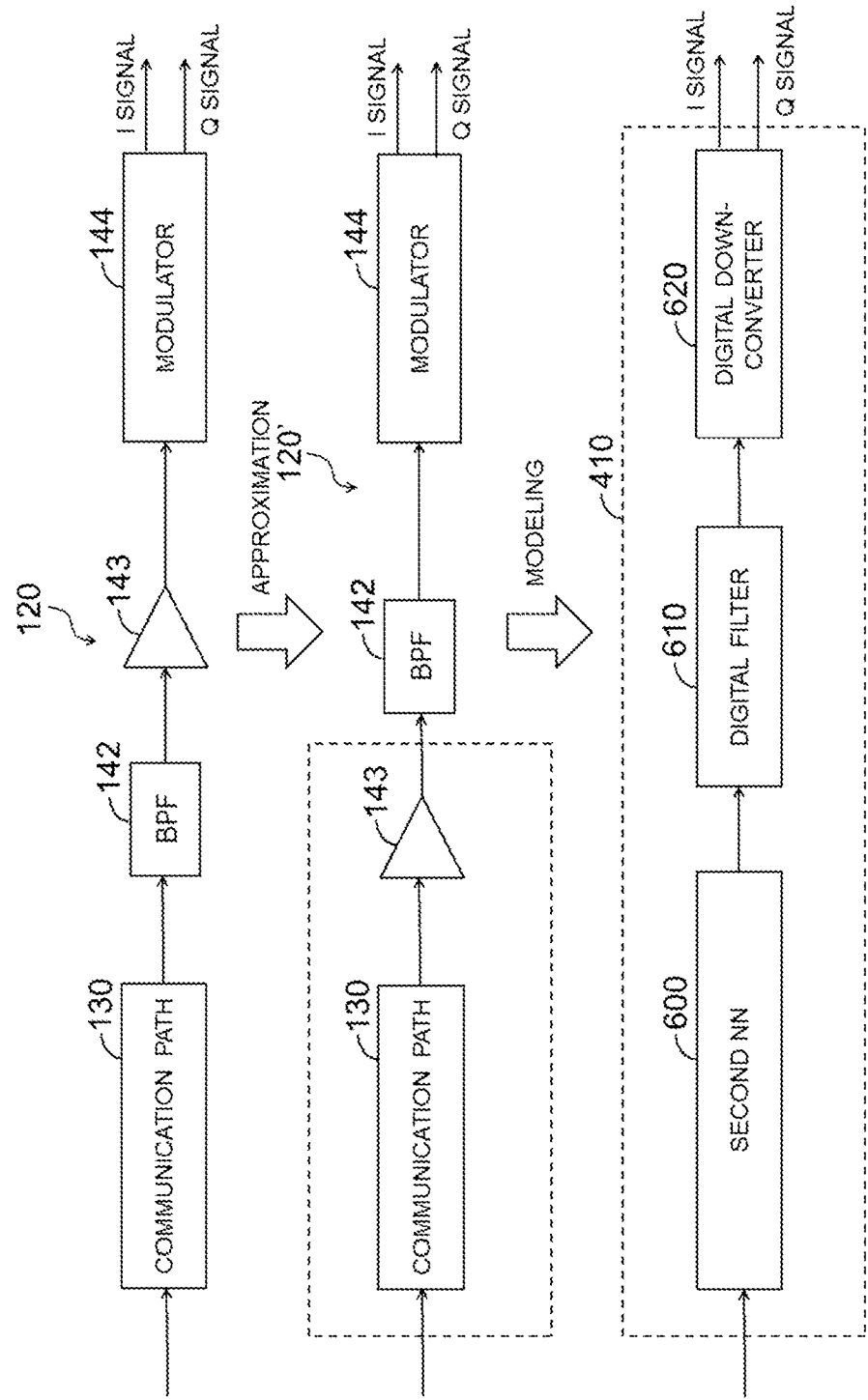
FIG. 6 is a diagram explaining a flow of construction of a transmission model according to the first example embodiment.

The transmission model 410 includes a second neural network 600 that operates according to a predetermined parameter (see FIG. 6). Hereinafter, the second neural network 600 is referred to as the "second NN 600". The parameter of the second NN 600 is referred to as a "second parameter". As in the case of the first parameter, the second parameter contains a weight and a bias.

The error calculator 420 receives the output of the transmission model 410 (the approximated value of the third signal) and the third signal (in the present example, the output of the modulator 144) as input signals. The error calculator 420 calculates an error (the difference) between the output of the transmission model 410 and the third signal. Hereinafter, the error is referred to as an "approximation error". The error calculator 420 outputs the approximation error to the parameter calculator 430.

The parameter calculator 430 calculates the first parameter and the second parameter using the approximation error. The parameter calculator 430 transmits the calculated first parameter to the NN processor 112. Furthermore, the parameter calculator 430 updates the second parameter of the second NN 600 to the calculated second parameter.

As described above, the NN learner 113 learns the current state of the transmission path 120 using the second signal and the third signal. That is, the NN learner 113 calculates the first parameter and the second parameter in accordance with the current state of the transmission path 120. The NN learner 113 can reflect at least part of transmission distortion that occurs in the current state of the transmission path 120 in the first NN 300 and the second NN 600.

2-5. Configuration of a Communication Path

The communication path 130 includes one or both of an electrical transmission line (for example, a metallic line) that transmits an electrical signal and an optical transmission line (for example, an optical fiber) that transmits an optical signal.

Note that the communication path 130 may include one or a combination of an E/O converter that converts an electrical signal to an optical signal, an O/E converter that converts an optical signal to an electrical signal, a band-pass filter, a frequency converter and so forth.

2-6. Configuration of a Band-Pass Filter

The BPF 142 performs BPF processing on the output of the communication path 130. Here, a desired frequency band is a band from f0−fα to f0+fα. fα is any frequency.

The BPF 142 may be configured with an analog device. The BPF 142 may be an LC filter or an RLC filter. The LC filter is a filter that is configured based on a combination of an inductor (L) and a capacitor (C). The RLC filter is a filter that is configured based on a combination of a resistor (R), an inductor (L), and a capacitor (C).

2-7. Configuration of a Modulator

Figure 5:
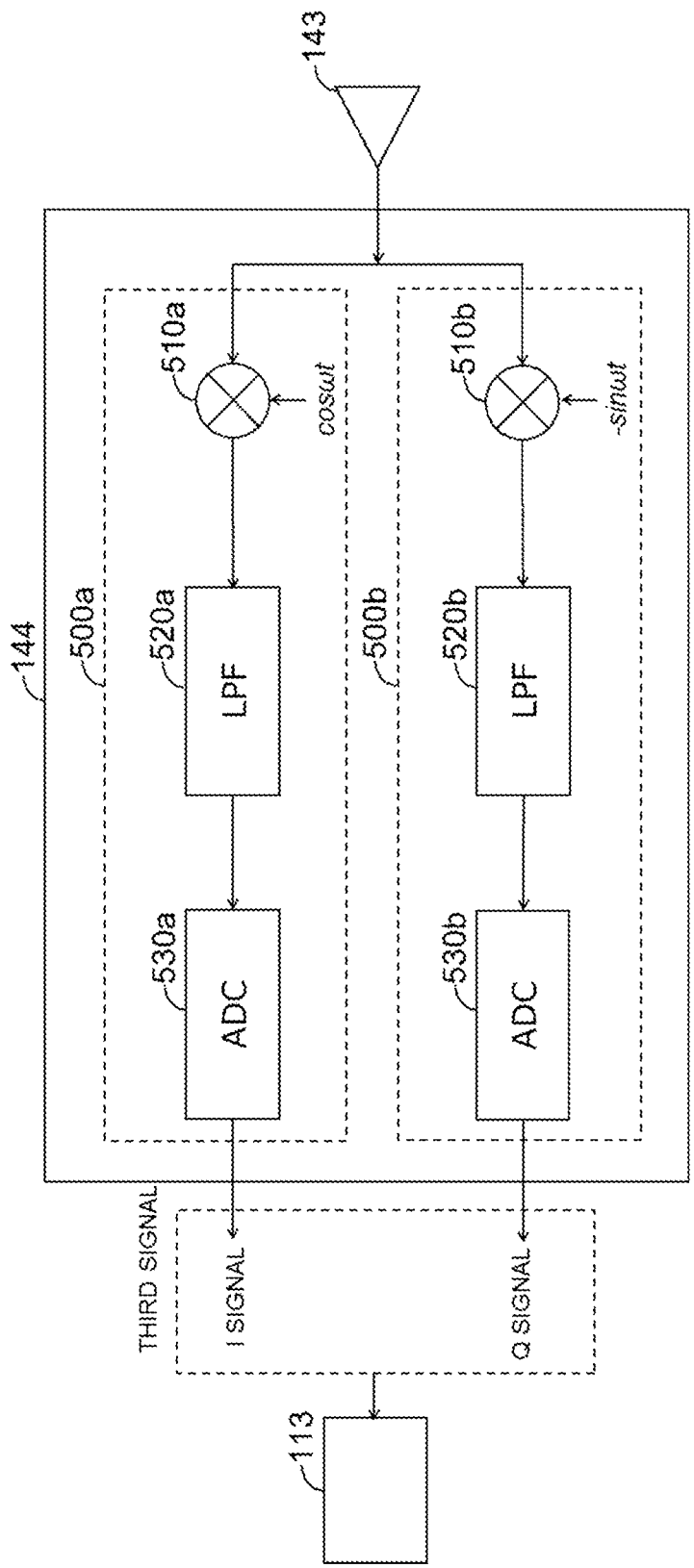
FIG. 5 is a diagram illustrating the configuration of a modulator according to the first example embodiment.

FIG. 5 is a diagram illustrating an example of the configuration of the modulator 144. The modulator 144 down-converts the output of the amplifier 143 by a direct conversion system and outputs the down-converted signal as the third signal.

The modulator 144 includes a first modulator 500*a* and a second modulator 500*b*.

The first modulator 500*a* includes a first multiplier 510*a*, a first low-pass filter (LPF) 520*a*, and a first A/D converter (ADC) 530*a*.

The first multiplier 510*a* multiplies the output of the amplifier 143 by cos ωt and outputs the multiplication result to the first LPF 520*a*. Here, ω=2×π×f0. The first LPF 520*a* performs low-pass filtering processing on the output of the first multiplier 510*a* and outputs the performance result to the first ADC 530*a*. The first ADC 530*a* converts the output of the first LPF 520*a* to a digital signal and thereby outputs a digital I signal.

The second modulator 500*b* includes a second multiplier 510*b*, a second low-pass filter (LPF) 520*b*, and a second A/D converter (ADC) 530*b*.

The second multiplier 510*b* multiplies the output of the amplifier 143 by −sin ωt and outputs the multiplication result to the second LPF 520*b*. The second LPF 520*b* performs low-pass filtering processing on the output of the second multiplier 510*b* and outputs the performance result to the second ADC 530*b*. The second ADC 530*b* converts the output of the second LPF 520*b* to a digital signal and thereby outputs a digital Q signal.

Therefore, the third signal contains the digital I signal and the digital Q signal. The third signal is input to the NN learner 113.

2-8. Specific Configuration of the Neural Network Learner

Next, the specific configuration of the NN learner 113 is described. First, the configuration of the transmission model 410 is described. FIG. 6 is an example of a flow of construction of the transmission model 410.

As shown in an upper row of FIG. 6, the transmission path 120 includes the communication path 130, the BPF 142, the amplifier 143, and the modulator 144. Here, assume that the amplifier 143 does not have strong nonlinearity, that is, the amplifier 143 has strong linearity. Since the BPF 142 also has linearity, as shown in a middle row of FIG. 6, it is possible to exchange the places of the BPF 142 and the amplifier 143. That is, the configuration of the transmission path 120 in the upper row can be approximated by a transmission path 120' in the middle row. This allows the communication path 130 and the amplifier 143 to be collectively modeled.

The communication path 130 and the amplifier 143 are collectively modeled by the second NN 600. The second NN 600 outputs an approximated value (an estimated value) of a signal which is generated through part of the transmission process of the second signal. Specifically, the second NN 600 outputs an approximated value of a signal which is generated in the process of passage of the second signal through the communication path 130 and the amplifier 143.

The BPF 142 is modeled by a digital filter 610. The digital filter 610 may be a Finite impulse response (FIR), for example.

The modulator 144 is modeled by a digital down-converter 620. The digital down-converter 620 has the same function/property as the modulator 144. Therefore, the digital down-converter 620 down-converts the output of the digital filter 610 and outputs a digital I signal and a digital Q signal.

Next, the approximation error that is calculated by the error calculator 420 is described. The approximation error represents an error between the approximated value of the third signal (the output of the transmission model 410) and the actual third signal (the output of the modulator 144).

At the point in time when radio communication apparatus 100 is started, since information on transmission distortion that occurs in the transmission path 120 is not reflected in the second NN 600, the transmission model 410 outputs the second signal as it is. On the other hand, the actual third signal contains transmission distortion that has occurred in the transmission process of the second signal. The greater the magnitude of transmission distortion (hereinafter referred to as the "amount of distortion"), the larger the approximation error. When the approximation error is large, this means that information on transmission distortion currently occurring in the transmission path 120 is not reflected in the first NN 300 and the second NN 600 and therefore transmission distortion cannot be suppressed. On the other hand, even after information on transmission distortion that occurs in the transmission path 120 is reflected in the second NN 600, the amount of distortion varies with time. Therefore, when the approximation error is large, this also means that there is a large difference (error) between the amount of distortion contained in the output of the transmission model 410 and the amount of distortion contained in the actual third signal. Hence the approximation error is a value related to the amount of distortion that has occurred in the transmission process of the second signal.

When the approximation error is small, this means that the output of the transmission model 410 is close to the actual third signal. That is, this means that information on transmission distortion currently occurring in the transmission path 120 is reflected in the first NN 300 and the second NN 600 and therefore transmission distortion can be suppressed.

The error calculator 420 calculates a first difference which is the difference between the I signal output by the transmission model 410 and the I signal contained in the third signal. Since the I signal is a real component, the first difference is a real component. Furthermore, the error calculator 420 calculates a second difference which is the difference between the Q signal output by the transmission model 410 and the Q signal contained in the third signal. Since the Q signal is an imaginary component, the second difference is an imaginary component.

The error calculator 420 calculates the approximation error based on the first difference and the second difference. For example, the approximation error may be a complex number that is represented by the first difference which is a real component and the second difference which is an imaginary component. According to other examples, the approximation error may be the absolute value of the first difference or the absolute value of the second difference, whichever is larger. The approximation error may be calculated by one of publicly known calculation methods as long as the approximation error represents an error between the output of the transmission model 410 and the actual third signal.

The parameter calculator 430 calculates the first parameter and the second parameter using the approximation error and an internal parameter of the transmission model 410. The internal parameter of the transmission model 410 may contain the second parameter of the second NN 600 and an output value of at least one node in the second NN 600. In other examples, the internal parameter of the transmission model 410 may further contain a filter coefficient of the digital filter 610, and a sin wave and a cos wave in the digital down-converter 620. The parameter calculator 430 calculates the first parameter and the second parameter in such a way that the approximation error becomes smaller. For example, the parameter calculator 430 calculates the first parameter and the second parameter in such a way that at least one of the absolute value of the first difference and the absolute value of the second difference becomes smaller.

2-9. Flow of Processing of a Delta-Sigma Modulation Apparatus

Figure 7:
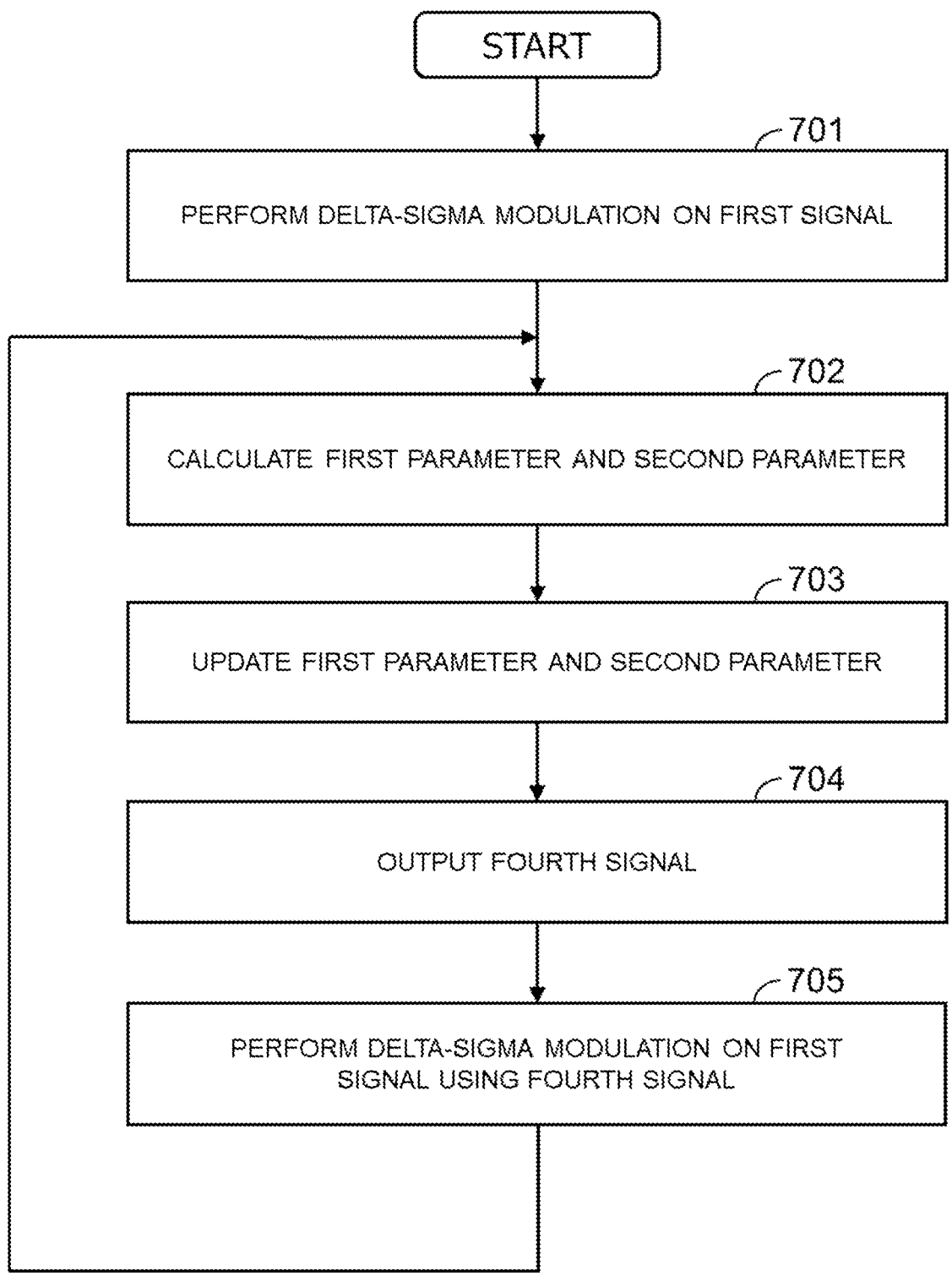
FIG. 7 is a flowchart illustrating a flow of processing of a delta-sigma modulation apparatus according to the first example embodiment.

Next, a flow of processing of the delta-sigma modulation apparatus 110 is described with reference to FIG. 7. FIG. 7 is a flowchart illustrating an example of a flow of processing of the delta-sigma modulation apparatus 110.

When the radio communication apparatus 100 is started (or the radio communication apparatus 100 is reset), the delta-sigma modulator 111 performs delta-sigma modulation on the first signal as an external input signal and outputs the second signal (701).

The NN learner 113 calculates the first parameter and the second parameter using the second signal and the third signal (702). The NN learner 113 transmits the calculated first parameter to the NN processor 112.

The NN processor 112 updates the first parameter of the first NN 300 to the first parameter calculated by the NN learner 113. Furthermore, the NN learner 113 updates the second parameter of the second NN 600 in the transmission model 410 to the calculated second parameter (703).

The NN processor 112 outputs the fourth signal using the second signal through the first NN 300 (704).

The delta-sigma modulator 111 performs delta-sigma modulation on the first signal using the fourth signal and outputs the second signal (705).

Then, the processing from Step 702 to Step 705 is repeatedly performed.

The above configuration attains the following effect. The delta-sigma modulation apparatus 110 receives information on transmission distortion that has occurred in the transmission process (the transmission path 120) of the second signal as the third signal that is fed back. The delta-sigma modulation apparatus 110 calculates the approximation error using the second signal and the third signal, and calculates the first parameter and the second parameter using the approximation error. The delta-sigma modulation apparatus 110 updates the first parameter of the first NN 300 to the calculated first parameter, and updates the second parameter of the second NN 600 to the calculated second parameter. As a result, information on transmission distortion that occurs in the transmission path 120 is reflected in the first NN 300 and the second NN 600. The delta-sigma modulation apparatus 110 performs delta-sigma modulation on the first signal using the fourth signal (the output of the first NN 300). This makes it possible for the delta-sigma modulation apparatus 110 to perform noise shaping that allows a signal component of the target frequency f0 to pass therethrough and shifts noise near the frequency f0 outside of the band.

By the feedback processing described above, the delta-sigma modulation apparatus 110 can suppress transmission distortion that occurs in the transmission process of the second signal. Consequently, the delta-sigma modulation apparatus 110 can suppress spectrum leakage. The delta-sigma modulation apparatus 110 can perform high-quality signal transmission.

2-10. Specific Configuration Example of a Radio Communication Apparatus

Figure 8:
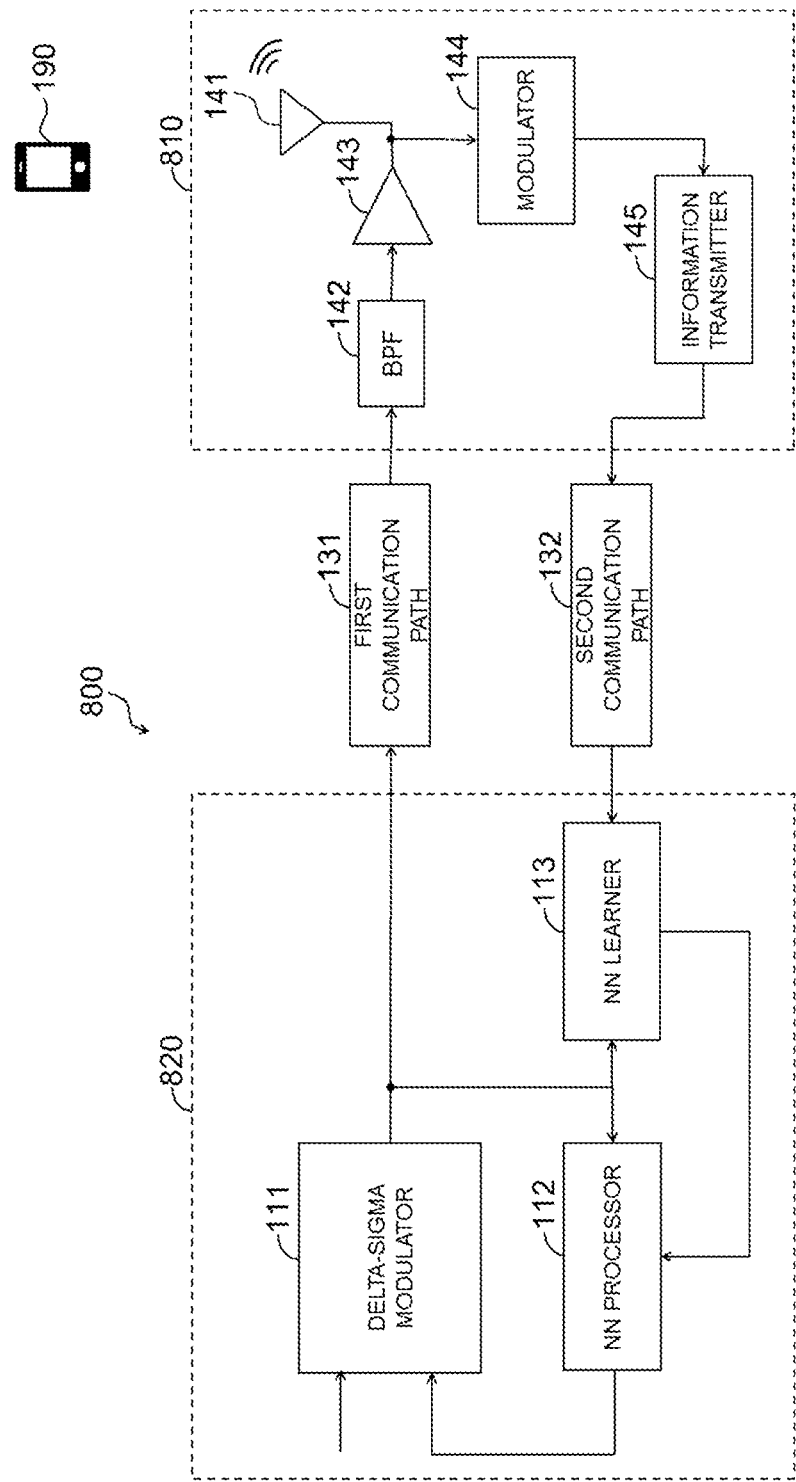
FIG. 8 is a diagram illustrating an example of the specific configuration of a radio communication apparatus according to the first example embodiment.

Next, the specific configuration of a radio communication apparatus is described with reference to FIGS. 8 to 10. FIG. 8 is an example of the specific configuration of a radio communication apparatus 800. The constituent element that has already been explained is denoted by the same sign, whereby a detailed explanation is omitted.

The radio communication apparatus 800 is a node of a Radio Access Network (RAN). In the present example, the radio communication apparatus 800 is a base station. The radio communication apparatus 800 performs radio communication with a terminal apparatus 190 that is located in a coverage area.

The radio communication apparatus 800 includes a plurality of apparatuses (or a plurality of nodes). Specifically, the radio communication apparatus 800 includes a first apparatus 810 and a second apparatus 820. The first apparatus 810 is a node of the radio access network and sometimes referred to as the "first radio access network apparatus". The second apparatus 820 is a node of the radio access network and sometimes referred to as the "second radio access network apparatus".

The first apparatus 810 performs processing related to a first physical layer. In the present example, the processing related to the first physical layer includes BPF processing and amplification processing.

The second apparatus 820 performs processing related to a second physical layer which is a higher-level layer than the first physical layer. In the present example, the processing related to the second physical layer includes delta-sigma modulation. Note that the first and second physical layers may be regarded as being included in the first layer (the lowest layer) of a plurality of layers constituting a communication protocol implemented in the first apparatus 810 and the second apparatus 820.

The first apparatus 810 and the second apparatus 820 are connected via a first communication path 131. The second apparatus 820 transmits the second signal to the first apparatus 810 via the first communication path 131.

The first apparatus 810 and the second apparatus 820 are connected via a second communication path 132. The first apparatus 810 transmits, to the second apparatus 820 via the second communication path 132, information on transmission between the first apparatus 810 and the second apparatus 820. Hereinafter, the information on transmission is referred to as the "transmission-related information".

In the present example, the transmission-related information is information on transmission of the second signal that is transmitted from the second apparatus 820 to the first apparatus 810. Specifically, the transmission-related information is the third signal (that is, the output of a modulator 144) generated in the transmission process of the second signal. The third signal contains information on transmission distortion that has occurred in the transmission process of the second signal.

2-11. Configuration of a First Apparatus

The first apparatus 810 includes an antenna 141, a BPF 142, an amplifier 143, a modulator 144, and an information transmitter 145. The information transmitter 145 controls communication with the second apparatus 820 which is performed via the second communication path 132. Specifically, the information transmitter 145 controls transmission of the transmission-related information.

Figure 9:
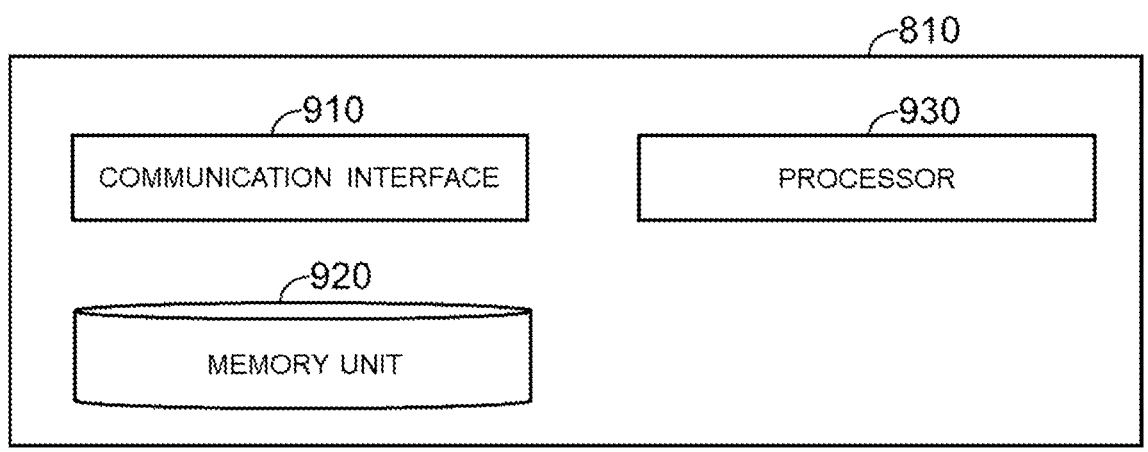
FIG. 9 is a diagram illustrating the hardware configuration of a first apparatus according to the first example embodiment.

FIG. 9 is a diagram illustrating an example of the hardware configuration of the first apparatus 810. The first apparatus 810 includes a communication interface 910, a memory unit 920, and a processor 930.

The communication interface 910 is an interface for communication with other apparatuses. The communication interface 910 includes the antenna 141 for radio communication. Furthermore, the communication interface 910 includes a connection terminal, a connection circuit and the like for communicating with the second apparatus 820 via the first communication path 131. The communication interface 910 includes a connection terminal, a connection circuit and the like for communicating with the second apparatus 820 via the second communication path 132.

The memory unit 920 includes volatile memory and nonvolatile memory. The volatile memory may include Random Access Memory (RAM), for example. The nonvolatile memory may include one or more of Read Only Memory (ROM), a Hard Disk Drive (HDD), and a Solid State Drive (SSD), for example. The nonvolatile memory stores a program code (an instruction) for implementing one or more functions of the first apparatus 810.

The processor 930 includes one or more processors. The one or more processors may include one or more of a Central Processing Unit (CPU), a Micro Processing Unit (MPU), and a microcontroller, for example. The processor 930 implements the one or more functions of the first apparatus 810 by executing the program code (the instruction) stored in the memory unit 920.

The processor 930 may include one or more analog devices and/or analog circuits. The processor 930 may implement the one or more functions of the first apparatus 810 using the one or more analog devices and/or analog circuits. Note that, in the Specification, an expression "A and/or B" shall be interpreted as "A or B" or "A and B".

2-12. Configuration of a Second Apparatus

The second apparatus 820 includes a delta-sigma modulator 111, an NN processor 112, and an NN learner 113.

Figure 10:
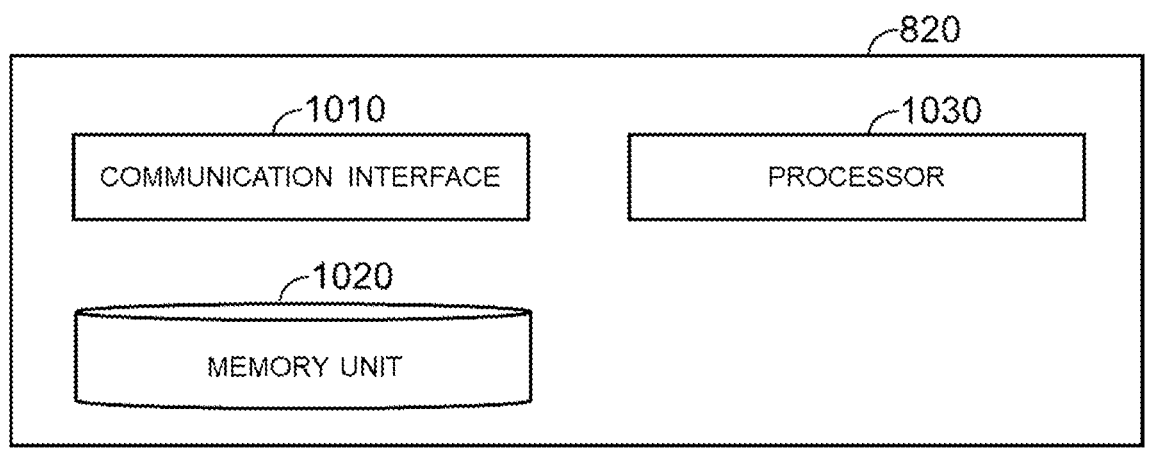
FIG. 10 is a diagram illustrating the hardware configuration of a second apparatus according to the first example embodiment.

FIG. 10 is a diagram illustrating an example of the hardware configuration of the second apparatus 820. The second apparatus 820 includes a communication interface 1010, a memory unit 1020, and a processor 1030.

The communication interface 1010 is an interface for communication with other apparatuses. The communication interface 1010 includes a connection terminal, a connection circuit and the like for communicating with the first apparatus 810 via the first communication path 131. The communication interface 1010 includes a connection terminal, a connection circuit and the like for communicating with the first apparatus 810 via the second communication path 132.

Note that the communication interface 1010 may include a connection terminal, a connection circuit and the like for communicating with a node (not shown in the drawing) of a core network. Furthermore, the communication interface 1010 may include an antenna for performing radio communication with the first apparatus 810.

The memory unit 1020 includes volatile memory and nonvolatile memory. The volatile memory may include RAM, for example. The nonvolatile memory may include one or more of ROM, an HDD, and an SSD, for example. The nonvolatile memory stores a program code (an instruction) for implementing one or more functions of the second apparatus 820.

The processor 1030 includes one or more processors. The one or more processors may include one or more of a CPU, an MPU, and a microcontroller, for example. The processor 1030 implements the one or more functions of the second apparatus 820 by executing the program code (the instruction) stored in the memory unit 1020.

The processor 1030 may include one or more analog devices and/or analog circuits. The processor 1030 may implement the one or more functions of the second apparatus 820 using the one or more analog devices and/or analog circuits.

2-13. Flow of Processing of the Radio Communication Apparatus

Figure 11:
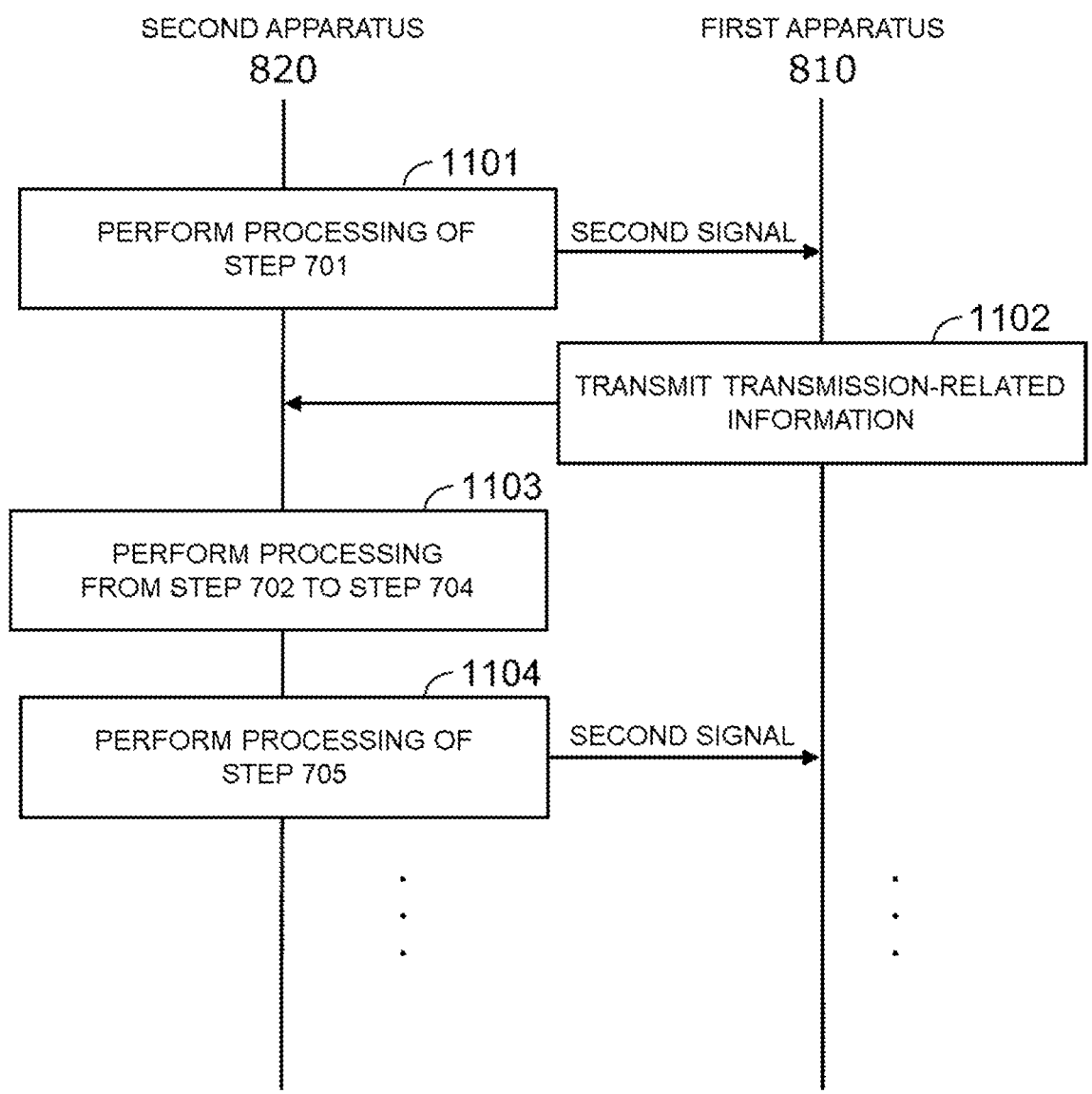
FIG. 11 is a sequence diagram illustrating a flow of processing of the radio communication apparatus according to the first example embodiment.

Next, a flow of processing of the radio communication apparatus 800 is described with reference to FIG. 11. FIG. 11 is a sequence diagram illustrating an example of a flow of processing of the radio communication apparatus 800.

The second apparatus 820 performs the processing of Step 701 of FIG. 7 (1101). Therefore, the second apparatus 820 transmits the second signal to the first apparatus 810.

The first apparatus 810 receives the second signal. Then, the first apparatus 810 (in the present example, the information transmitter 145) transmits the transmission-related information (in the present example, the third signal) to the second apparatus 820 (1102).

The second apparatus 820 receives the transmission-related information and performs the processing from Step 702 to Step 704 of FIG. 7 (1103).

The second apparatus 820 performs the processing of Step 705 of FIG. 7 (1104). Therefore, the second apparatus 820 transmits the second signal to the first apparatus 810. Then, the processing from Step 1102 to Step 1104 is repeatedly performed.

Note that the information transmitter 145 of the first apparatus 810 may transmit the transmission-related information to the second apparatus 820 according to a predetermined rule. The information transmitter 145 may periodically transmit the transmission-related information to the second apparatus 820 (that is, at predetermined time intervals). The information transmitter 145 may non-periodically transmit the transmission-related information to the second apparatus 820.

The above configuration attains the following effect. The first apparatus 810 can feed the transmission-related information back to the second apparatus 820. The second apparatus 820 can receive the transmission-related information and perform appropriate processing on transmission distortion that occurs in the transmission process of the second signal. For example, the second apparatus 820 updates the first parameter of the first NN 300 using the transmission-related information. This allows the second apparatus 820 to transmit, to the first apparatus 810, the second signal containing a component that suppresses transmission distortion. Therefore, it is possible to improve transmission between two apparatuses (the first apparatus 810 and the second apparatus 820).

2-14. Example Alterations

The technology according to the present disclosure is not limited to the example embodiment described above.

(1) First Example Alteration

Figure 12:
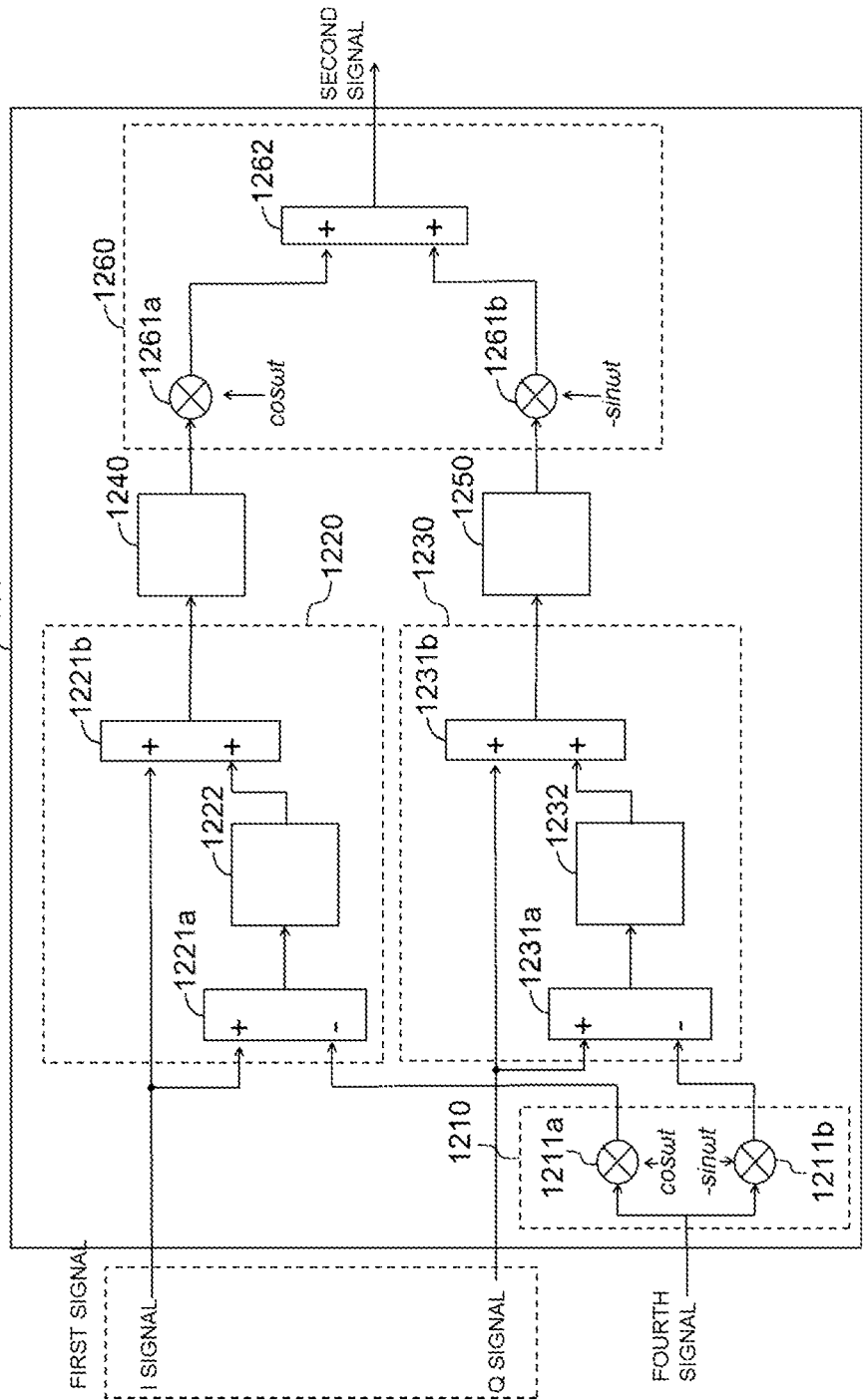
FIG. 12 is a diagram illustrating the configuration of a delta-sigma modulator according to an example alteration.

The delta-sigma modulator 111 may be a low-pass type device. FIG. 12 is a diagram illustrating an example of the configuration of the delta-sigma modulator 111. Hereinafter, the I signal contained in the first signal is referred to as the "first I signal". The Q signal contained in the first signal is referred to as the "first Q signal".

The delta-sigma modulator 111 includes a down-converter 1210, a first loop filter 1220, a second loop filter 1230, a first quantizer 1240, a second quantizer 1250, and an up-converter 1260.

The down-converter 1210 includes a first multiplier 1211*a* and a second multiplier 1211*b*.

The first multiplier 1211*a* multiplies the fourth signal by cos ωt and generates an I component of the fourth signal. Here, ω=2×π×f0. Hereinafter, the I component generated from the fourth signal is referred to as the "second I signal". The first multiplier 1211*a* outputs the second I signal to the first loop filter 1220.

The second multiplier 1211*b* multiplies the fourth signal by −sin ωt and generates a Q component of the fourth signal. Hereinafter, the Q component generated from the fourth signal is referred to as the "second Q signal". The second multiplier 1211*b* outputs the second Q signal to the second loop filter 1230.

As described above, the down-converter 1210 down-converts the fourth signal to the second I signal and the second Q signal.

Note that, when the sampling rate of a signal is set at ¼ times the target frequency f0, that is, f0/4, a signal string of cos ωt is [1, 0, −1, 0, 1, . . . ] and a signal string of −sin ωt is [0, −1, 0, 1, 0, . . . ]. A symbol "I" here represents division. As a result, the above-described multiplication processing is simplified. The present example alteration may include such processing.

The first loop filter 1220 performs processing for suppressing transmission distortion contained in the feedback component (that is, the second I signal). Specifically, the first loop filter 1220 outputs, using the first I signal and the second I signal, a signal containing a first component for suppressing at least part of transmission distortion that occurs in the transmission process (that is, the transmission path 120) of the second signal.

The first loop filter 1220 includes a first adder 1221*a*, a second adder 1221*b*, and a transfer function processor 1222.

The first adder 1221*a* adds up the first I signal and the second I signal. The first adder 1221*a* outputs the addition result to the transfer function processor 1222. Here, the output of the first adder 1221*a* is the difference between the first I signal and the second I signal. In other words, the output of the first adder 1221*a* contains part of a component of transmission distortion that occurs in the transmission process of the second signal.

The transfer function processor 1222 applies a transfer function to the output of the first adder 1221*a* and outputs the first component for suppressing at least part of transmission distortion that occurs in the transmission path 120. The transfer function is a function determining the characteristics of delta-sigma modulation in the present example and is determined based on desired signal transfer function and noise transfer function, for example.

The second adder 1221*b* adds up the first I signal and the output of the transfer function processor 1222 and outputs the addition result to the first quantizer 1240.

The first quantizer 1240 is a 1-bit quantizer. The first quantizer 1240 quantizes the output of the second adder 1221*b* using 1 bit and outputs a first quantized signal to the up-converter 1260.

The second loop filter 1230 performs processing for suppressing transmission distortion contained in the feedback component (that is, the second Q signal). Specifically, the second loop filter 1230 outputs, using the first Q signal and the second Q signal, a signal containing a second component for suppressing at least part of transmission distortion that occurs in the transmission process (that is, the transmission path 120) of the second signal.

The second loop filter 1230 includes a first adder 1231*a*, a second adder 1231*b*, and a transfer function processor 1232.

The first adder 1231*a* adds up the first Q signal and the second Q signal. The first adder 1231*a* outputs the addition result to the transfer function processor 1232. Here, the output of the first adder 1231*a* is the difference between the first Q signal and the second Q signal. In other words, the output of the first adder 1231*a* contains part of a component of transmission distortion that occurs in the transmission process of the second signal.

The transfer function processor 1232 applies a transfer function to the output of the first adder 1231*a* and outputs the second component for suppressing at least part of transmission distortion that occurs in the transmission path 120. The transfer function is a function determining the characteristics of delta-sigma modulation in the present example and is determined based on desired signal transfer function and noise transfer function.

The second adder 1231*b* adds up the first Q signal and the output of the transfer function processor 1232 and outputs the addition result to the second quantizer 1250.

The second quantizer 1250 is a 1-bit quantizer. The second quantizer 1250 quantizes the output of the second adder 1231*b* using 1 bit and outputs a second quantized signal to the up-converter 1260.

The up-converter 1260 is a 2-input 1-output constituent element. The up-converter 1260 includes a first multiplier 1261*a*, a second multiplier 1261*b*, and an adder 1262.

The first multiplier 1261*a* multiplies the first quantized signal by cos ωt and outputs the multiplication result to the adder 1262.

The second multiplier 1261*b* multiplies the second quantized signal by −sin ωt and outputs the multiplication result to the adder 1262.

The adder 1262 adds up the output of the first multiplier 1261*a* and the output of the second multiplier 1261*b* and outputs the second signal. As described above, the up-converter 1260 up-converts the first quantized signal and the second quantized signal and outputs the second signal.

Note that, when the sampling rate of a signal is set at ¼ times the desired frequency f0, that is, f0/4, a signal string of cos ωt is [1, 0, −1, 0, 1, . . . ] and a signal string of −sin ωt is [0, −1, 0, 1, 0, . . . ]. A symbol "I" here represents division. As a result, the multiplication processing is simplified. Furthermore, since the output of the first quantizer 1240 and the output of the second quantizer 1250 are binary-converted signal strings (that is, either 1 or −1), the output of the adder 1262 is also a binary-converted signal string. Quantization of a signal is not impaired by the processing performed by the up-converter 1260. The present example alteration may include such processing.

The above configuration attains the following effect. The fourth signal (the output of the first NN 300) is fed back to the first loop filter 1220 and the second loop filter 1230 via the down-converter 1210. This makes it possible for the delta-sigma modulator 111 to perform noise shaping that allows a signal component of the target frequency f0 to pass therethrough and shifts noise near the frequency f0 outside of the band.

Note that, in the first loop filter 1220, the second adder 1221b may be omitted. In this case, the output of the transfer function processor 1222 is input to the first quantizer 1240. The transfer function in the transfer function processor 1222 is configured in such a way that the output of the transfer function processor 1222 contains the first I signal and the first component.

In the second loop filter 1230, the second adder 1231b may be omitted. In this case, the output of the transfer function processor 1232 is input to the second quantizer 1250. The transfer function in the transfer function processor 1232 is configured in such a way that the output of the transfer function processor 1232 contains the first Q signal and the second component.

(2) Second Example Alteration

The first NN 300 may be configured to output an approximated value of a signal which is generated through part of the transmission path 120. As an example, the first NN 300 outputs an approximated value of a signal which is generated through the process of passage of the second signal through the communication path 130. According to this configuration, it is possible to suppress at least part of transmission distortion that occurs in the transmission path 120.

(3) Third Example Alteration

Figure 13:
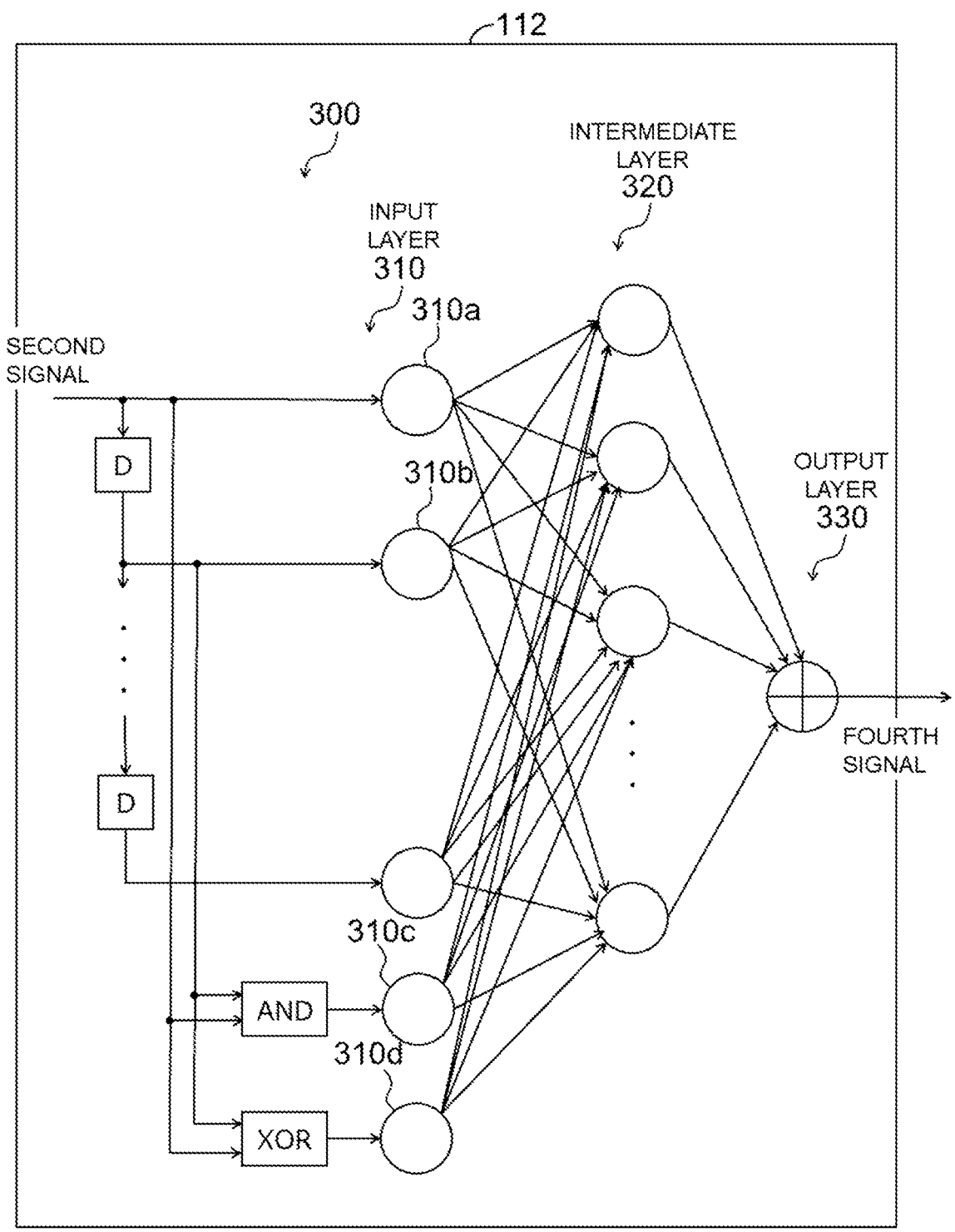
FIG. 13 is a diagram illustrating the configuration of a first neural network according to an example alteration.

The first NN 300 is not limited to the above example. FIG. 13 is a diagram illustrating an example of the configuration of the first NN 300.

The input layer 310 may include nodes 310c and 310d to which the results of logical operations of two nodes in the input layer 310 are input. For example, the logical operations may include a logical multiplication (AND), an exclusive OR (XOR) and the like. Note that the input layer 310 may include a node to which a logical operation between a first result of a logical operation of two nodes and a second result of a logical operation of two nodes is input. That is, the input layer 310 may include a node to which the result of logical operations of two or more nodes in the input layer 310 is input.

The above configuration attains the following effect. The first NN 300 can efficiently generate non-linear distortion, such as intersymbol interference, which occurs in the process of passage of the second signal through the transmission path 120. The accuracy of the fourth signal that is output by the first NN 300 is improved.

Figure 14:
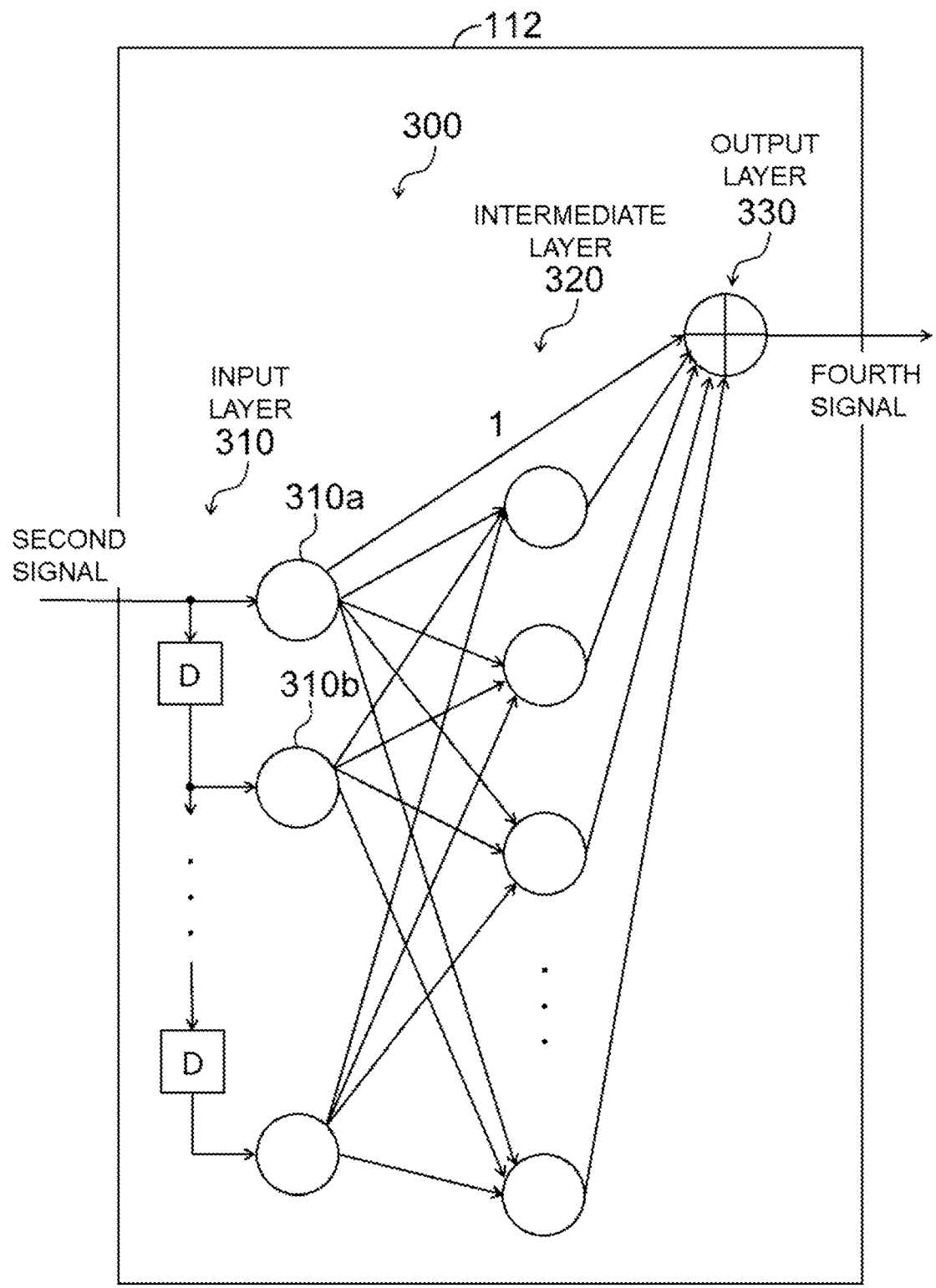
FIG. 14 is a diagram illustrating the configuration of a first neural network according to an example alteration.

FIG. 14 is a diagram illustrating an example of the configuration of the first NN 300. The node 310a may have an output line (a connection line) through which the current value of the second signal is output to the output layer 330 without passing through the intermediate layer 320.

The above configuration attains the following effect. Since the current value of the second signal does not pass through the intermediate layer 320, a weight is not applied to the current value of the second signal. The first NN 300 can efficiently reflect a residual between it and the current input value in the fourth signal. The accuracy of the fourth signal that is output by the first NN 300 is improved.

Note that the first NN 300 may have a combination of the above-described configurations. The input layer 310 includes at least a node to which the current value of the second signal is input. The input layer 310 may further include at least one of a node to which the past value of the second signal is input, a node to which the result of logical operations of two or more nodes in the input layer 310 is input, and a node having an output line through which the current value of the second signal is output to the output layer 330 without passing through the intermediate layer 320. Furthermore, the first NN 300 may include various publicly known structures.

(4) Fourth Example Alteration

Figure 15:
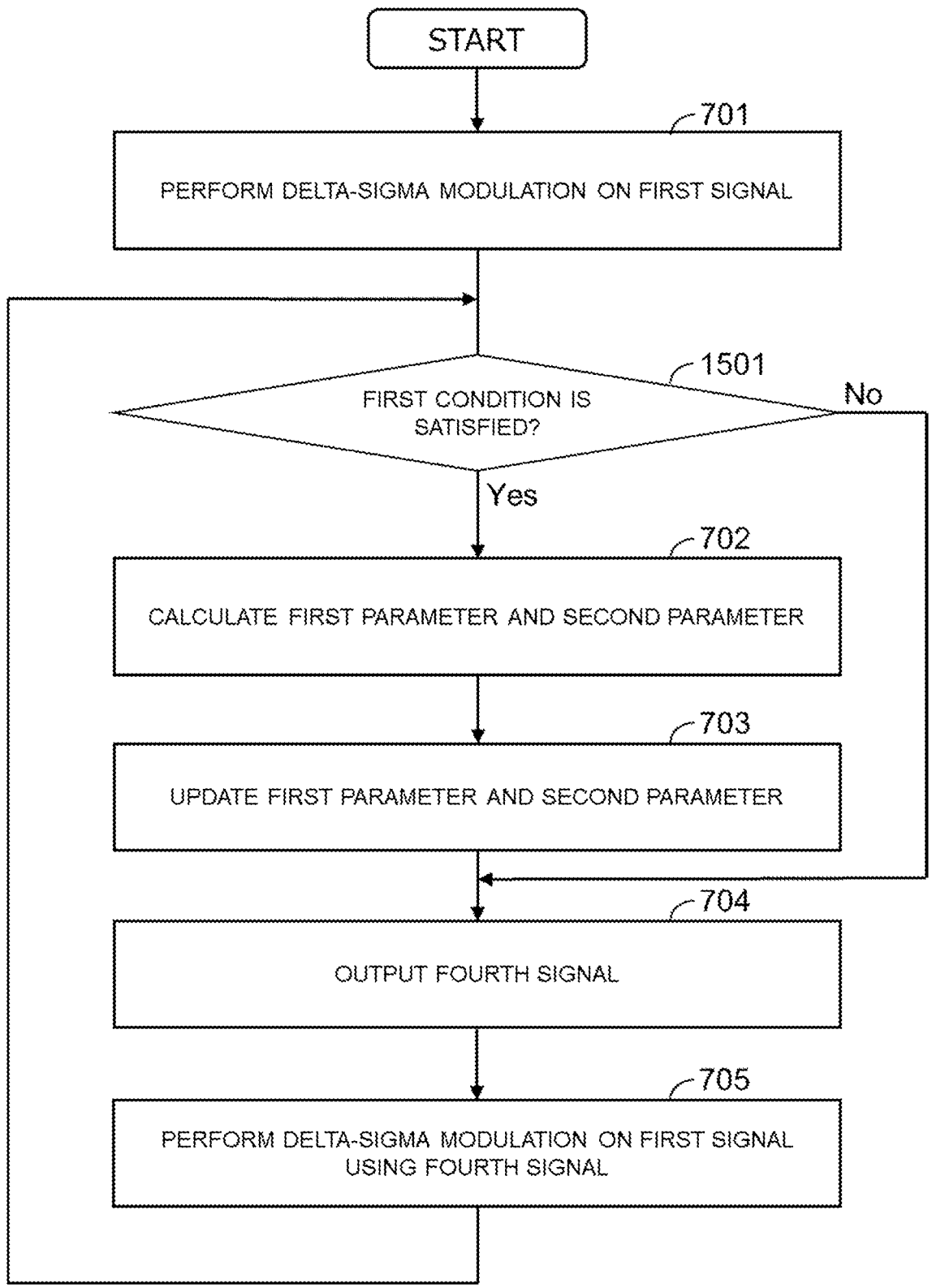
FIG. 15 is a flowchart illustrating a flow of processing of a delta-sigma modulation apparatus according to an example alteration.

The flow of processing of the delta-sigma modulation apparatus 110 is not limited to the above-described example. FIG. 15 is a flowchart illustrating an example of the flow of processing of the delta-sigma modulation apparatus 110. The flowchart of FIG. 15 is a flowchart obtained by adding Step 1501 to the flowchart of FIG. 7.

After Step 701, the NN learner 113 determines whether or not a predetermined first condition is satisfied (1501). If the first condition is satisfied, the delta-sigma modulation apparatus 110 performs the processing of Step 702 and the processing of Step 703. Consequently, the first parameter of the first NN 300 and the second parameter of the second NN 600 are updated.

If the first condition is not satisfied, the delta-sigma modulation apparatus 110 does not perform the processing of Step 702 and the processing of Step 703. That is, the first parameter of the first NN 300 and the second parameter of the second NN 600 are not updated.

The first condition is a condition that the approximation error is greater than a predetermined first magnitude. Specifically, when the approximation error is the absolute value of the first difference or the absolute value of the second difference, whichever is larger, the first condition may be a condition that the approximation error is greater than a predetermined first threshold value Th1. When the approximation error is represented by a complex number, the first condition may be a condition on the absolute value of a complex number (that is, the distance from a point of origin on a complex plane). The first condition may be a condition that the absolute value of the approximation error (the distance from a point of origin) is greater than a predetermined first distance threshold value. In other examples, the first condition may include a condition for the first difference and a condition for the second difference. For example, if the absolute value of the first difference has exceeded a predetermined first real component threshold value and/or the absolute value of the second difference has exceeded a predetermined first imaginary component threshold value, the NN learner 113 may determine that the first condition is satisfied.

The state of the transmission path 120 changes from moment to moment. By using the first condition described above, the delta-sigma modulation apparatus 110 can update the first parameter of the first NN 300 and the second parameter of the second NN 600 in accordance with the current state of the transmission path 120.

As described earlier, when the approximation error is large, this means that the output of the transmission model 410 (the approximated value of the third signal) deviates from the actual third signal. That is, this means that the accuracy of the output of the transmission model 410 is low and the accuracy of the fourth signal that is output by the first NN 300 is also low.

Therefore, the necessity to reflect the current state of the transmission path 120 (in particular, information on transmission distortion) in the first NN 300 and the second NN 600 is great. Hence the NN learner 113 makes a "Yes" determination in Step 1501 if the first condition is satisfied. Then, the delta-sigma modulation apparatus 110 performs the processing of Step 702 and the processing of Step 703.

On the other hand, when the approximation error is small, this means that the output of the transmission model 410 is close to the actual third signal. Therefore, the necessity to update the first parameter of the first NN 300 and the second parameter of the second NN 600 is small. Hence the NN learner 113 makes a "No" determination in Step 1501. Then, the delta-sigma modulation apparatus 110 proceeds to Step 704.

The above configuration attains the following effect. Only when the necessity to reflect the current state of the transmission path 120 in the first NN 300 and the second NN 600 is great, the delta-sigma modulation apparatus 110 performs the processing of Step 702 and Step 703. Since the delta-sigma modulation apparatus 110 does not perform the processing of Step 702 and Step 703 in a situation where the processing is unnecessary, it is possible to reduce a processing load in the delta-sigma modulation apparatus 110.

Note that, after the first condition is satisfied, the delta-sigma modulation apparatus 110 may repeatedly perform the processing of Step 702 and Step 703 until a predetermined second condition is satisfied. Specifically, the parameter calculator 430 continues the processing to calculate the first parameter and the second parameter until the second condition is satisfied. The parameter calculator 430 continues the processing to update the second parameter of the second NN 600 until the second condition is satisfied. The NN processor 112 continues the processing to update the first parameter of the first NN 300 until the second condition is satisfied.

The second condition is a condition that the approximation error is less than a predetermined second magnitude. The second magnitude is smaller than the first magnitude. Specifically, when the approximation error is the absolute value of the first difference or the absolute value of the second difference, whichever is larger, the second condition may be a condition that the approximation error is less than a predetermined second threshold value Th2. The second threshold value Th2 is less than the first threshold value Th1. When the approximation error is represented by a complex number, the second condition may be a condition on the absolute value of a complex number (that is, the distance from a point of origin on a complex plane). The second condition may be a condition that the absolute value of the approximation error (the distance from a point of origin) is less than a predetermined second distance threshold value. The second distance threshold value is less than the first distance threshold value. In other examples, the second condition may include a condition on the first difference and a condition on the second difference. For example, if the absolute value of the first difference is less than a predetermined second real component threshold value and/or the absolute value of the second difference is less than a predetermined second imaginary component threshold value, the NN learner 113 may determine that the second condition is satisfied. For example, the second real component threshold value is less than the first real component threshold value. The second imaginary component threshold value is less than the first imaginary component threshold value.

(5) Fifth Example Alteration

Figure 16:
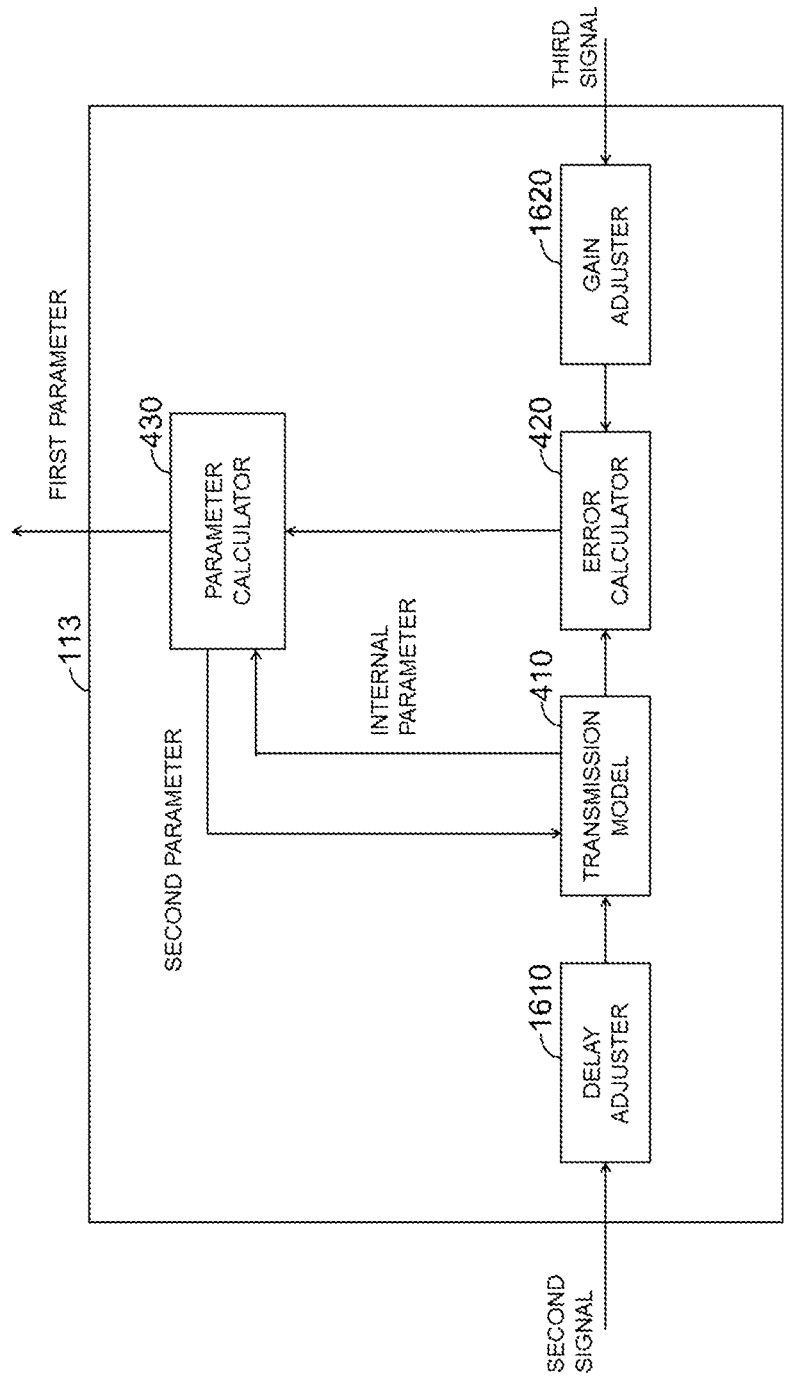
FIG. 16 is a diagram illustrating the configuration of a neural network learner according to an example alteration.

The configuration of the NN learner 113 is not limited to the above example. FIG. 16 is a diagram illustrating an example of the configuration of the NN learner 113.

The NN learner 113 further includes a delay adjuster 1610 and a gain adjuster 1620.

The delay adjuster 1610 receives the second signal as an input signal. The delay adjuster 1610 delays the second signal such that the timing at which the output of the transmission model 410 is input to the error calculator 420 and the timing at which the third signal is input to the error calculator 420 are synchronized.

The gain adjuster 1620 receives the third signal as an input signal. The gain adjuster 1620 multiplies the third signal by a gain. Specifically, the gain adjuster 1620 regards the third signal as a complex number and multiplies each of the I signal and the Q signal contained in the third signal by a complex gain.

Note that the delay value in the delay adjuster 1610 and the complex gain in the gain adjuster 1620 are set in such a way that the approximation error, which is the output of the error calculator 420, is minimized.

(6) Sixth Example Alteration

The modulator 144 may down-convert the output of the amplifier 143 by a superheterodyne system and output an IF signal.

(7) Seventh Example Alteration

The modulator 144 in the transmission path 120 may be omitted. In this configuration, the digital down-converter 620 in the transmission model 410 is omitted. The error calculator 420 calculates the approximation error between the output of the transmission model 410 and the third signal (in this example, the output of the amplifier 143).

(8) Eighth Example Alteration

The configuration of the transmission model 410 is not limited to the above example. The configuration of the transmission model 410 may be changed as appropriate according to the configuration of the delta-sigma modulation apparatus 110 and the configuration of the transmission path 120. For example, a commonly used digital distortion compensation technique may be applied to the first signal (the I signal and the Q signal). The configuration of the transmission model 410 may be changed accordingly.

The second NN 600 may be a neural network obtained by modeling the whole of the transmission path 120.

When the modulator 144 has a configuration that down-converts the output of the amplifier 143 by the superheterodyne system, the transmission model 410 may include a constituent element corresponding to this configuration. The transmission model 410 may include a constituent element that outputs an IF signal from the output of the digital filter 610 by the superheterodyne system.

The amplifier 143 may be separately modeled, not being modeled as the second NN 600. In another example, modeling of the amplifier 143 may be omitted.

The second NN 600 may be a constituent element obtained by modeling part of the transmission path 120. For example, the second NN 600 may be a neural network that outputs the same signal (the fourth signal) as that of the first NN 300. That is, the second NN 600 may output an approximated value of a signal which is generated through the process of passage of the second signal through the communication path 130, the BPF 142, and the amplifier 143.

The second NN 600 may have the same structure as the first NN 300. The second NN 600 includes an input layer, at least one intermediate layer, and an output layer. The input layer includes at least a node to which the current value of the second signal is input. The input layer may further include at least one of a node to which the past value of the second signal is input, a node to which the result of logical operations of two or more nodes in the input layer is input, and a node having an output line through which the current value of the second signal is output to the output layer without passing through the intermediate layer.

3. Second Example Embodiment

Next, a second example embodiment and example alterations thereof are described with reference to FIG. 17 to FIG. 24. Note that, in the second example embodiment, the same constituent elements as those of the first example embodiment are denoted by the same signs and detailed explanations of these constituent elements are omitted.

3-1. Schematic Configuration of a Radio Communication Apparatus

Figure 17:
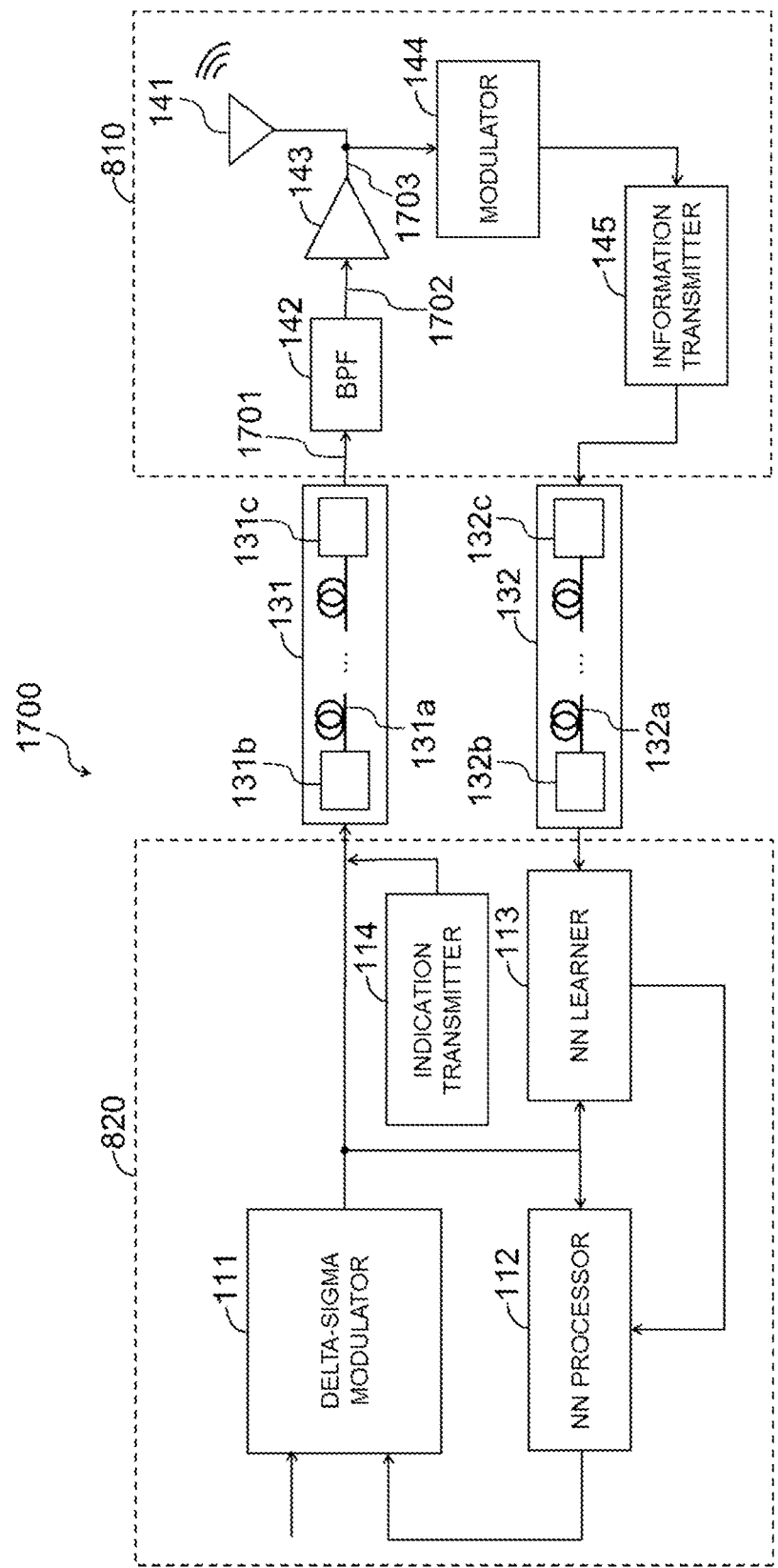
FIG. 17 is a diagram illustrating the configuration of a radio communication apparatus according to a second example embodiment.

FIG. 17 is a diagram illustrating the configuration of a radio communication apparatus 1700. The radio communication apparatus 1700 includes a first apparatus 810 and a second apparatus 820.

A first communication path 131 includes an optical fiber 131a. The first communication path 131 includes an E/O converter 131b at an end of the optical fiber 131a on the side thereof where the second apparatus 820 is located. The E/O converter 131b converts an electrical signal to an optical signal. Furthermore, the first communication path 131 includes an O/E converter 131c at an end of the optical fiber 131a on the side thereof where the first apparatus 810 is located. The O/E converter 131c converts an optical signal to an electrical signal.

A second communication path 132 includes an optical fiber 132a. The second communication path 132 includes an E/O converter 132b at an end of the optical fiber 132a on the side thereof where the second apparatus 820 is located. Furthermore, the second communication path 132 includes an O/E converter 132c at an end of the optical fiber 132a on the side thereof where the first apparatus 810 is located.

3-2. Configuration of a First Apparatus

The first apparatus 810 includes an antenna 141, a BPF 142, an amplifier 143, a modulator 144, and an information transmitter 145. The information transmitter 145 transmits transmission-related information to the second apparatus 820 via the second communication path 132. As in the case of the first example embodiment, the transmission-related information of the present example is the third signal (the output of the modulator 144).

3-3. Configuration of a Second Apparatus

The second apparatus 820 includes a delta-sigma modulator 111, an NN processor 112, an NN learner 113, and an indication transmitter 114. The delta-sigma modulator 111 transmits the second signal to the first apparatus 810 via the first communication path 131. The indication transmitter 114 transmits an indication signal (an initial indication signal, a first indication signal, and a second indication signal), which will be described later, to the first apparatus 810 via the first communication path 131.

3-4. Outline of a Flow of Processing of the Radio Communication Apparatus

Next, the outline of a flow of processing of the radio communication apparatus 1700 is described. Specifically, a flow of processing by which the first apparatus 810 transmits the transmission-related information to the second apparatus 820 is described.

The indication transmitter 114 determines whether or not a condition on the amount of distortion that has occurred in the transmission process of the second signal is satisfied. For example, the condition is the first condition on the approximation error. If the first condition has been satisfied, the indication transmitter 114 transmits the first indication signal to the first apparatus 810.

In the present example, the first indication signal is a signal indicating to the first apparatus 810 that the transmission-related information is to be transmitted to the second apparatus 820. The first indication signal contains information on the number of times Nk the first apparatus 810 transmits the transmission-related information to the second apparatus 820. Nk is an integer greater than or equal to 1. The information transmitter 145 transmits the transmission-related information to the second apparatus 820 in accordance with the first indication signal.

The indication transmitter 114 determines whether or not the second condition on the approximation error has been satisfied. If the second condition has been satisfied, the indication transmitter 114 transmits the second indication signal to the first apparatus 810.

In the present example, the second indication signal is a signal indicating to the first apparatus 810 that transmission of the transmission-related information to the second apparatus 820 is to be stopped. The information transmitter 145 stops transmission of the transmission-related information in accordance with the second indication signal.

3-5. Flow of Processing of the Radio Communication Apparatus

Figure 18:
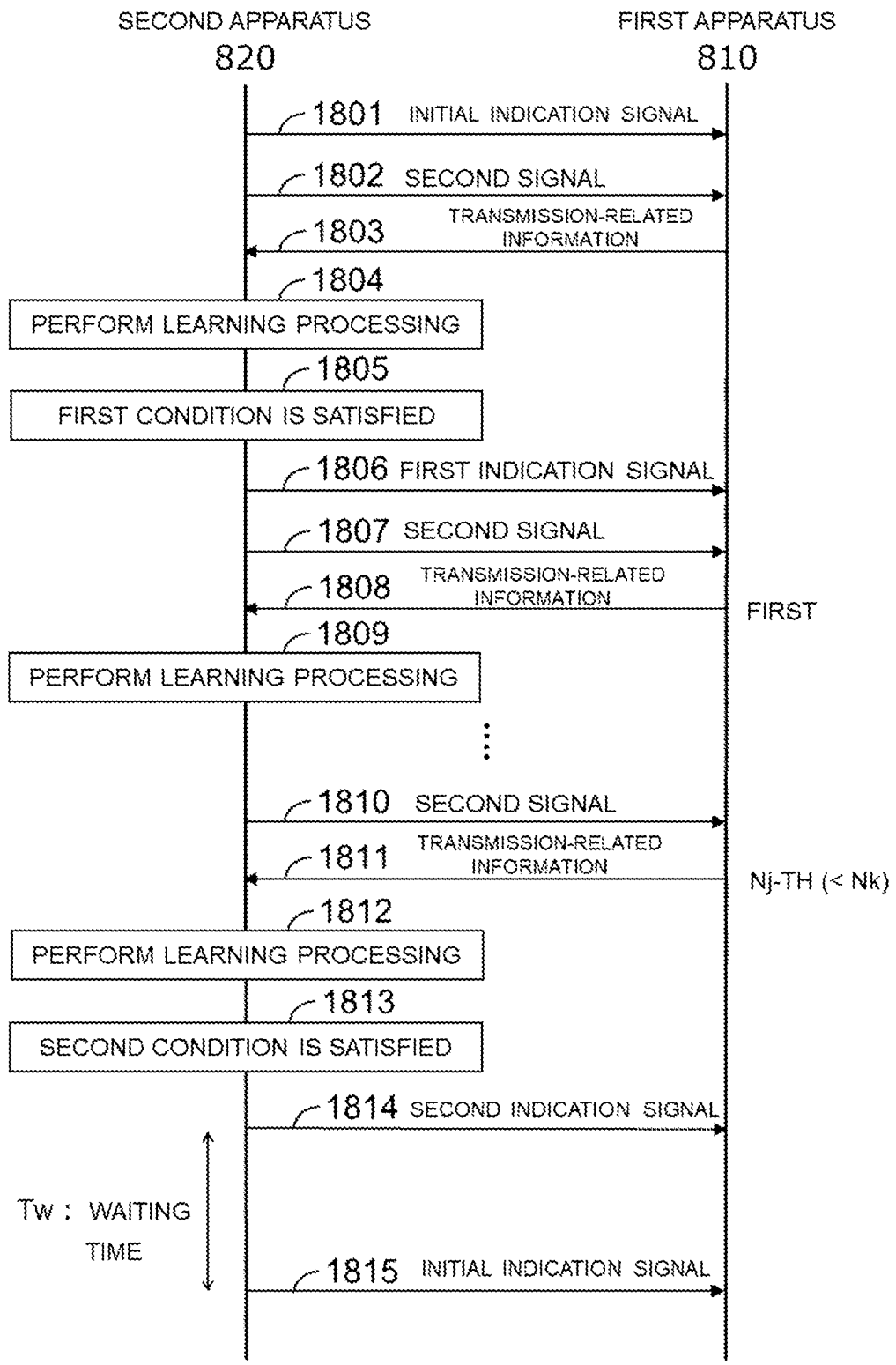
FIG. 18 is a sequence diagram illustrating a flow of processing of the radio communication apparatus according to the second example embodiment.

Next, the flow of processing of the radio communication apparatus 1700 is described with reference to FIG. 18. FIG. 18 is a sequence diagram illustrating an example of the flow of processing of the radio communication apparatus 1700.

The indication transmitter 114 transmits the initial indication signal to the first apparatus 810 via the first communication path 131 (1801). The initial indication signal is a indication signal for making the first apparatus 810 transmit the transmission-related information to the second apparatus 820 only once.

The delta-sigma modulator 111 transmits the second signal to the first apparatus 810 via the first communication path 131 (1802). The information transmitter 145 transmits the transmission-related information (in the present example, the third signal) to the second apparatus 820 via the second communication path 132 (1803).

The second apparatus 820 receives the transmission-related information. The second apparatus 820 (that is, the NN processor 112 and the NN learner 113) performs the processing of Step 702 and Step 703 of FIG. 7 (1804). Hereinafter, a series of processing of Step 702 and Step 703 is collectively referred to as "learning processing". Note that the NN learner 113 transmits the approximation error calculated in the processing of Step 702 to the indication transmitter 114.

The indication transmitter 114 determines whether or not the first condition has been satisfied using the approximation error. In the present example, the indication transmitter 114 determines that the first condition has been satisfied (1805). Therefore, the indication transmitter 114 transmits the first indication signal to the first apparatus 810 via the first communication path 131 (1806).

The delta-sigma modulator 111 transmits the second signal to the first apparatus 810 via the first communication path 131 (1807).

The information transmitter 145 transmits the transmission-related information to the second apparatus 820 via the second communication path 132 in accordance with the first indication signal (1808). This is the first transmission of the transmission-related information with reference to the point in time when the first apparatus 810 received the first indication signal.

The second apparatus 820 performs the learning processing (1809). Every time the second apparatus 820 performs the learning processing, the indication transmitter 114 determines whether or not the second condition is satisfied.

Transmission of the second signal, transmission of the transmission-related information, and the learning processing are repeatedly performed. As a result, the approximation error becomes gradually smaller.

Then, the delta-sigma modulator 111 transmits the second signal to the first apparatus 810 via the first communication path 131 (1810).

The information transmitter 145 transmits the transmission-related information to the second apparatus 820 via the second communication path 132 (1811). This is the Nj-th transmission of the transmission-related information with reference to the point in time when the first apparatus 810 received the first indication signal. Note that Nj<Nk.

The second apparatus 820 performs the learning processing (1812). The indication transmitter 114 determines that the second condition is satisfied (1813). Therefore, the indication transmitter 114 transmits the second indication signal to the first apparatus 810 via the first communication path 131 (1814). The information transmitter 145 stops transmission of the transmission-related information in accordance with the second indication signal.

Then, the indication transmitter 114 transmits the initial indication signal to the first apparatus 810 via the first communication path 131 every time a predetermined waiting time Tw elapses (1815).

Note that, when the information transmitter 145 transmits the transmission-related information Nk times after the first apparatus 810 received the first indication signal, the information transmitter 145 stops transmission of the transmission-related information. Upon the lapse of the predetermined waiting time Tw from the point in time when the transmission-related information was received Nk times, the indication transmitter 114 transmits the initial indication signal to the first apparatus 810.

In other examples, the second indication signal may further contain information on the waiting time Tw. In this configuration, the information transmitter 145 transmits the transmission-related information to the second apparatus 820 every time the waiting time Tw elapses. Every time the transmission-related information is received, the indication transmitter 114 determines whether or not the first condition is satisfied. If the first condition has been satisfied, the indication transmitter 114 transmits the first indication signal to the first apparatus 810.

The above configuration attains the following effect. When the first condition has been satisfied (that is, when the approximation error is large), this means that the current state of the transmission path 120 (in particular, information on transmission distortion) is not reflected in the first NN 300 and the second NN 600 and therefore transmission distortion cannot be suppressed. In this situation, the first apparatus 810 feeds the transmission-related information back to the second apparatus 820. The second apparatus 820 can perform the learning processing using the transmission-related information and update the first parameter of the first NN 300 and the second parameter of the second NN 600. This makes it possible to suppress transmission distortion that occurs in the transmission process of the second signal.

Furthermore, it is possible to implement a distributed Multiple Input Multiple Output (MIMO) system that increases the number of concurrent connections and transmission capacity.

3-6. Example Alterations

The technology according to the present disclosure is not limited to the example embodiment described above.

(1) First Example Alteration

The first indication signal is not limited to the above example. The first indication signal may contain information on a period Tp with which the first apparatus 810 transmits the transmission-related information to the second apparatus 820. The information transmitter 145 transmits the transmission-related information to the second apparatus 820 in accordance with the first indication signal every time the period Tp elapses.

The period Tp may be k1 times a learning period. Here, k1 is an integer greater than or equal to 1. The learning period is a period required from the point in time when the second apparatus 820 received the transmission-related information to when the second apparatus 820 updates the first parameter of the first NN 300 and the second parameter of the second NN 600.

The period Tp may be defined by a frame, a subframe, or a slot, which is defined on 3GPP. The frame is defined by a plurality of subframes. The subframe is defined by one or more slots. The period Tp may be defined as being "k2 times the frame". Here, k2 is an integer greater than or equal to 1. As an example, one frame is 10 ms (milliseconds). The period Tp may be defined as being "k3 times the subframe". Here, k3 is an integer greater than or equal to 1. As an example, one subframe is 1 ms. The period Tp may be defined as being "k4 times the slot". Here, k4 is an integer greater than or equal to 1.

Figure 19:
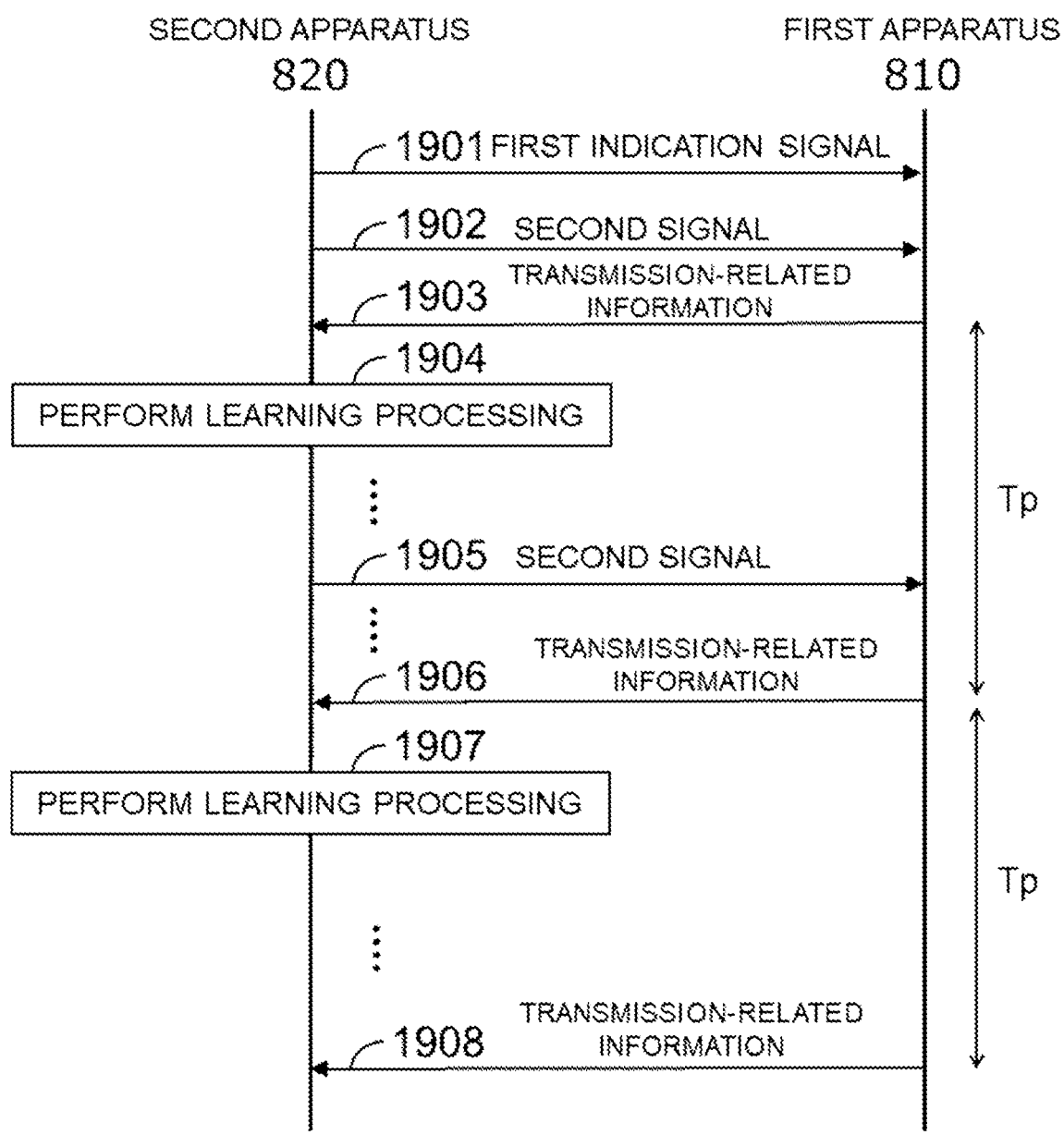
FIG. 19 is a sequence diagram illustrating a flow of processing of a radio communication apparatus according to an example alteration.

FIG. 19 is a sequence diagram illustrating an example of the flow of processing of the radio communication apparatus 1700.

The indication transmitter 114 transmits the first indication signal to the first apparatus 810 (1901). The delta-sigma modulator 111 transmits the second signal to the first apparatus 810 (1902). The information transmitter 145 transmits the transmission-related information (in the present example, the third signal) to the second apparatus 820 (1903). The second apparatus 820 performs the learning processing (1904). Then, the delta-sigma modulator 111 repeatedly transmits the second signal to the first apparatus 810 (1905).

The period Tp elapses after the point in time when the information transmitter 145 performed the processing of Step 1903. The information transmitter 145 transmits the transmission-related information to the second apparatus 820 (1906). The second apparatus 820 performs the learning processing (1907). Then, the information transmitter 145 transmits the transmission-related information to the second apparatus 820 every time the period Tp elapses (1908).

The above configuration attains the following effect. The first apparatus 810 periodically feeds the transmission-related information back to the second apparatus 820. The second apparatus 820 can periodically perform the learning processing using the transmission-related information and update the first parameter of the first NN 300 and the second parameter of the second NN 600. This makes it possible to suppress transmission distortion that occurs in the transmission process of the second signal.

(2) Second Example Alteration

The information transmitter 145 may transmit the transmission-related information to the second apparatus 820 when a condition on transmission between the first apparatus 810 and the second apparatus 820 has been satisfied. For example, the information transmitter 145 may estimate the amount of distortion that has occurred in the transmission process of the second signal, based on the second signal. The information transmitter 145 determines whether or not a third condition on the amount of distortion has been satisfied. The third condition is a condition that the amount of distortion is larger than a predetermined magnitude. If the third condition has been satisfied, the information transmitter 145 transmits the transmission-related information to the second apparatus 820.

The amount of distortion may be estimated in the following manner. The information transmitter 145 performs Fourier transform processing or the like on the second signal and analyzes frequency components of the second signal. When the amount of distortion that has occurred in the transmission process of the second signal is large, of the frequency components of the second signal, a frequency component outside the above-described desired frequency band (a band from f0−fα to f0+fα) is large. With consideration given to this, the information transmitter 145 calculates signal power of a band outside the desired frequency band.

The third condition may be a condition that signal power of a band outside the desired frequency band is larger than a third threshold value Th3. If signal power of a band outside the desired frequency band is large, the information transmitter 145 may determine that the amount of distortion is larger than the predetermined magnitude.

Note that a signal on which Fourier transform processing is to be performed may be any one of signals 1701 to 1703 shown in FIG. 17.

The signal 1701 that has passed through the first communication path 131 and has not passed through the BPF 142

The signal 1702 that has passed through the BPF 142 and has not passed through the amplifier 143

The signal 1703 that has passed through the amplifier 143

Figure 20:
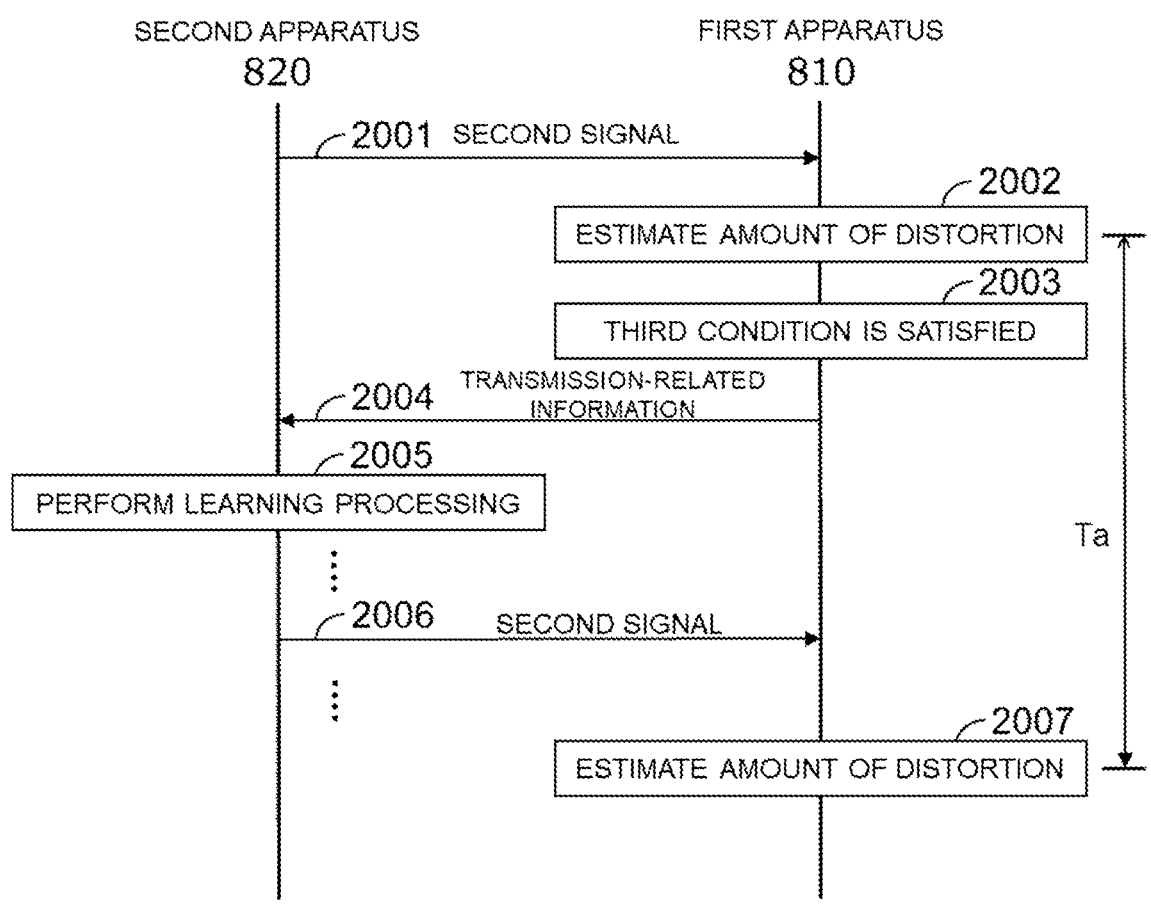
FIG. 20 is a sequence diagram illustrating a flow of processing of a radio communication apparatus according to an example alteration.

FIG. 20 is a sequence diagram illustrating an example of the flow of processing of the radio communication apparatus 1700.

The delta-sigma modulator 111 transmits the second signal to the first apparatus 810 (2001). The information transmitter 145 estimates the amount of distortion in the above-described manner and determines whether or not the third condition is satisfied (2002). In the present example, the information transmitter 135 determines that the third condition is satisfied (2003). Therefore, the information transmitter 145 transmits the transmission-related information to the second apparatus 820 (2004). The second apparatus 820 performs the learning processing (2005). Then, the delta-sigma modulator 111 repeatedly transmits the second signal to the first apparatus 810 (2006).

Then, a first time Ta elapses from the point in time when the information transmitter 145 performed the processing of Step 2002. The information transmitter 145 estimates the amount of distortion in the above-described manner and determines whether or not the third condition is satisfied (2007). As described above, the information transmitter 145 estimates the amount of distortion every time the first time Ta elapses. If the third condition is satisfied, the information transmitter 145 transmits the transmission-related information to the second apparatus 820. On the other hand, if the third condition is not satisfied, the information transmitter 145 does not transmit the transmission-related information to the second apparatus 820.

The above configuration attains the following effect. When the third condition has been satisfied (that is, when the amount of distortion is relatively large), the first apparatus 810 feeds the transmission-related information back to the second apparatus 820. The first apparatus 810 can feed the transmission-related information back to the second apparatus 820 in a proper situation without the first indication signal from the second apparatus 820.

Note that, in other examples, every time the first apparatus 810 receives the second signal, the information transmitter 145 may estimate the amount of distortion.

(3) Third Example Alteration

Figure 21:
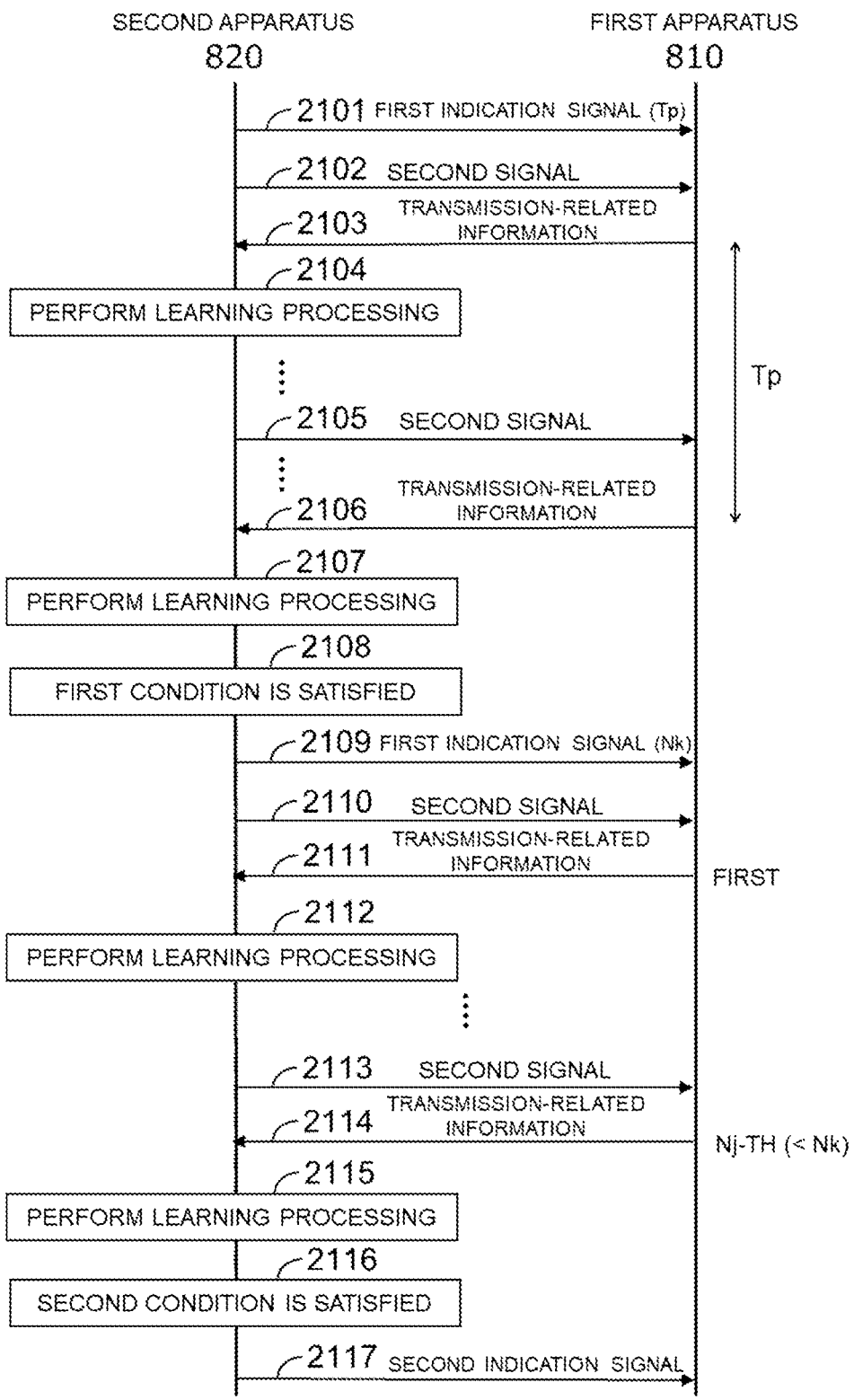
FIG. 21 is a sequence diagram illustrating a flow of processing of a radio communication apparatus according to an example alteration.

The processing shown in FIG. 18 and the processing shown in FIG. 19 may be combined. FIG. 21 is a sequence diagram illustrating an example of the flow of processing of the radio communication apparatus 1700.

Step 2101 to Step 2107 of FIG. 21 and Step 1901 to Step 1907 of FIG. 19 are the same processing. Therefore, detailed explanations of these steps are omitted. The information transmitter 145 transmits the transmission-related information to the second apparatus 820 every time the period Tp elapses in accordance with the first indication signal (2101) containing information on the period Tp.

Every time the second apparatus 820 performs the learning processing, the indication transmitter 114 determines whether or not the first condition has been satisfied.

After the second apparatus 820 performs the learning processing in Step 2107, the indication transmitter 114 determines that the first condition has been satisfied (2108). The indication transmitter 114 transmits the first indication signal containing information on the number of times Nk to the first apparatus 810 (2109).

Step 2110 to Step 2117 of FIG. 21 and Step 1807 to Step 1814 of FIG. 18 are the same processing. Therefore, detailed explanations of these steps are omitted. Note that a time interval at which the first apparatus 810 transmits the transmission-related information to the second apparatus 820 in Step 2110 to Step 2117 is shorter than the period Tp.

After the indication transmitter 114 transmits the second indication signal in Step 2117, the indication transmitter 114 transmits the first indication signal containing information on the period Tp to the first apparatus 810. In response thereto, the information transmitter 145 transmits the transmission-related information to the second apparatus 820 every time the period Tp elapses.

The above configuration attains the following effect. When the first condition has been satisfied (that is, when the approximation error is large), the first apparatus 810 feeds the transmission-related information back to the second apparatus 820 with a relatively short period. The second apparatus 820 can quickly reflect the current state of the transmission path 120 in the first NN 300 and the second NN 600. On the other hand, when the second condition has been satisfied (that is, when the approximation error is small), the necessity to update the first parameter of the first NN 300 and the second parameter of the second NN 600 is small. In this situation, the first apparatus 810 feeds the transmission-related information back to the second apparatus 820 with the relatively long period Tp. It is possible to reduce a processing load in the second apparatus 820.

(4) Fourth Example Alteration

Figure 22:
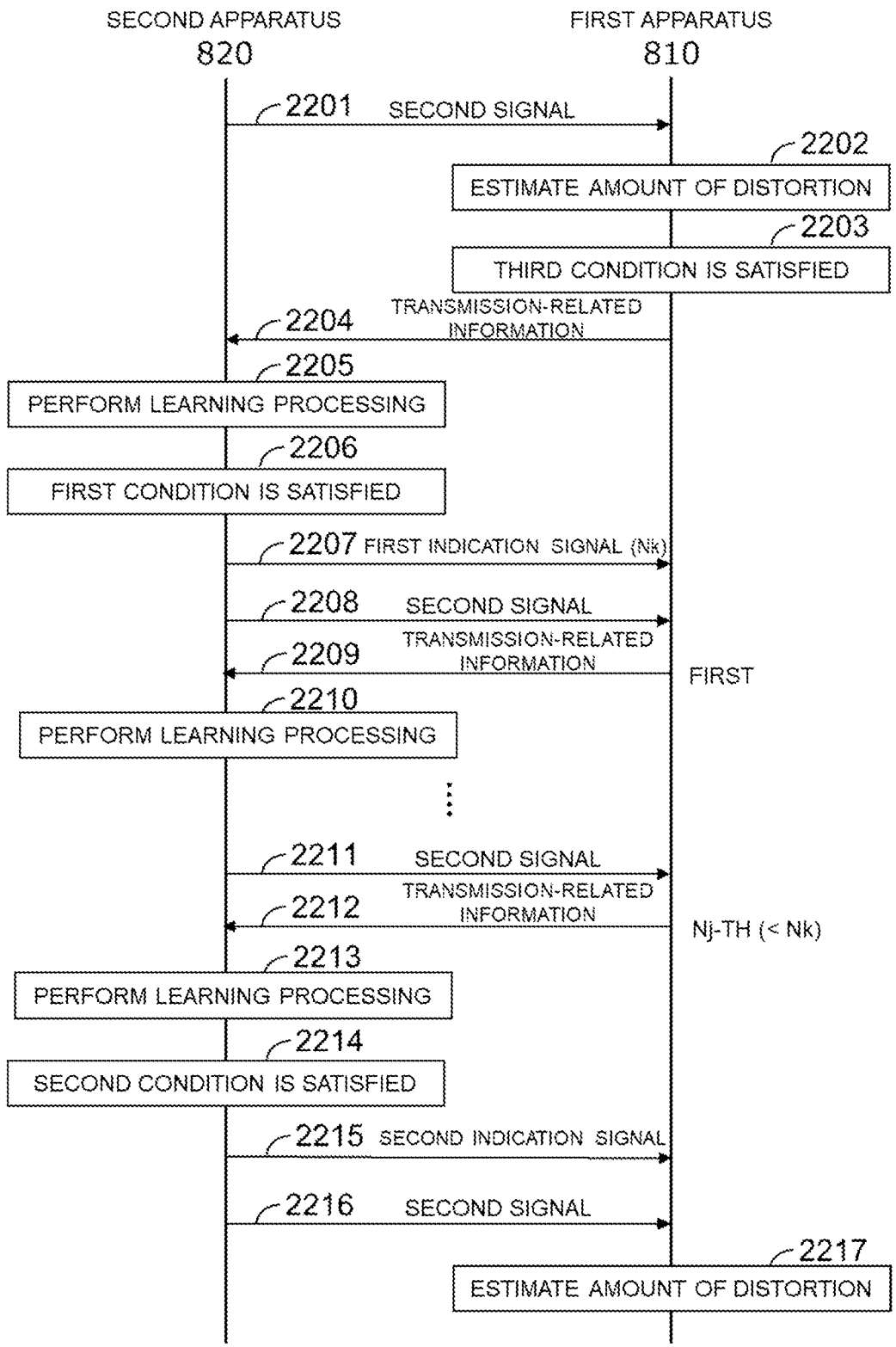
FIG. 22 is a sequence diagram illustrating a flow of processing of a radio communication apparatus according to an example alteration.

The processing shown in FIG. 18 and the processing shown in FIG. 20 may be combined. FIG. 22 is a sequence diagram illustrating an example of the flow of processing of the radio communication apparatus 1700.

Step 2201 to Step 2205 of FIG. 22 and Step 2001 to Step 2005 of FIG. 20 are the same processing. Therefore, detailed explanations of these steps are omitted.

Every time the second apparatus 820 performs the learning processing, the indication transmitter 114 determines whether or not the first condition has been satisfied.

After the second apparatus 820 performs the learning processing in Step 2205, the indication transmitter 114 determines that the first condition has been satisfied (2206). The indication transmitter 114 transmits the first indication signal containing information on the number of times Nk to the first apparatus 810 (2207).

Step 2208 to Step 2215 of FIG. 22 and Step 1807 to Step 1814 of FIG. 18 are the same processing. Therefore, detailed explanations of these steps are omitted. In Step 2208 to Step 2215, every time the second apparatus 820 transmits the second signal to the first apparatus 810, the first apparatus 810 transmits the transmission-related information to the second apparatus 820. Therefore, a time interval at which the first apparatus 810 transmits the transmission-related information to the second apparatus 820 is relatively short.

After the indication transmitter 114 transmits the second indication signal in Step 2215, the delta-sigma modulator 111 transmits the second signal to the first apparatus 810 (2216). The information transmitter 145 estimates the amount of distortion in the above-described manner and determines whether or not the third condition is satisfied (2217).

Every time the first apparatus 810 receives the second signal, the information transmitter 145 estimates the amount of distortion and determines whether or not the third condition is satisfied. If the third condition has been satisfied, the information transmitter 145 transmits the transmission-related information to the second apparatus 820. In this case, as described above, the indication transmitter 114 determines whether or not the first condition is satisfied.

On the other hand, if the third condition is not satisfied, the information transmitter 145 does not transmit the transmission-related information to the second apparatus 820.

The above configuration attains the following effect. In a first stage, only when the third condition has been satisfied (that is, when the amount of distortion is relatively large), the first apparatus 810 feeds the transmission-related information back to the second apparatus 820. Only when the first apparatus 810 feeds the transmission-related information back, the second apparatus 820 performs the learning processing and determines whether or not the first condition is satisfied. It is possible to reduce a processing load in the second apparatus 820.

Next, in a second stage, when the first condition has been satisfied (that is, when the approximation error is large), the second apparatus 820 indicates to the first apparatus 810 that the transmission-related information is to be fed back to the second apparatus 820 with a relatively short period. In the second stage, the second apparatus 820 can reflect the current state of the transmission path 120 (in particular, information on transmission distortion) in the first NN 300 and the second NN 600 with a relatively short period.

(5) Fifth Example Alteration

Connection between the first apparatus 810 and the second apparatus 820 may be established by one communication path (for example, one optical fiber). Transmission of the second signal may be performed via an optical fiber, and transmission of the transmission-related information may be performed via the same optical fiber.

For example, the first apparatus 810 and the second apparatus 820 may be configured to communicate with each other using a wavelength division multiplexing system. Wavelength division multiplexing is a publicly known technology and is a system of transmitting optical signals of a plurality of different wavelengths over one optical fiber.

The first apparatus 810 and the second apparatus 820 may be configured to communicate with each other using a polarization division multiplexing system. Polarization division multiplexing is a publicly known technology and is a system of transmitting a horizontally polarized wave vibrating in a horizontal direction and a vertically polarized wave in a vertical direction over one optical fiber.

The first apparatus 810 and the second apparatus 820 may be configured to communicate with each other using a time division multiplexing system. Time division multiplexing is a publicly known technology and is a system of transmitting a plurality of signals in sequence over one optical fiber in such a way that the plurality of signals do not overlap one another on a time axis.

The optical fiber may be a multicore fiber having a plurality of cores. In this case, the first apparatus 810 and the second apparatus 820 may be configured to communicate with each other using a spatial division multiplexing system. Spatial division multiplexing is a publicly known technology and is a system of transmitting different signals by different cores.

(6) Sixth Example Alteration

Figure 23:
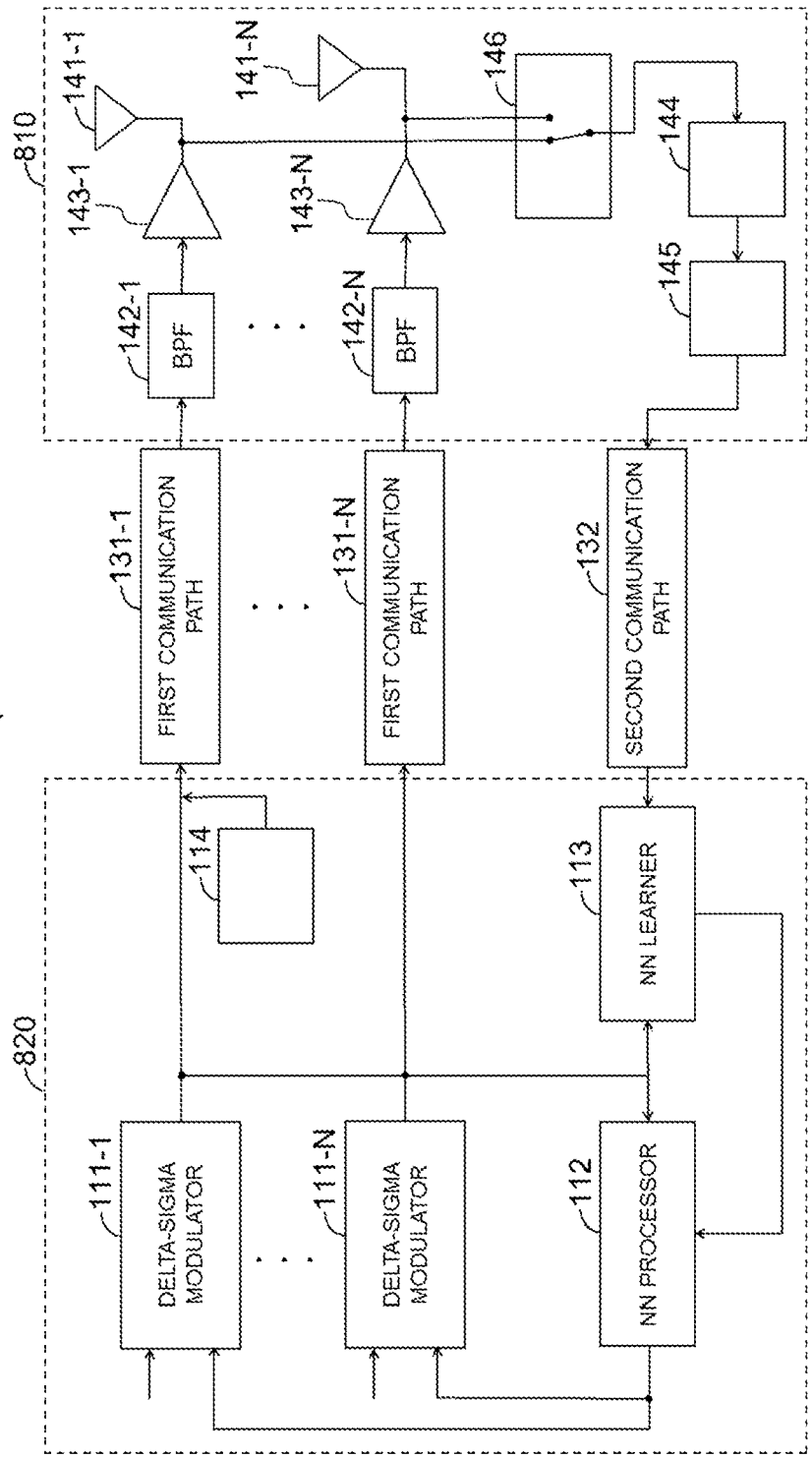
FIG. 23 is a diagram illustrating the configuration of a radio communication apparatus according to an example alteration.

FIG. 23 is a diagram illustrating the configuration of a radio communication apparatus 2300. The radio communication apparatus 2300 includes a first apparatus 810 and a second apparatus 820. The radio communication apparatus 2300 has a configuration for outputting N types of signals. Here, N is an integer greater than or equal to 2.

Specifically, the first apparatus 810 includes a plurality of antennas 141-1 to 141-N, a plurality of BPFs 142-1 to 142-N, and a plurality of amplifiers 143-1 to 143-N.

The second apparatus 820 includes a plurality of delta-sigma modulators 111-1 to 111-N. Furthermore, the first apparatus 810 and the second apparatus 820 are connected via a plurality of first communication paths 131-1 to 131-N. The plurality of delta-sigma modulators 111-1 to 111-N are connected to the plurality of antennas 141-1 to 141-N via the plurality of first communication paths 131-1 to 131-N, respectively. For example, the delta-sigma modulator 111-N is connected to the antenna 141-N via the first communication path 131-N, the BPF 142-N, and the amplifier 143-N.

The first apparatus 810 includes a switch 146. The switch 146 can switch a signal that is output to the modulator 144. According to this configuration, the first apparatus 810 can feed the transmission-related information (in this example, the third signal) back to the second apparatus 820 for each of N types of second signals. This makes it possible to suppress transmission distortion that occurs in each of the transmission processes of the N types of second signals.

(7) Seventh Example Alteration

Figure 24:
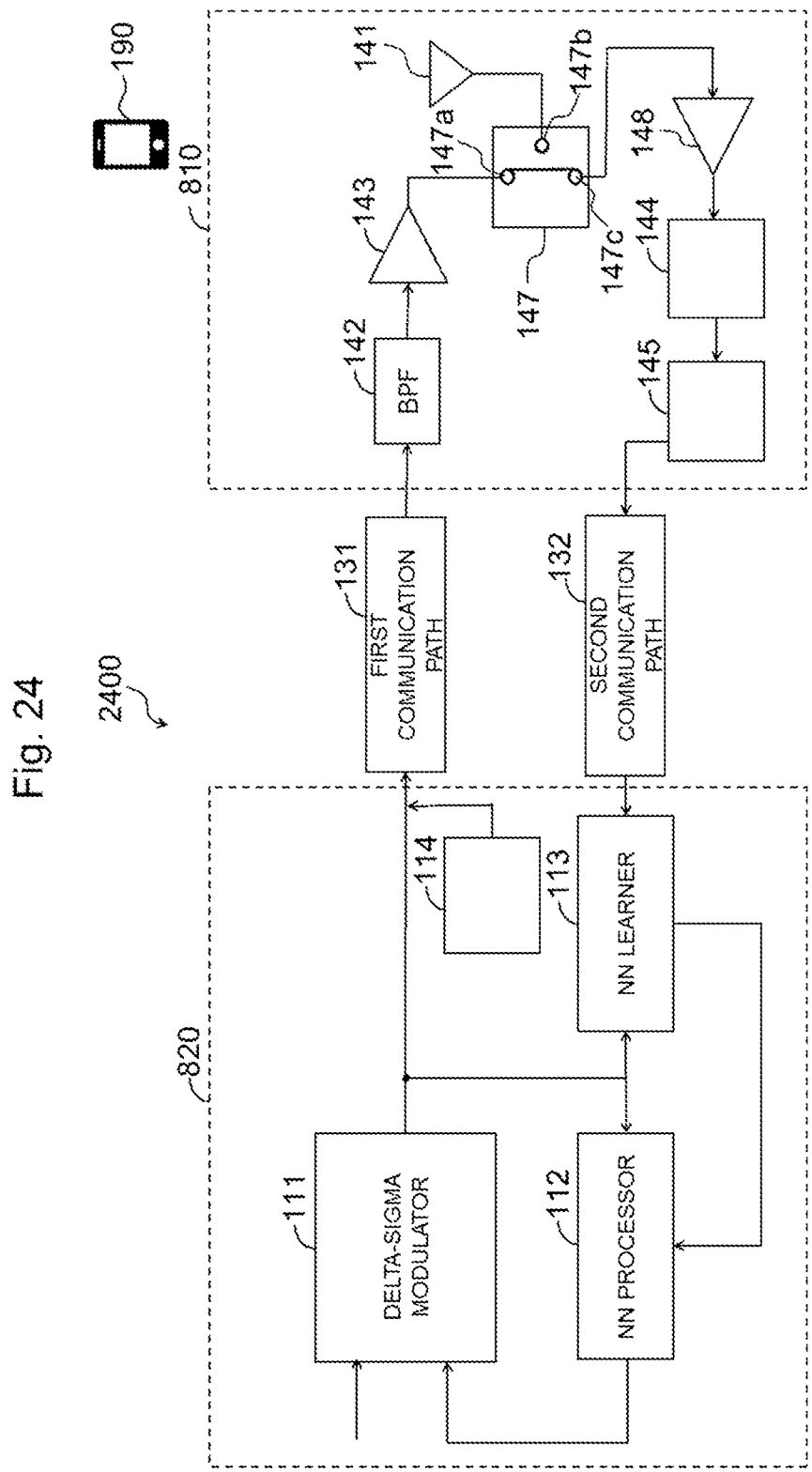
FIG. 24 is a diagram illustrating the configuration of a radio communication apparatus according to an example alteration.

FIG. 24 is a diagram illustrating the configuration of a radio communication apparatus 2400. The radio communication apparatus 2400 includes a first apparatus 810 and a second apparatus 820. The radio communication apparatus 2400 has a transmission function and a reception function.

Hereinafter, a link on which a signal is transmitted from the second apparatus 820 to a terminal apparatus 190 via the first apparatus 810 is sometimes referred to as a "downlink". A signal that is transmitted on the downlink is sometimes referred to as a "downlink signal".

On the other hand, a link on which a signal is transmitted from the terminal apparatus 190 to the second apparatus 820 via the first apparatus 810 is sometimes referred to as an "uplink". A signal that is transmitted on the uplink is sometimes referred to as an "uplink signal".

The second apparatus 820 transmits the downlink signal to the first apparatus 810 via a first communication path 131. The first apparatus 810 transmits the uplink signal to the second apparatus 820 via a second communication path 132.

The first apparatus 810 includes an antenna switch 147. The antenna switch 147 includes a first terminal 147a connected to an amplifier 143, a second terminal 147b connected to an antenna 141, and a third terminal 147c connected to a Low Noise Amplifier (LNA) 148.

The antenna switch 147 can operate in three types of modes: a transmission mode, a reception mode, and a feedback mode.

In the transmission mode, the first terminal 147a and the second terminal 147b are connected. Consequently, the downlink signal is output from the antenna 141.

In the reception mode, the second terminal 147b and the third terminal 147c are connected. Consequently, the uplink signal is transmitted to the second apparatus 820 via the LNA 148, a modulator 144, an information transmitter 145, and the second communication path 132. The second apparatus 820 performs predetermined processing on the uplink signal using an unillustrated reception function.

In the feedback mode, the first terminal 147a and the third terminal 147c are connected. Consequently, the downlink signal is sent to the information transmitter 145 via the LNA 148 and the modulator 144. The information transmitter 145 transmits the transmission-related information to the second apparatus 820 via the second communication path 132 at predetermined timing. The transmission-related information of the present example is information on the downlink signal to be transmitted from the first apparatus 810 to the terminal apparatus 190. Specifically, the transmission-related information is a signal (that is, the third signal) obtained by performing frequency conversion (down-conversion) on the downlink signal by passing it through the modulator 144.

In such a configuration, the radio communication apparatus 2400 may transmit the downlink signal and receive the uplink signal using a Time Division Duplex (TDD) system. TDD is a system of alternately transmitting the uplink signal and the downlink signal in different slots. Note that the slot is sometimes referred to as the "time slot".

When the radio communication apparatus 2400 operates using the TDD system, a indication transmitter 114 operates in the following manner. In the case of an uplink slot, the second communication path 132 is used for transmission of the uplink signal, but the first communication path 131 is not used. Therefore, the indication transmitter 114 transmits the first indication signal to the first apparatus 810 via the first communication path 131 in an uplink slot. The indication transmitter 114 transmits the second indication signal to the first apparatus 810 via the first communication path 131 in an uplink slot.

Furthermore, the information transmitter 145 operates in the following manner. In the case of a downlink slot, the first communication path 131 is used for transmission of the downlink signal, but the second communication path 132 is not used. Therefore, the information transmitter 145 transmits the transmission-related information to the second apparatus 820 via the second communication path 132 in a downlink slot.

4. Third Example Embodiment

Next, a third example embodiment is described with reference to FIG. 25. Note that, in the third example embodiment, the same constituent elements as those of the first and second example embodiments are denoted by the same signs and detailed explanations of these constituent elements are omitted.

<4-1. Schematic Configuration of a Radio Communication Apparatus>

Figure 25:
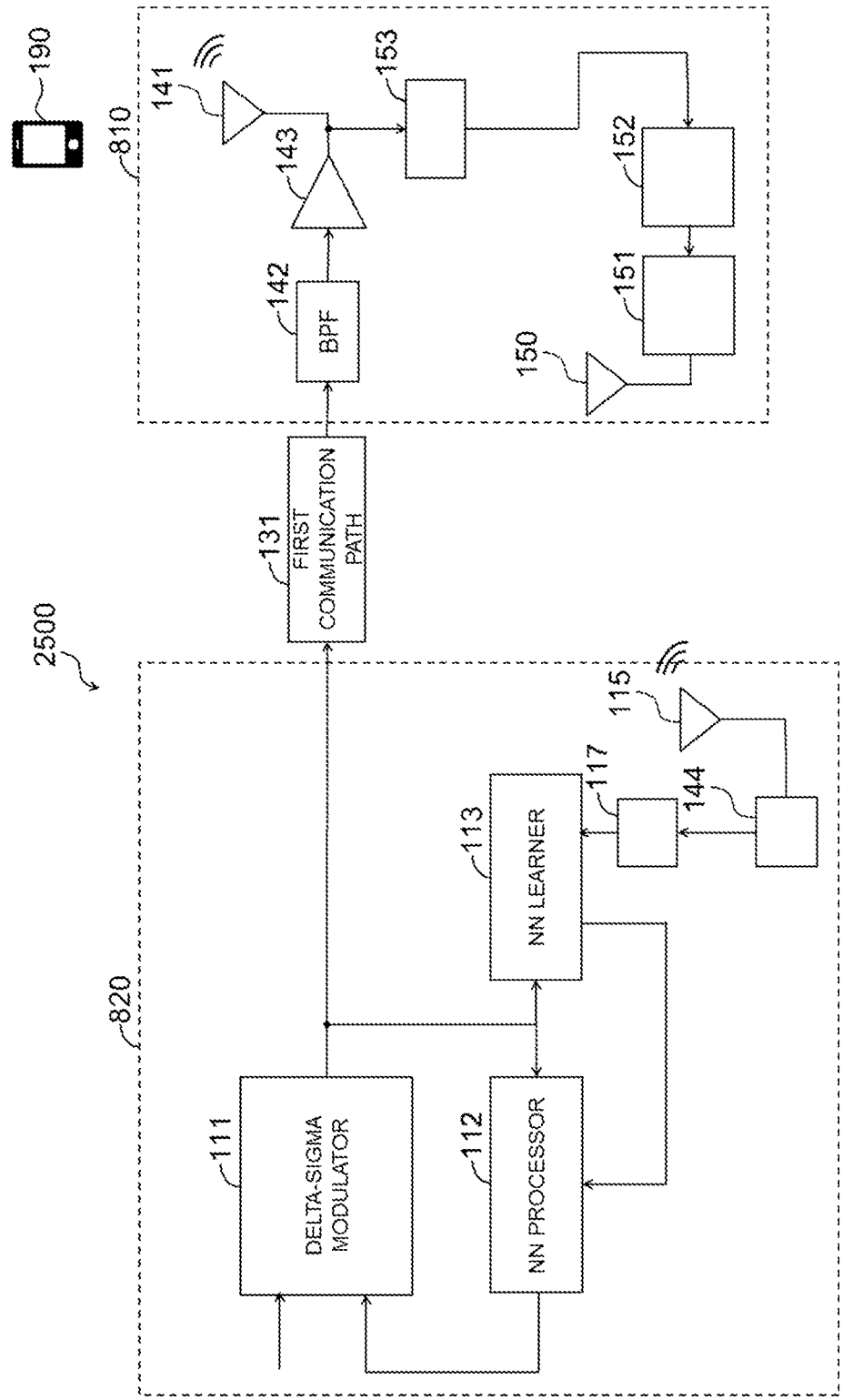
FIG. 25 is a diagram illustrating the configuration of a radio communication apparatus according to a third example embodiment.

FIG. 25 is a diagram illustrating the configuration of a radio communication apparatus 2500. The radio communication apparatus 2500 includes a first apparatus 810 and a second apparatus 820. The first apparatus 810 and the second apparatus 820 are connected via a first communication path 131.

<4-2. Configuration of a First Apparatus>

The first apparatus 810 includes an antenna 141, a BPF 142, an amplifier 143, an antenna 150, a frequency converter 151, a second modulator 152, and a third modulator 153. The third modulator 153 has the same configuration as that of the modulator 144. The third modulator 153 processes an analog signal (corresponding to a downlink signal), which was amplified by the amplifier 143, in the above-described manner and outputs the third signal (containing the I signal and the Q signal).

The second modulator 152 receives the output of the third modulator 153. The second modulator 152 performs signal modulation processing on the output of the third modulator 153. As the signal modulation processing, a common modulation system may be used. For example, as the signal modulation processing, single carrier modulation, Orthogonal Frequency Division Multiplexing (OFDM) or the like may be used. The frequency converter 151 receives the output of the second modulator 152. The frequency converter 151 up-converts the output of the second modulator 152. In this case, the frequency converter 151 up-converts the output of the second modulator 152 to a frequency f1 that is different from the frequency f0. The output of the frequency converter 151 is transmitted via the antenna 150.

<4-3. Configuration of a Second Apparatus>

The second apparatus 820 includes a delta-sigma modulator 111, an NN processor 112, an NN learner 113, an antenna 115, a demodulator 117, and a modulator 144. The second apparatus 820 receives, via the antenna 115, a signal output from the antenna 150 of the first apparatus 810. The modulator 144 processes the received signal in the above-described manner. The demodulator 117 demodulates the output of the modulator 144. Note that a demodulation system of the demodulator 117 is a system corresponding to the modulation system of the second modulator 152. The demodulator 117 outputs the demodulated third signal (containing the I signal and the Q signal) to the NN learner 113.

The above configuration attains the following effect. The first apparatus 810 can feed the transmission-related information back to the second apparatus 820 via space transmission. The transmission-related information of the present example is information on the downlink signal to be transmitted from the first apparatus 810 to a terminal apparatus 190. Therefore, the second apparatus 820 can update the first parameter of the first NN 300 and the second parameter of the second NN 600 using the transmission-related information. This makes it possible to suppress transmission distortion that occurs in the transmission process of the second signal.

5. Fourth Example Embodiment

Next, a fourth example embodiment and example alterations thereof are described with reference to FIG. 26 to FIG. 32. Note that, in the fourth example embodiment, the same constituent elements as those of the first to third example embodiments are denoted by the same signs and detailed explanations of these constituent elements are omitted.

5-1. Schematic Configuration of a Radio Communication Apparatus

Figure 26:
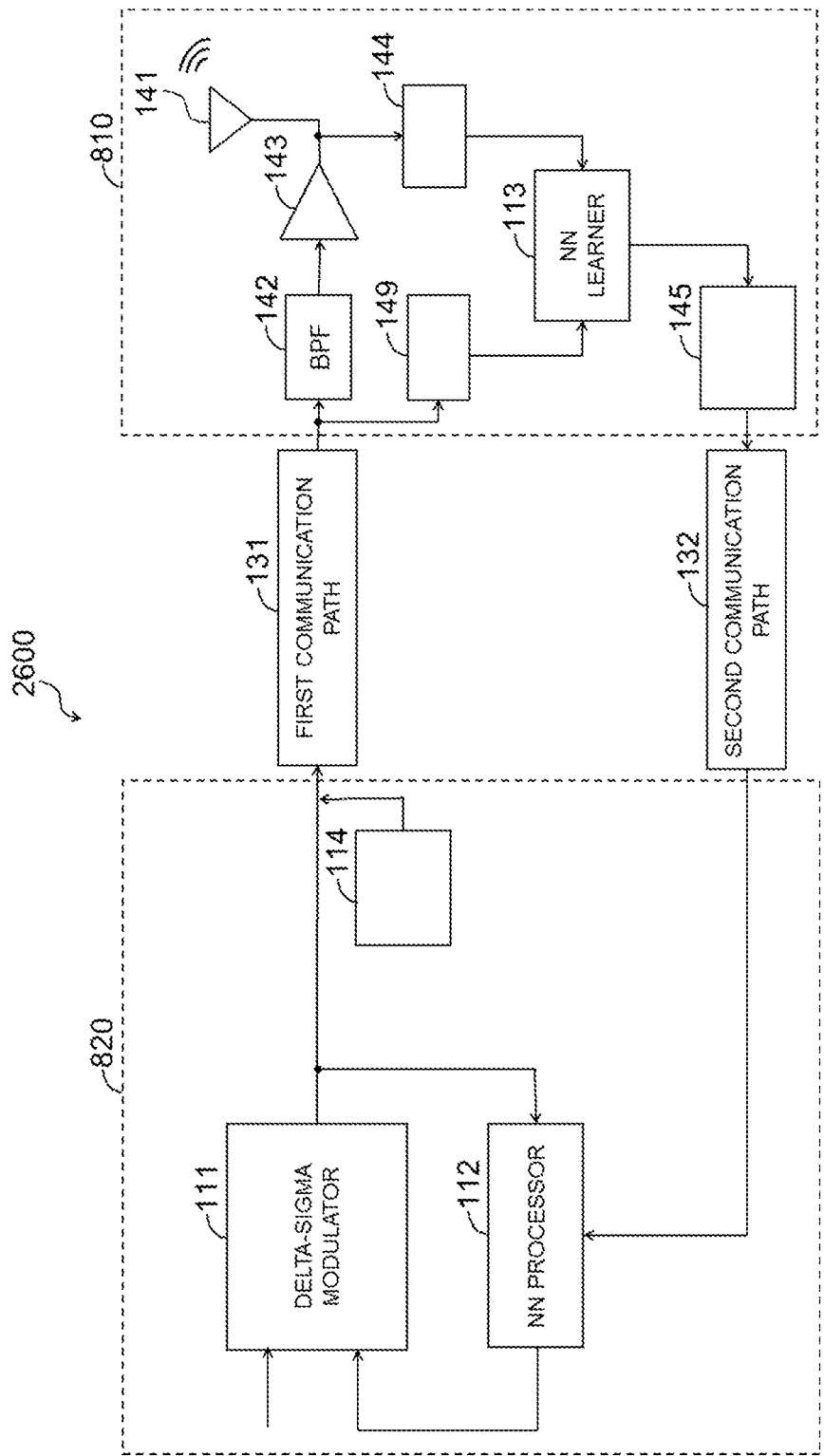
FIG. 26 is a diagram illustrating the configuration of a radio communication apparatus according to a fourth example embodiment.

FIG. 26 is a diagram illustrating the configuration of a radio communication apparatus 2600. The radio communication apparatus 2600 includes a first apparatus 810 and a second apparatus 820. The first apparatus 810 and the second apparatus 820 are connected via a first communication path 131. Furthermore, the first apparatus 810 and the second apparatus 820 are connected via a second communication path 132.

5-2. Configuration of a First Apparatus

The first apparatus 810 includes an antenna 141, a BPF 142, an amplifier 143, a modulator 144, an information transmitter 145, a digital restorer 149, and an NN learner 113.

The digital restorer 149 receives the output of the first communication path 131. The digital restorer 149 converts the output of the first communication path 131 to a 1-bit digital signal. In this process, transmission distortion contained in the output of the first communication path 131 is shaped and a digital signal is output. As a result, the original second signal output by a delta-sigma modulator 111 is restored. As described above, the digital restorer 149 generates a restored signal of the second signal from the third signal (in this example, a signal generated through the process of passage of the second signal through the first communication path 131). Hereinafter, such a restored signal of the second signal is sometimes referred to as a "fifth signal".

The NN learner 113 calculates a first parameter of a first NN 300 and a second parameter of a second NN 600 using the fifth signal (the restored second signal) and the third signal output by the modulator 144 (that is, the third signal generated through the process of passage of the second signal through the first communication path 131, the BPF 142, the amplifier 143, and the modulator 144). The NN learner 113 updates the second parameter of the second NN 600 to the calculated second parameter. Furthermore, the NN learner 113 outputs the calculated first parameter to the information transmitter 145. The information transmitter 145 transmits the first parameter to the second apparatus 820 via the second communication path 132. Therefore, the transmission-related information of the present example is the first parameter. The first parameter is information that is used in the first NN 300 to output an approximated value of a signal which is generated in the transmission process of the second signal. Thus, the first parameter is information on transmission between the first apparatus 810 and the second apparatus 820. Furthermore, in other words, it can be said that the first parameter is information on transmission distortion because the first parameter is also used to output an approximated value of transmission distortion that occurs in the transmission process of the second signal.

5-3. Configuration of a Second Apparatus

The second apparatus 820 includes a delta-sigma modulator 111, an NN processor 112, and an indication transmitter 114. The delta-sigma modulator 111 transmits the second signal to the first apparatus 810 via the first communication path 131. The indication transmitter 114 transmits the first indication signal to the first apparatus 810 via the first communication path 131. The indication transmitter 114 transmits the second indication signal to the first apparatus 810 via the first communication path 131. The NN processor 112 receives the first parameter via the second communication path 132. The NN processor 112 updates the first parameter of the first NN 300 to the received first parameter.

5-4. Flow of Processing of the Radio Communication Apparatus

Figure 27:
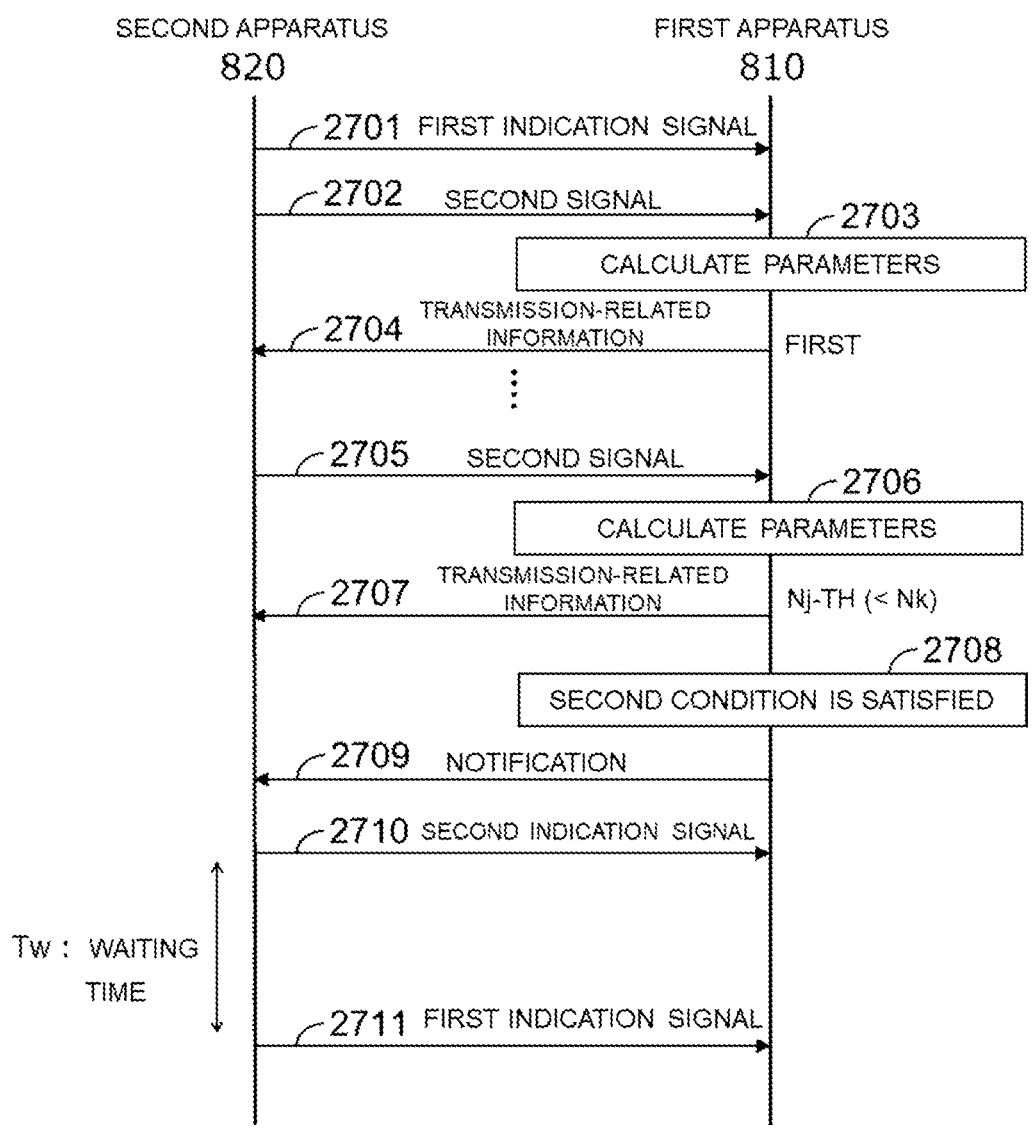
FIG. 27 is a sequence diagram illustrating a flow of processing of the radio communication apparatus according to the fourth example embodiment.

Next, a flow of processing of the radio communication apparatus 2600 is described with reference to FIG. 27. FIG. 27 is a sequence diagram illustrating an example of the flow of processing of the radio communication apparatus 2600.

When the radio communication apparatus 2600 is started (or the radio communication apparatus 2600 is reset), the indication transmitter 114 transmits the first indication signal to the first apparatus 810 (2701). In the present example, the first indication signal contains information on the number of times Nk.

The delta-sigma modulator 111 transmits the second signal to the first apparatus 810 (2702). The NN learner 113 calculates the first parameter and the second parameter (2703). The NN learner 113 updates the second parameter of the second NN 600 to the calculated second parameter.

The information transmitter 145 transmits the transmission-related information (in the present example, the first parameter) to the second apparatus 820 (2704). This is the first transmission of the transmission-related information with reference to the point in time when the first apparatus 810 received the first indication signal. The second apparatus 820 receives the transmission-related information. The NN processor 112 updates the first parameter of the first NN 300 to the received first parameter.

Note that, every time the NN learner 113 calculates the first parameter and the second parameter, the information transmitter 145 determines whether or not the second condition is satisfied.

Then, transmission of the second signal, calculation processing of the first and second parameters, and transmission of the transmission-related information are repeatedly performed. As a result, the approximation error becomes gradually smaller.

The delta-sigma modulator 111 transmits the second signal to the first apparatus 810 (2705). The NN learner 113 calculates the first parameter and the second parameter (2706).

The information transmitter 145 transmits the transmission-related information to the second apparatus 820 (2707). This is the Nj-th transmission of the transmission-related information with reference to the point in time when the first apparatus 810 received the first indication signal. Note that Nj<Nk.

At this point in time, the information transmitter 145 determines that the second condition is satisfied (2708). The information transmitter 145 transmits a notification to the second apparatus 820 (2709). This notification is a notification for notifying the second apparatus 820 that the second condition has been satisfied. In response to this notification, the indication transmitter 114 transmits the second indication signal to the first apparatus 810 (2710). As a result, the information transmitter 145 stops transmission of the transmission-related information.

Then, upon the lapse of the waiting time Tw, the indication transmitter 114 transmits the first indication signal containing information on the number of times Nk to the first apparatus 810 (2711).

The above configuration attains the following effect. The first apparatus 810 repeatedly feeds the transmission-related information (the first parameter) back to the second apparatus 820 until the second condition is satisfied. The second apparatus 820 can update the first parameter of the first NN 300 using the transmission-related information. This makes it possible to suppress transmission distortion that occurs in the transmission process of the second signal. Furthermore, it is possible to implement a distributed MIMO system that increases the number of concurrent connections and transmission capacity.

5-5. Example Alterations

The technology according to the present disclosure is not limited to the example embodiment described above.

(1) First Example Alteration

Figure 28:
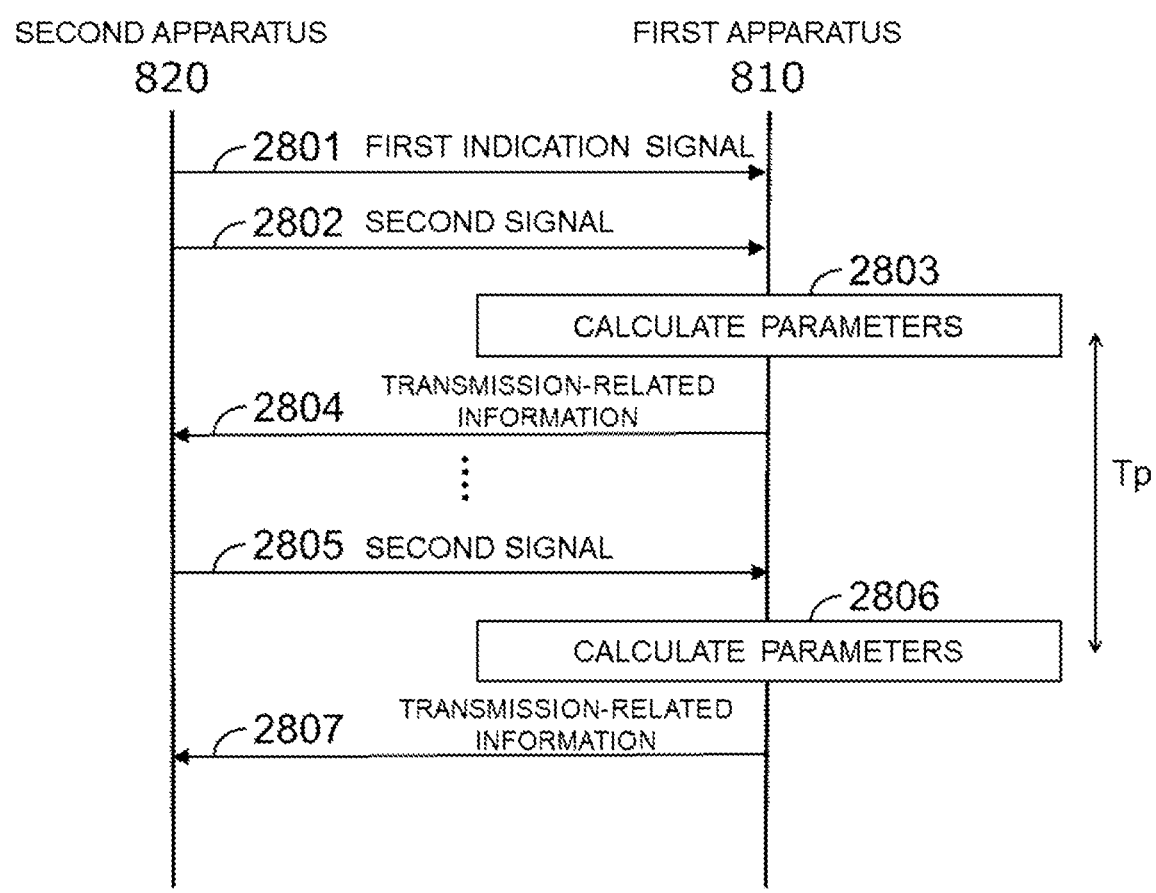
FIG. 28 is a sequence diagram illustrating a flow of processing of a radio communication apparatus according to an example alteration.

FIG. 28 is a sequence diagram illustrating an example of the flow of processing of the radio communication apparatus 2600.

When the radio communication apparatus 2600 is started (or the radio communication apparatus 2600 is reset), the indication transmitter 114 transmits the first indication signal to the first apparatus 810 (2801). The first indication signal contains information on the period Tp. As described earlier, the period Tp may be defined by the learning period. Furthermore, as described earlier, the period Tp may be defined by the frame, the subframe, or the slot.

The delta-sigma modulator 111 transmits the second signal to the first apparatus 810 (2802). The NN learner 113 calculates the first parameter and the second parameter (2803). The NN learner 113 updates the second parameter of the second NN 600 to the calculated second parameter.

The information transmitter 145 transmits the transmission-related information (in the present example, the first parameter) to the second apparatus 820 (2804). The second apparatus 820 receives the transmission-related information. The NN processor 112 updates the first parameter of the first NN 300 to the received first parameter.

Then, the delta-sigma modulator 111 repeatedly transmits the second signal to the first apparatus 810 (2805).

The period Tp elapses after the point in time when the NN learner 113 performed the processing of Step 2803. The NN learner 113 calculates the first parameter and the second parameter (2806). The information transmitter 145 transmits the transmission-related information to the second apparatus 820 (2807).

The above configuration attains the following effect. The first apparatus 810 periodically feeds the transmission-related information (the first parameter) back to the second apparatus 820. The second apparatus 820 can periodically update the first parameter of the first NN 300 using the transmission-related information.

Note that, every time the first apparatus 810 receives the second signal, the NN learner 113 may calculate the first parameter and the second parameter. The information transmitter 145 may transmit the transmission-related information to the second apparatus 820 every time the period Tp elapses.

(2) Second Example Alteration

Figure 29:
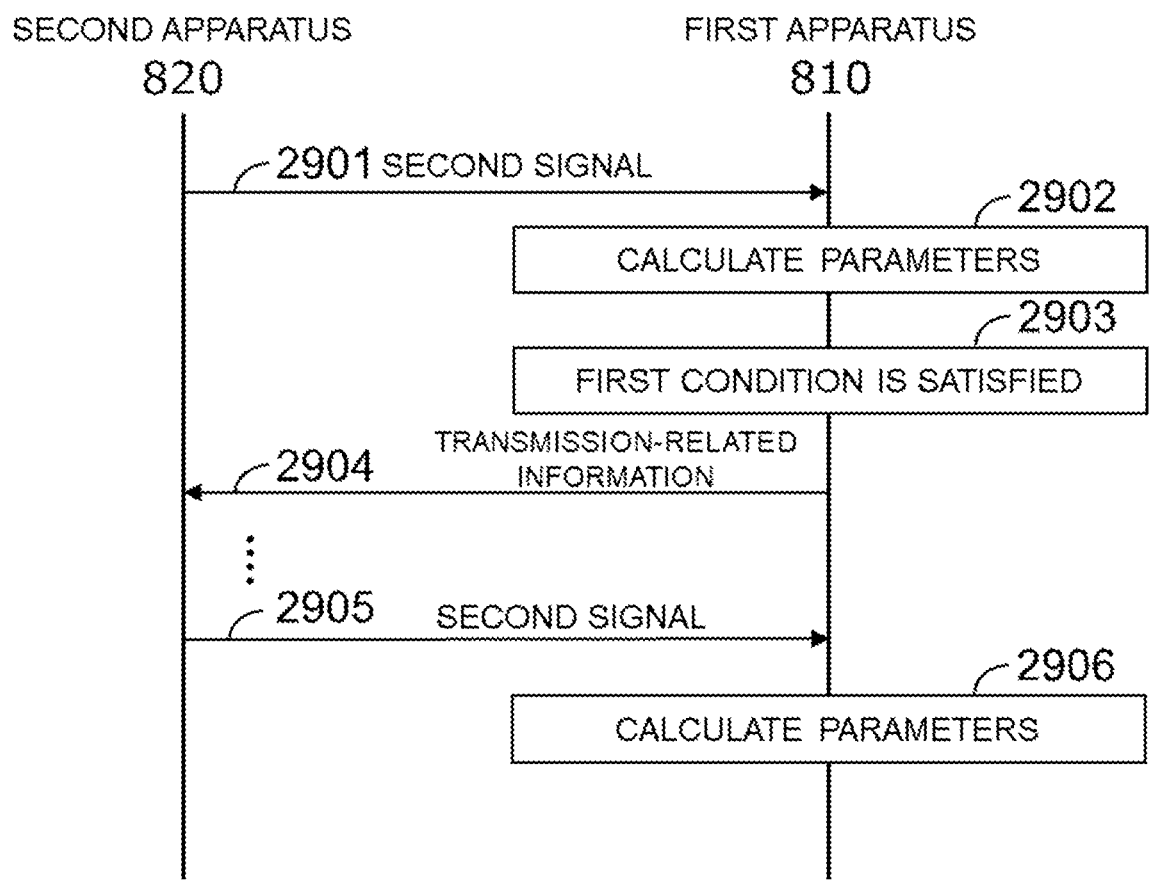
FIG. 29 is a sequence diagram illustrating a flow of processing of a radio communication apparatus according to an example alteration.

FIG. 29 is a sequence diagram illustrating an example of the flow of processing of the radio communication apparatus 2600.

When the radio communication apparatus 2600 is started (or the radio communication apparatus 2600 is reset), the delta-sigma modulator 111 transmits the second signal to the first apparatus 810 (2901). The NN learner 113 calculates the first parameter and the second parameter (2902). The NN learner 113 outputs the approximation error to the information transmitter 145. The information transmitter 145 determines whether or not the first condition is satisfied using the approximation error. In the present example, the information transmitter 145 determines that the first condition has been satisfied (2903). In this case, the information transmitter 145 transmits the transmission-related information (in the present example, the first parameter) to the second apparatus 820 (2904).

Then, the delta-sigma modulator 111 repeatedly transmits the second signal to the first apparatus 810 (2905). The NN learner 113 calculates the first parameter and the second parameter (2906). Then, every time the NN learner 113 calculates the first parameter and the second parameter, the information transmitter 145 determines whether or not the first condition is satisfied. If the first condition has been satisfied, the information transmitter 145 transmits the transmission-related information to the second apparatus 820. On the other hand, if the first condition is not satisfied, the information transmitter 145 does not transmit the transmission-related information to the second apparatus 820.

The above configuration attains the following effect. When the first condition has been satisfied (that is, when the approximation error is large), the first apparatus 810 can transmit the transmission-related information (the first parameter) to the second apparatus 820.

(3) Third Example Alteration

Figure 30:
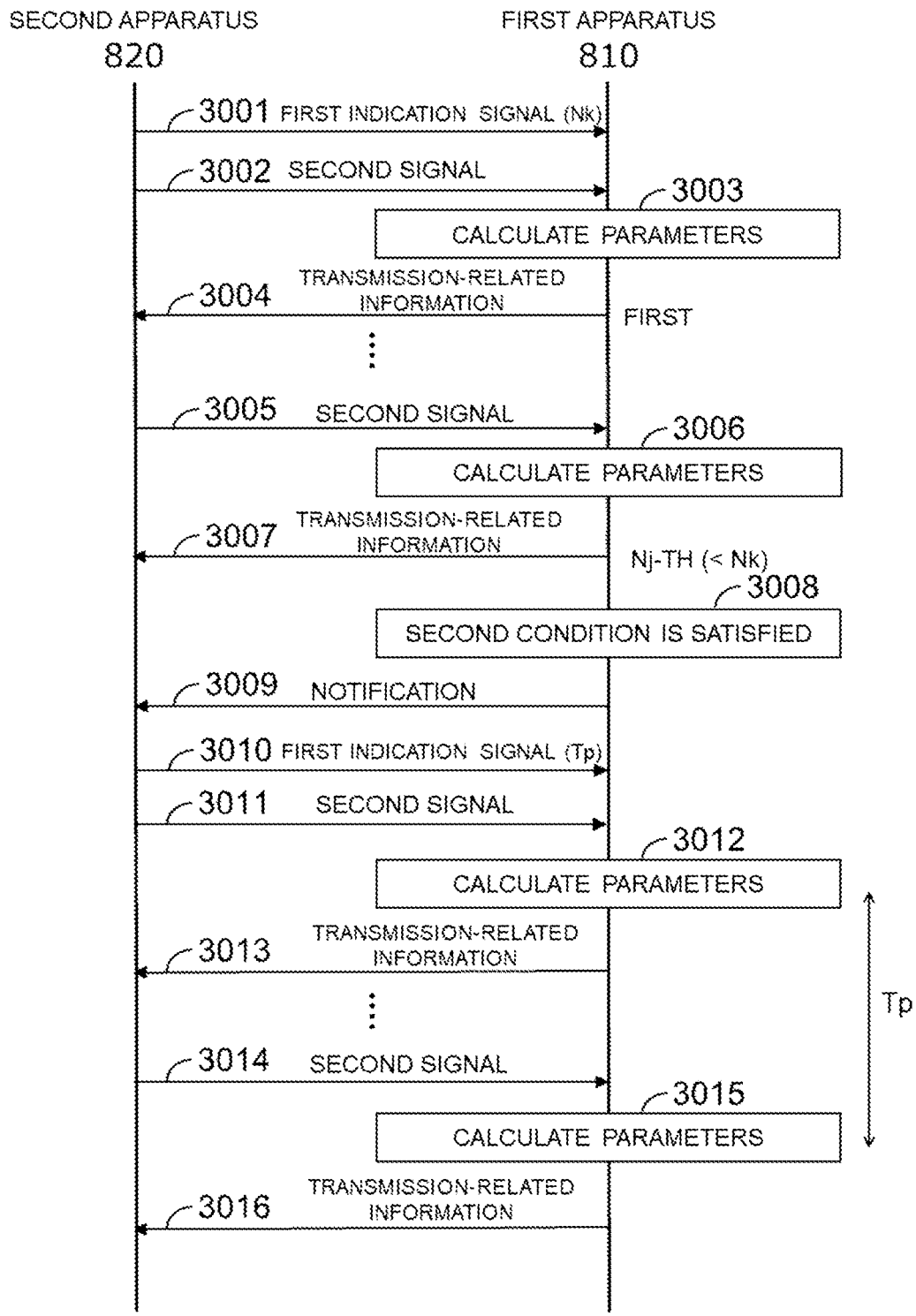
FIG. 30 is a sequence diagram illustrating a flow of processing of a radio communication apparatus according to an example alteration.

The processing shown in FIG. 27 and the processing shown in FIG. 28 may be combined. FIG. 30 is a sequence diagram illustrating an example of the flow of processing of the radio communication apparatus 2600.

Step 3001 to Step 3009 of FIG. 30 and Step 2701 to Step 2709 of FIG. 27 are the same processing. Therefore, detailed explanations of these steps are omitted. Note that, in Step 3001 to Step 3009, a time interval at which the first apparatus 810 transmits the transmission-related information to the second apparatus 820 is shorter than the period Tp.

When the indication transmitter 114 receives a notification in Step 3009, the indication transmitter 114 transmits the first indication signal containing the period Tp to the first apparatus 810 (3010). Step 3011 to Step 3016 of FIG. 30 and Step 2802 to Step 2807 of FIG. 28 are the same processing. Therefore, detailed explanations of these steps are omitted.

The above configuration attains the following effect. The first apparatus 810 first transmits the transmission-related information (the first parameter) to the second apparatus 820 with a relatively short period. The second apparatus 820 can quickly reflect the state of the transmission path 120 in the first NN 300. On the other hand, when the second condition has been satisfied (that is, when the approximation error is small), the necessity to update the first parameter of the first NN 300 is small. In this situation, the first apparatus 810 feeds the transmission-related information back to the second apparatus 820 with the relatively long period Tp.

Note that the processing shown in FIG. 29 may be combined with the sequence of FIG. 30. For example, the information transmitter 145 may determine whether or not the first condition is satisfied in the middle of the period Tp (that is, between Step 3012 and Step 3015). If the first condition has been satisfied, the information transmitter 145 transmits the transmission-related information to the second apparatus 820. On the other hand, if the first condition is not satisfied, the information transmitter 145 does not transmit the transmission-related information to the second apparatus 820. According to this configuration, even in the middle of the period Tp, when the approximation error becomes large, the first apparatus 810 can feed the transmission-related information back to the second apparatus 820.

(4) Fourth Example Alteration

The radio communication apparatus 2600 may have the configuration of the seventh example alteration of the second example embodiment. That is, the radio communication apparatus 2600 may operate using the TDD system. In this configuration, the indication transmitter 114 operates in the following manner. The indication transmitter 114 transmits the first indication signal to the first apparatus 810 via the first communication path 131 in an uplink slot. The indication transmitter 114 transmits the second indication signal to the first apparatus 810 via the first communication path 131 in an uplink slot.

Furthermore, the information transmitter 145 operates in the following manner. The information transmitter 145 transmits the transmission-related information to the second apparatus 820 via the second communication path 132 in a downlink slot.

(5) Fifth Example Alteration

Figure 31:
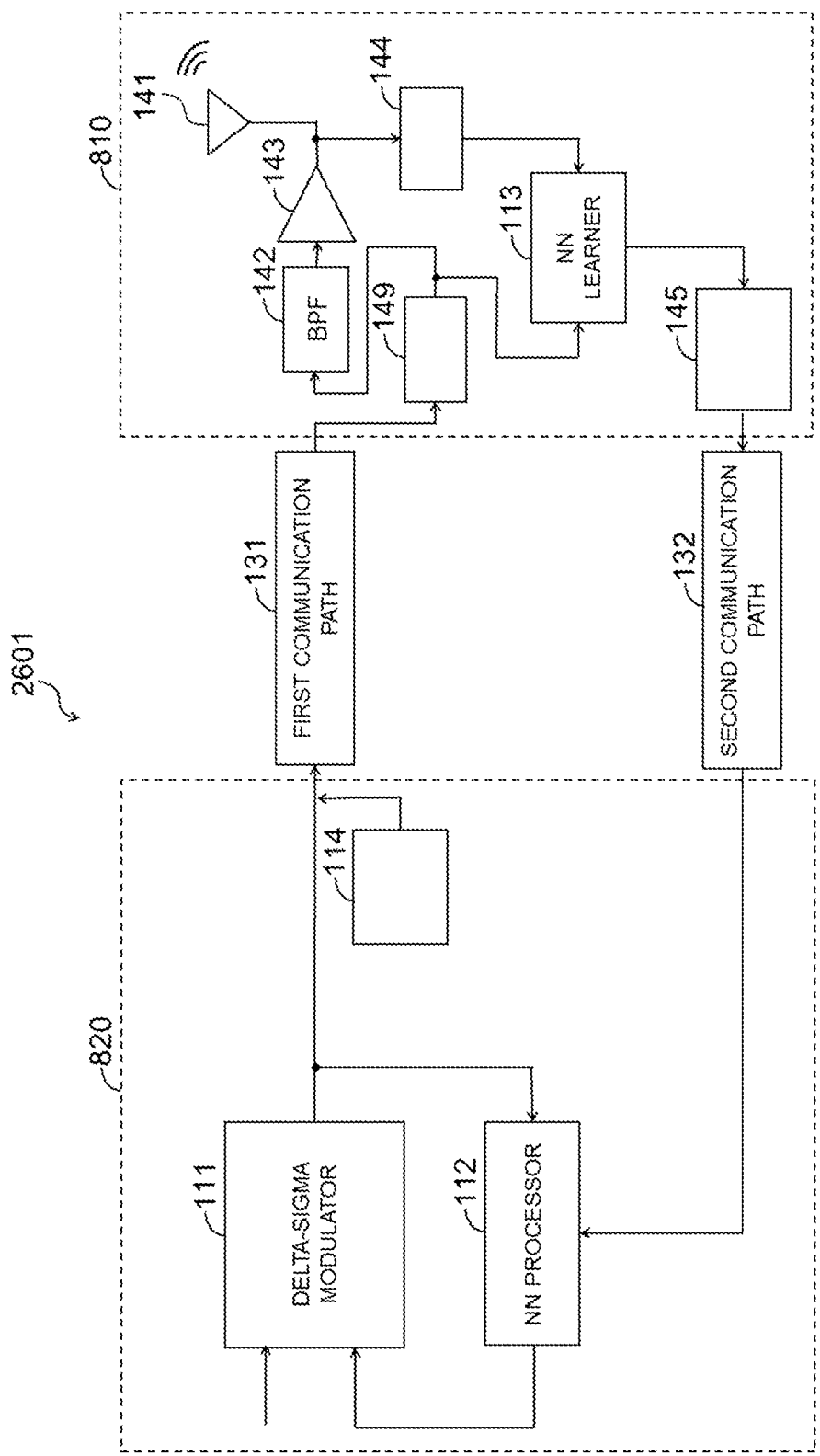
FIG. 31 is a diagram illustrating the configuration of a radio communication apparatus according to an example alteration.

FIG. 31 is a diagram illustrating the configuration of a radio communication apparatus 2601. Constituent elements of the radio communication apparatus 2601 are the same as the constituent elements of the radio communication apparatus 2600 of FIG. 26.

The output of the first communication path 131 is directly input to the digital restorer 149. The fifth signal (the restored second signal) output by the digital restorer 149 is input to the BPF 142. The fifth signal is input to the NN learner 113 through the BPF 142, the amplifier 143, and the modulator 144. Therefore, the NN learner 113 calculates the first parameter and the second parameter using the "fifth signal" and the "third signal generated through the process of passage of the fifth signal through the BPF 142, the amplifier 143, and the modulator 144".

Note that the first apparatus 810 and the second apparatus 820 of the present example may operate according to any one of the sequences of FIG. 27 to FIG. 30.

(6) Sixth Example Alteration

Figure 32:
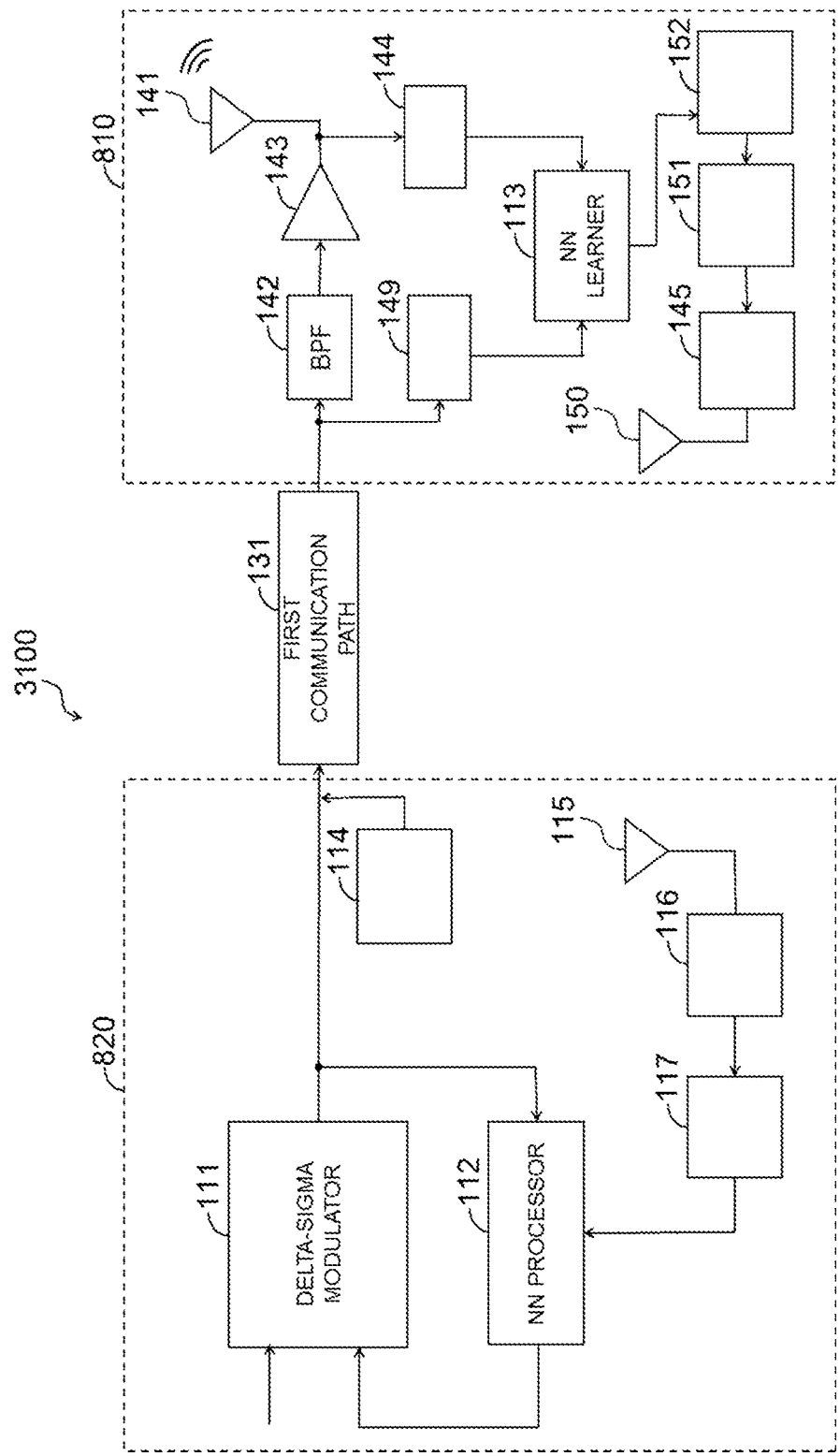
FIG. 32 is a diagram illustrating the configuration of a radio communication apparatus according to an example alteration.

FIG. 32 is a diagram illustrating the configuration of a radio communication apparatus 3100. The radio communication apparatus 3100 includes a first apparatus 810 and a second apparatus 820. The first apparatus 810 and the second apparatus 820 are connected via a first communication path 131.

The first apparatus 810 includes an antenna 141, a BPF 142, an amplifier 143, a modulator 144, an information transmitter 145, a digital restorer 149, an NN learner 113, an antenna 150, a frequency converter 151, and a second modulator 152.

The second apparatus 820 includes a delta-sigma modulator 111, an NN processor 112, a indication transmitter 114, an antenna 115, a modulator 116, and a demodulator 117.

In the present example, the first apparatus 810 transmits the transmission-related information (the first parameter) to the second apparatus 820 via the antenna 150. The second apparatus 820 receives the transmission-related information via the antenna 115. Hereinafter, an operation of the first apparatus 810 and an operation of the second apparatus 820 are described.

The second modulator 152 receives the output (the first parameter) of the NN learner 113. The second modulator 152 performs signal modulation processing on the output of the NN learner 113. As the signal modulation processing, a common modulation system may be used. For example, as the signal modulation processing, single carrier modulation, OFDM or the like may be used. The frequency converter 151 receives the output of the second modulator 152. The frequency converter 151 up-converts the output of the second modulator 152. In this case, the frequency converter 151 up-converts the output of the second modulator 152 to a frequency f1 that is different from the frequency f0. The information transmitter 145 receives the output of the frequency converter 151. The information transmitter 145 transmits the transmission-related information via the antenna 150. The transmission-related information of the present example is the output of the frequency converter 151 and is the first parameter.

The second apparatus 820 receives the signal output from the antenna 150 via the antenna 115. The modulator 116 down-converts the received signal and outputs the I signal and the Q signal. The demodulator 117 demodulates the I signal and the Q signal to the original digital value (the first parameter). Note that a demodulation system of the demodulator 117 is a system corresponding to the modulation system of the second modulator 152.

The demodulator 117 outputs the first parameter to the NN processor 112. The NN processor 112 receives the first parameter. The NN processor 112 updates the first parameter of the first NN 300 to the received first parameter.

Note that the first apparatus 810 and the second apparatus 820 may operate according to any one of the sequences of FIG. 27 to FIG. 30.

6. Fifth Example Embodiment

Next, a fifth example embodiment is described with reference to FIG. 33 and FIG. 34. While the first to fourth example embodiments described above are specific example embodiments, the fifth example embodiment is a more generalized example embodiment.

<6-1. Configuration of a Delta-Sigma Modulation Apparatus>

Figure 33:
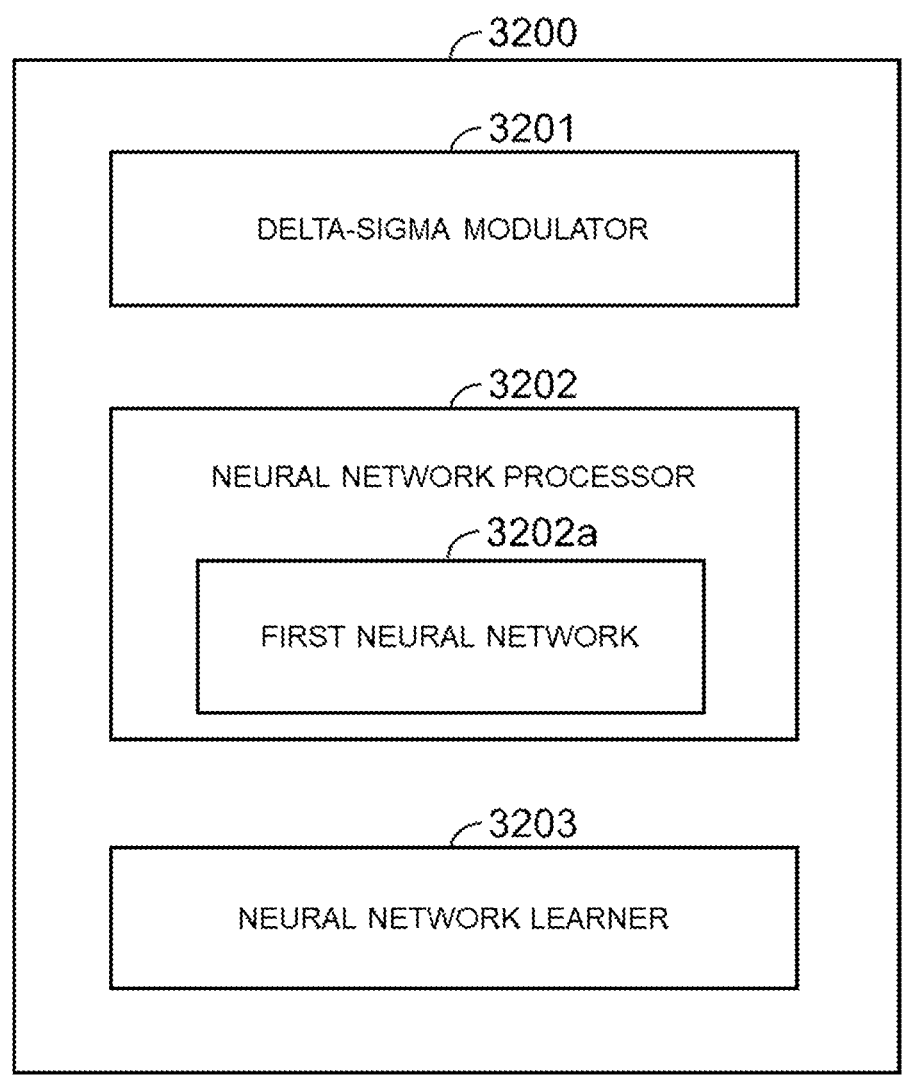
FIG. 33 is a diagram illustrating the configuration of a delta-sigma modulation apparatus according to a fifth example embodiment.

FIG. 33 is a diagram illustrating the configuration of a delta-sigma modulation apparatus 3200. The delta-sigma modulation apparatus 3200 includes a delta-sigma modulator 3201, a neural network processor 3202, and a neural network learner 3203. Hereinafter, the neural network processor 3202 is referred to as the "NN processor 3202" and the neural network learner 3203 is referred to as the "NN learner 3203".

The constituent elements 3201 to 3203 of the delta-sigma modulation apparatus 3200 may be implemented by one or more processors and a memory. The one or more processors may include one or more of a CPU, an MPU, and a microcontroller, for example. The memory may include a volatile memory and a nonvolatile memory. The memory may store a program code (an instruction). The one or more processors may implement the function of the delta-sigma modulation apparatus 3200 by executing the program code stored in the memory.

The delta-sigma modulator 3201 may operate in the same manner as the delta-sigma modulator 111. As an example, the delta-sigma modulator 3201 performs delta-sigma modulation.

The NN processor 3202 may operate in the same manner as the NN processor 112. As an example, the NN processor 3202 includes a first neural network 3202a that operates according to a predetermined first parameter. Hereinafter, the first neural network 3202a is referred to as the "first NN 3202a". The first NN 3202a may have the same configuration as that of the first NN 300. The first parameter may contain a weight and a bias.

The NN learner 3203 may operate in the same manner as the NN learner 113. As an example, the NN learner 3203 calculates the first parameter of the first NN 3202a.

<6-2. Flow of Processing of the Delta-Sigma Modulation Apparatus>

Figure 34:
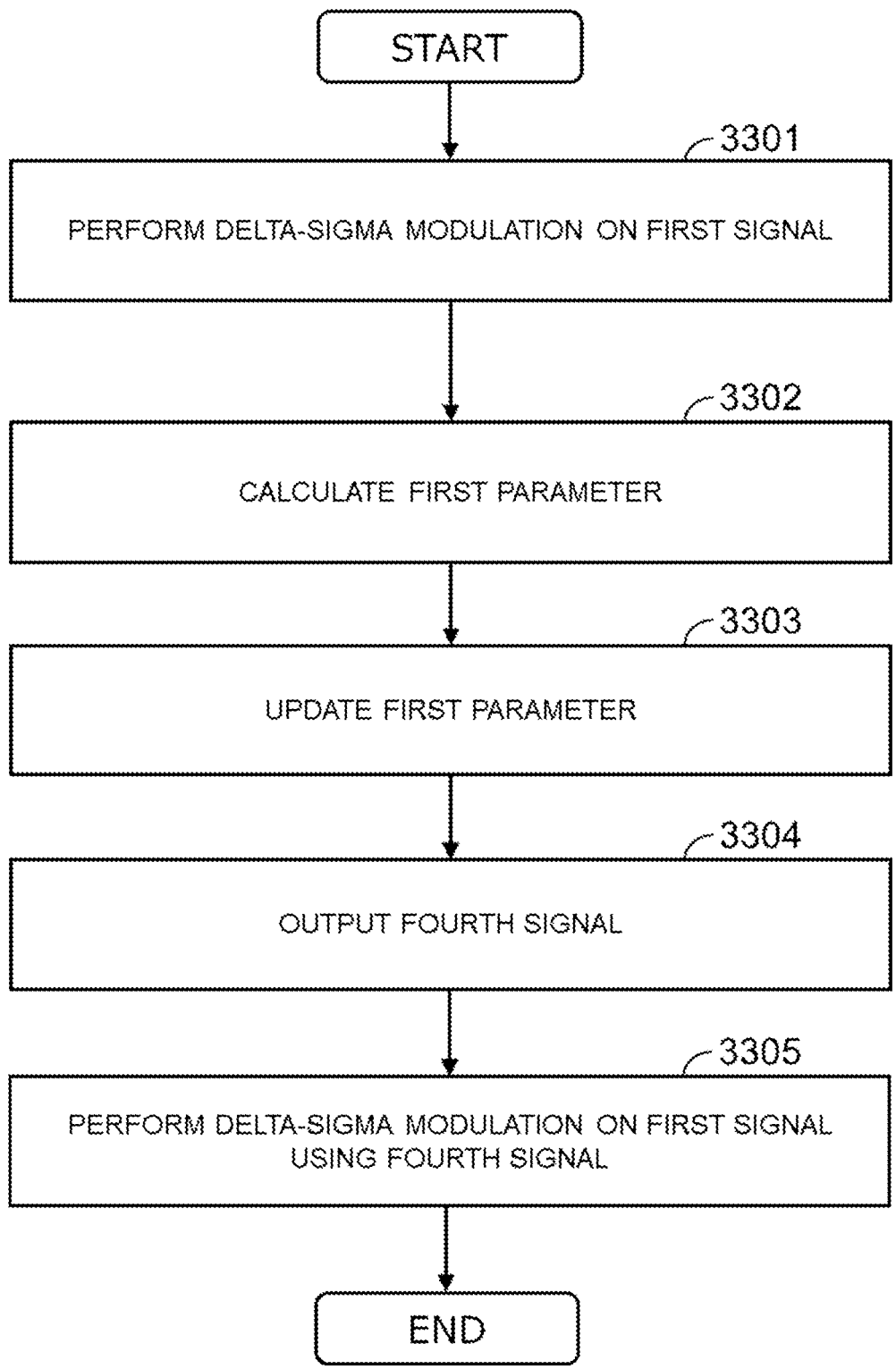
FIG. 34 is a flowchart illustrating a flow of processing of the delta-sigma modulation apparatus according to the fifth example embodiment.

FIG. 34 is a flowchart for explaining an example of a flow of processing of the delta-sigma modulation apparatus 3200.

The delta-sigma modulator 3201 performs delta-sigma modulation on a first signal as an external input signal, and outputs a second signal (3301).

The NN learner 3203 calculates the first parameter of the first NN 3202a using the second signal and a third signal generated through a transmission process of the second signal (3302).

The NN processor 3202 updates the first parameter of the first NN 3202a to the first parameter calculated by the NN learner 3203 (3303).

The NN processor 3202 outputs a fourth signal using the second signal through the first NN 3202a (3304). The fourth signal is an approximated value of a signal which is generated through at least part of the transmission process of the second signal.

The delta-sigma modulator 3201 performs delta-sigma modulation on the first signal using the fourth signal that is output from the NN processor 3202, and outputs the second signal (3305).

Note that the NN learner 3203 may calculate the first parameter of the first NN 3202a using the third signal and a restored signal of the second signal generated from the third signal.

The above configuration attains the following effect. By the above-described feedback processing, the delta-sigma modulation apparatus 3200 can suppress transmission distortion that occurs in the transmission process of the second signal.

Note that the processing from Step 3302 to Step 3305 may be repeatedly performed after the processing of Step 3305.

7. Sixth Example Embodiment

Next, a sixth example embodiment and example alterations thereof are described with reference to FIG. 35 to FIG. 46.

7-1. Configuration of a Delta-Sigma Modulation Apparatus

Figure 35:
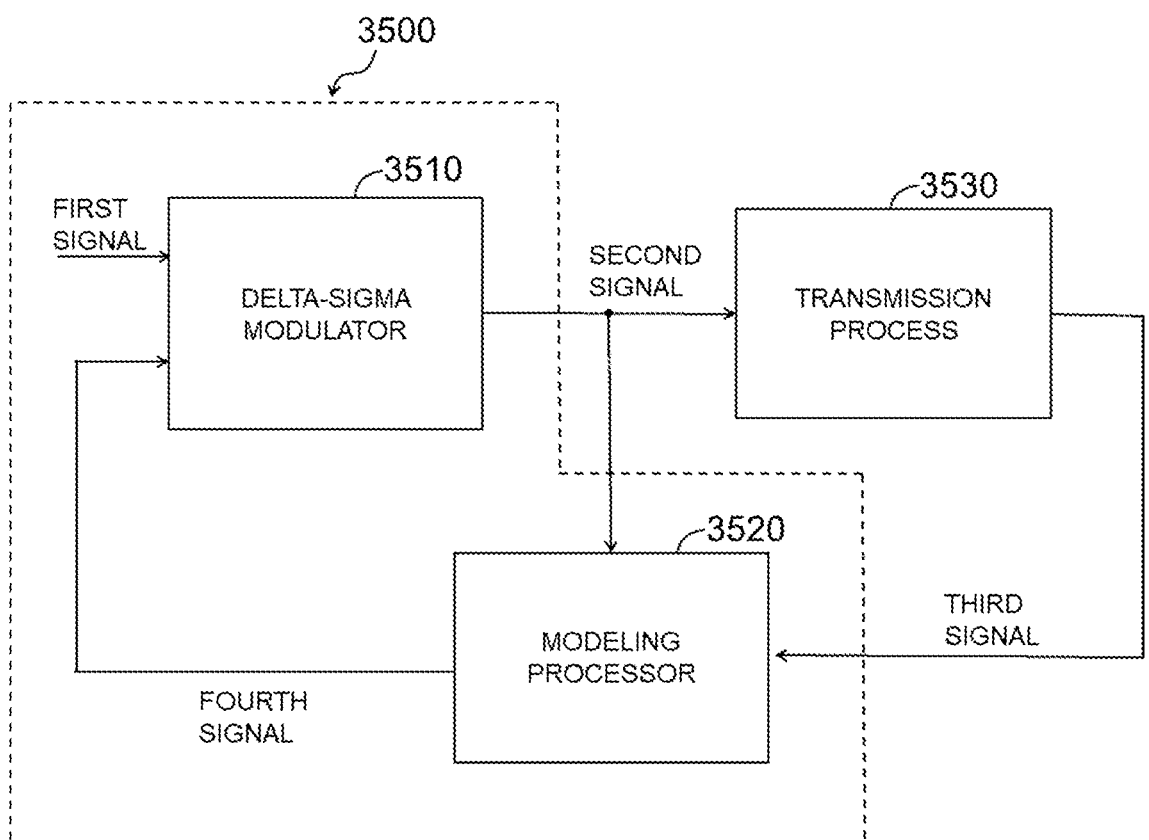
FIG. 35 is a diagram illustrating the configuration of a delta-sigma modulation apparatus according to a sixth example embodiment.

FIG. 35 is a diagram illustrating the configuration of a delta-sigma modulation apparatus 3500. The delta-sigma modulation apparatus 3500 includes a delta-sigma modulator 3510 and a modeling processor 3520.

The delta-sigma modulator 3510 performs delta-sigma modulation. The modeling processor 3520 performs processing to approximate transmission characteristics of at least part of a transmission process 3530.

As in the case of the hardware configuration illustrated with reference to FIG. 9, the constituent elements 3510 and 3520 of the delta-sigma modulation apparatus 3500 may be implemented by one or more processors and a memory. The one or more processors may include one or more of a CPU, an MPU, and a microcontroller, for example. The memory may include volatile memory and nonvolatile memory. The memory may store a program code (an instruction). The one or more processors may implement the function of the delta-sigma modulation apparatus 3500 by executing the program code stored in the memory.

As in the case of the example embodiments described above, an analog signal that is input to the delta-sigma modulator 3510 is referred to as a "first signal". Furthermore, a quantized signal that is output by the delta-sigma modulator 3510 is referred to as a "second signal". The transmission process 3530 is a transmission process of the second signal and may be referred to as a transmission path of the second signal. A signal that is generated through the transmission process 3530 of the second signal and is fed back to the modeling processor 3520 is referred to as a "third signal". The third signal can contain information on transmission distortion that has occurred in the transmission process 3530. Therefore, the third signal is used to feed information on transmission distortion that has occurred in the transmission process 3530 back.

The delta-sigma modulator 3510 performs delta-sigma modulation on the first signal and outputs the second signal. The modeling processor 3520 outputs, using the second signal and the third signal generated through the transmission process 3530 of the second signal, a fourth signal that is an approximated value of a signal which is generated through at least part of the transmission process 3530. The delta-sigma modulator 3510 performs delta-sigma modulation on the first signal using the fourth signal and outputs the second signal.

7-2. Configuration of a Model

Next, a model that is used in the modeling processor 3520 is described. Hereinafter, the model is referred to as a "first model". The modeling processor 3520 outputs the fourth signal using a first model 3600.

Figure 36:
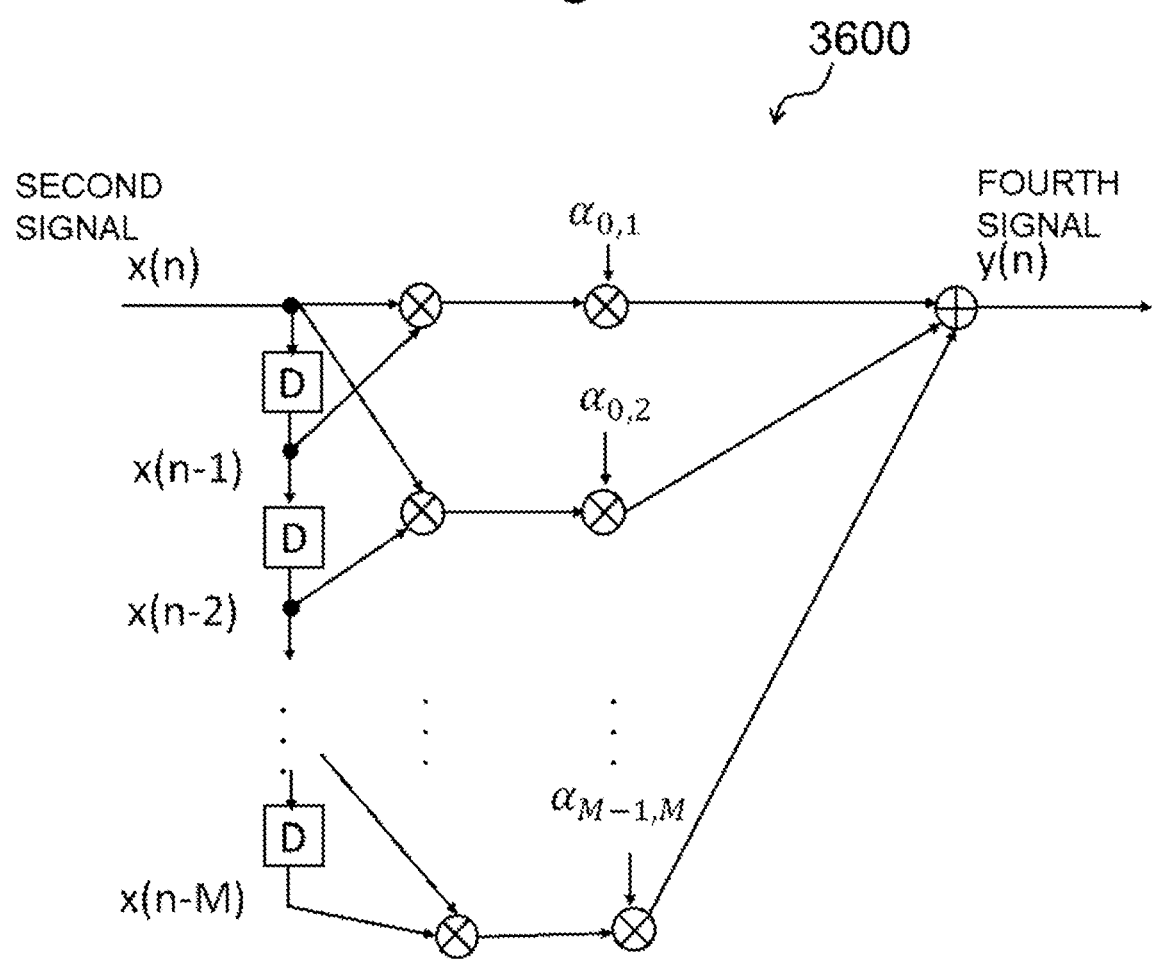
FIG. 36 is a diagram illustrating an example of the configuration of a first model.

FIG. 36 is a diagram illustrating an example of the configuration of the first model 3600. An input signal to the first model 3600 is the second signal and is represented by x(n). In FIG. 36, as in the case of the example embodiments described above, "D" represents a delay. "a" is a parameter. An output signal of the first model 3600 (that is, the fourth signal) is obtained by a linear sum of x(n−i)×x(n−j) which is mixing of the current signal x(n−i) and the past signal x(n−j) of the second signal. If the fourth signal is assumed to be y(n), y(n) is expressed by the following formula.

$$y(n) = \sum_{i=0}^{M-1} \sum_{j=i+1}^{M} \alpha_{i,j} x(n-i) x(n-j)$$

Note that mixing contained in the output of the fourth signal is not limited to the mixing of two signals. For example, mixing contained in the output of the fourth signal may contain a linear sum of mixing of three or more signals x(n−i)×x(n−j)×x(n−k). Hereinafter, such a model is referred to as a "polynomial model".

The above configuration attains the following effect. The first model 3600 can efficiently generate distortion that is caused by mixing of an electric current and a voltage that occurs in the process of passage of the second signal through the transmission process 3530. As a result, the accuracy of the fourth signal that is output by the first model 3600 is improved.

Note that the first model may be a non-linear model such as a neural network (NN), a logical operation, a polynomial and the like. For example, the first model may include the NN described in the first to fifth example embodiments and an example alteration (FIG. 37) thereof. Moreover, the first model may be one of an NN, a logical operation, and a polynomial or a combination of two or more of them.

Figure 37:
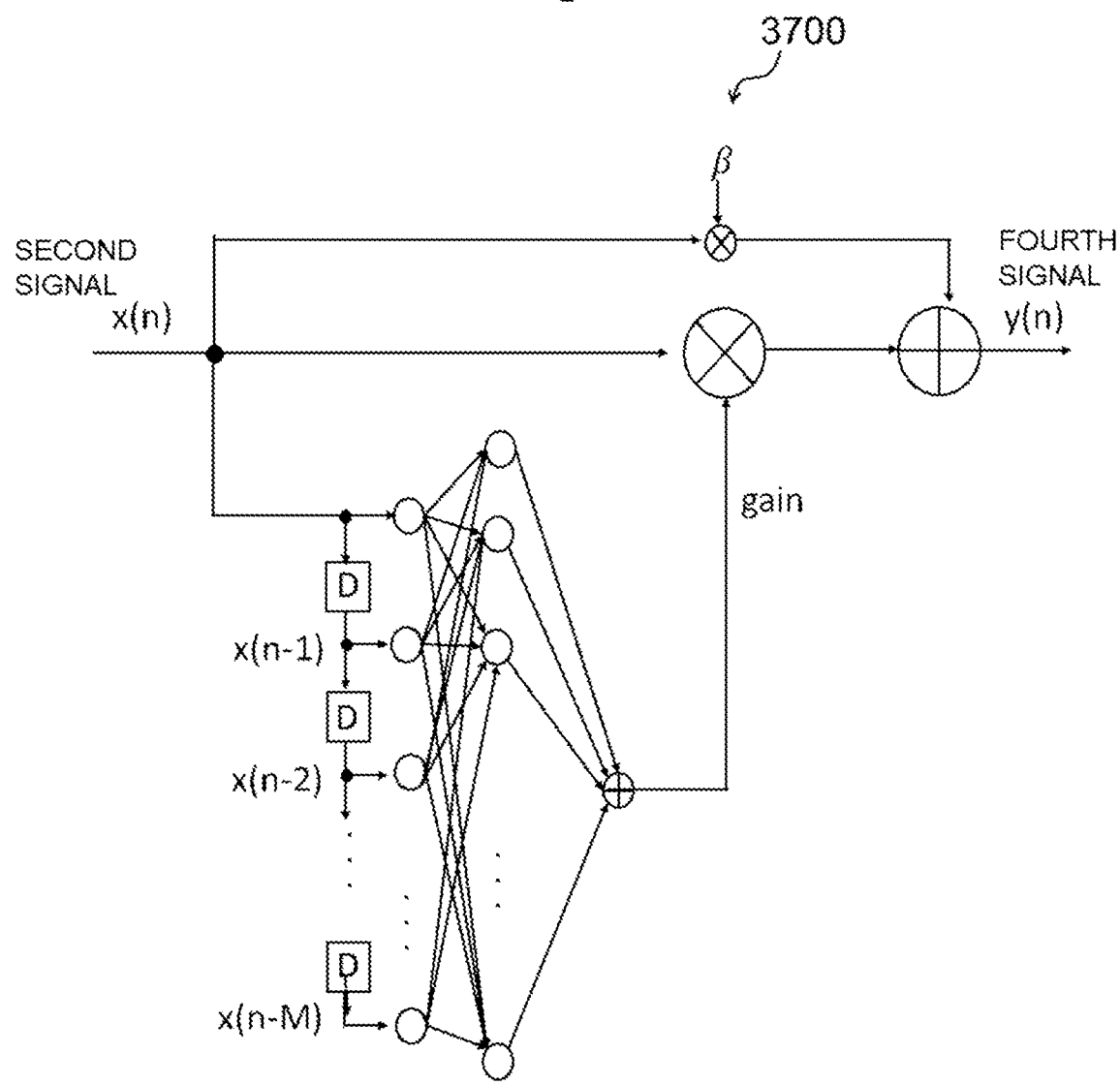
FIG. 37 is a diagram illustrating an example of the configuration of a first model.

FIG. 37 is a diagram illustrating an example of the configuration of a first model 3700. The first model 3700 includes a neural network (NN). The fourth signal y(n) is obtained by adding up the product of the output of the NN and the second signal x(n), and the product of the second signal x(n) and a constant (β).

As described above, the first model 3700 may be a model by which the output of a non-linear model is a gain for the current signal (the second signal x(n)). The above configuration attains the following effect. The first model 3700 can efficiently generate a change in a pattern-dependent gain that occurs in the process of passage of the second signal through the transmission process 3530. The first model 3700 can efficiently generate distortion by multiplying the gain and the current signal together. Consequently, the accuracy of the fourth signal that is output by the first model 3700 is improved.

Figure 38:
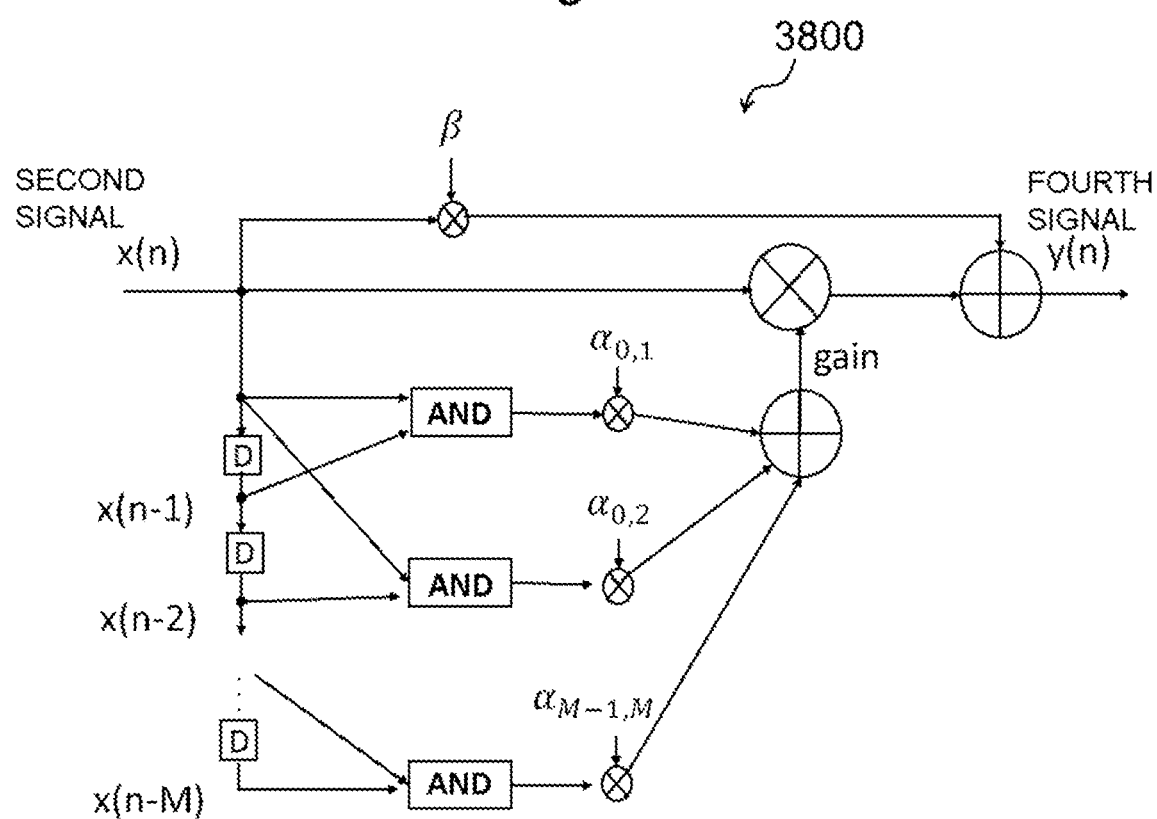
FIG. 38 is a diagram illustrating an example of the configuration of a first model.

FIG. 38 is a diagram illustrating an example of the configuration of a first model 3800. The first model 3800 includes a logical operation. In the present example, the logical operation is an AND for ease of explanation. In the present example, the fourth signal y(n) is expressed by the following formula.

$$y(n) = x(n) \left( \beta + \sum_{i=0}^{M-1} \sum_{j=i+1}^{M} \alpha_{i,j} \cdot \text{AND}\ (x(n-i), x(n-j)) \right)$$

Note that a logic operator contained in the first model 3800 is not limited to an AND and the first model 3800 may contain other logic operators (an OR, an XOR and the like). The first model 3800 may contain a combination of a plurality of logic operators. For example, the first model 3800 may contain a combination of an OR operator and an AND operator: OR(AND(x(n−i), x(n−j)), x(n−k)). In this case, when x(n) is binary, −1 or 1, the first model 3800 may contain scaling that makes an input to a logic operator become binary, 0 or 1. Specifically, an input to a logic operator is scaled to binary, 0 and 1, from binary, −1 and 1, by using a value obtained by adding +1 to a conventional input and multiplying the result by 0.5.

The above configuration attains the following effect. The first model 3800 can efficiently generate a change in a gain associated with a change in a pattern that occurs in the process of passage of the second signal through the transmission process 3530. The first model 3800 can efficiently generate distortion by multiplying the gain and the current signal together. Consequently, the accuracy of the fourth signal that is output by the first model 3800 is improved.

Figure 39:
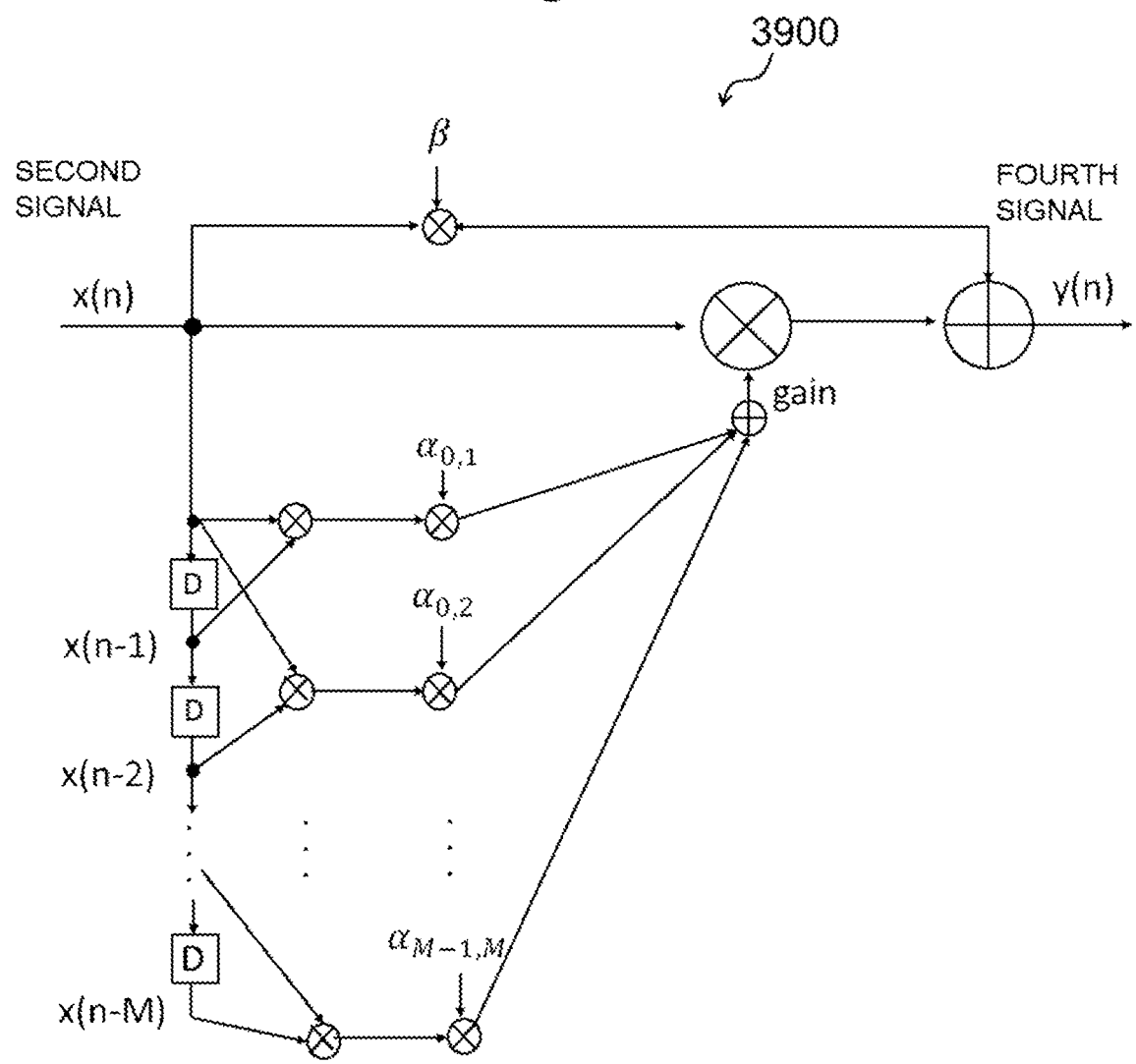
FIG. 39 is a diagram illustrating an example of the configuration of a first model.

FIG. 39 is a diagram illustrating an example of the configuration of a first model 3900. A polynomial that is used in the first model 3900 is similar to the polynomial explained using FIG. 36. In the present example, the fourth signal y(n) is obtained by adding up the product of the output of the polynomial of FIG. 36 and the second signal x(n), and the product of the second signal x(n) and a constant (β). Specifically, the fourth signal y(n) is expressed by the following formula.

$$y(n) = x(n) \left( \beta + \sum_{i=0}^{M-1} \sum_{j=i+1}^{M} \alpha_{i,j} x(n-i) x(n-j) \right)$$

The above configuration attains the following effect. The first model 3900 can efficiently generate a change in a gain associated with mixing of an electric current and a voltage, which occurs in the process of passage of the second signal through the transmission process 3530. The first model 3900 can efficiently generate distortion by multiplying the gain and the current signal together. Consequently, the accuracy of the fourth signal that is output by the first model 3900 is improved.

Figure 40:
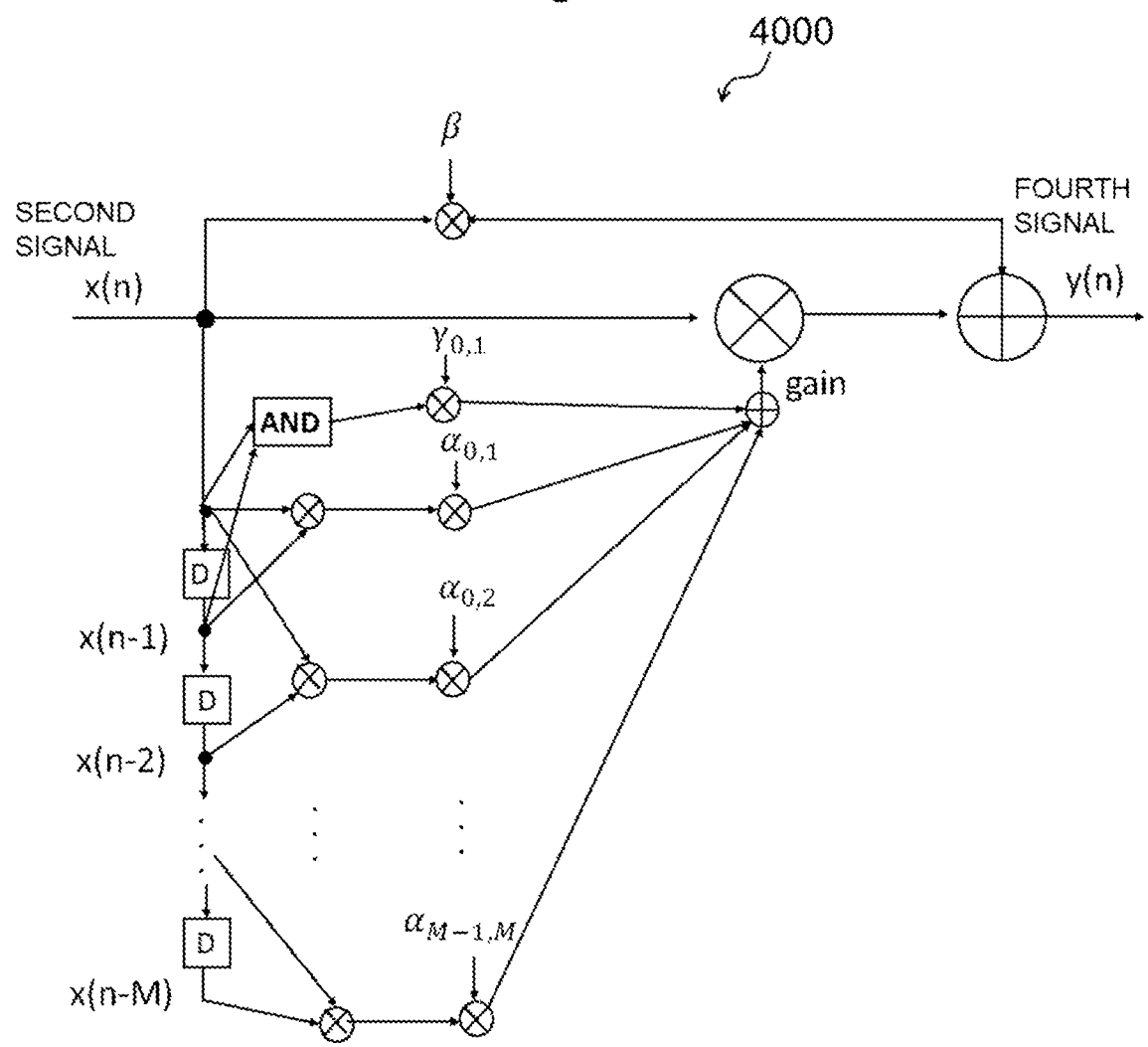
FIG. 40 is a diagram illustrating an example of the configuration of a first model.

Note that the first model may include one selected from the models of FIG. 13, FIG. 14, and FIGS. 36 to 39 or a combination of two or more of them. FIG. 40 is a diagram illustrating an example of the configuration of a first model 4000. The first model 4000 is a combination of the polynomial model of FIG. 39 and the logic operator model of FIG. 38. The first model 4000 can generate the fourth signal with higher accuracy.

7-3. Flow of Processing of the Delta-Sigma Modulation Apparatus

Figure 41:
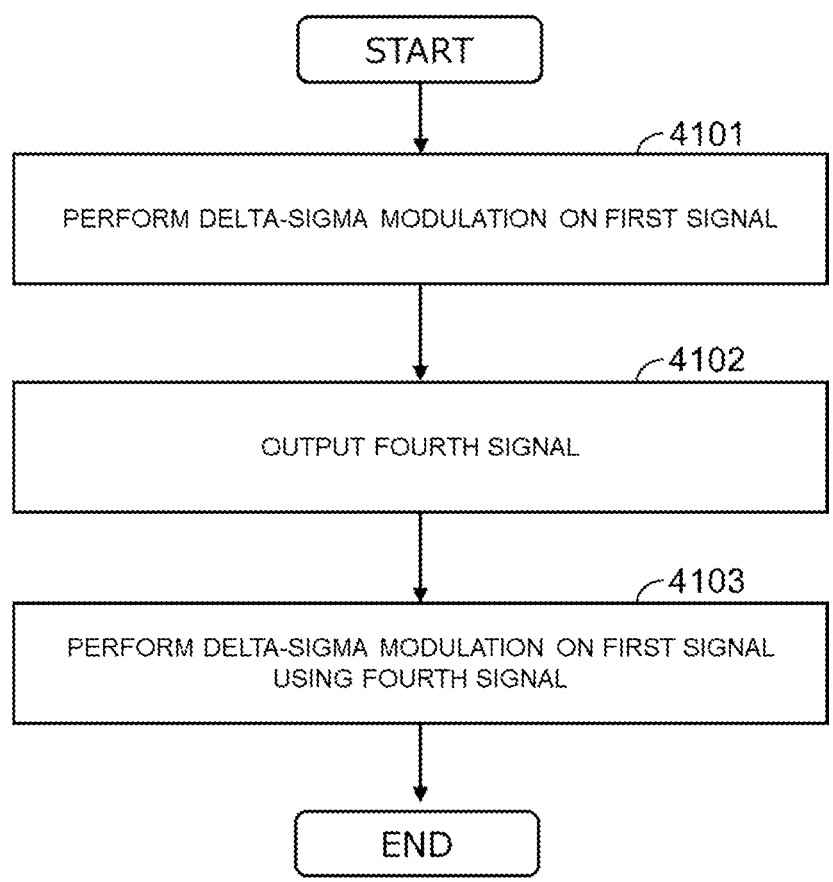
FIG. 41 is a flowchart illustrating a flow of processing of the delta-sigma modulation apparatus according to the sixth example embodiment.

FIG. 41 is a flowchart for explaining an example of a flow of processing of the delta-sigma modulation apparatus 3500.

The delta-sigma modulator 3510 performs delta-sigma modulation on the first signal and outputs the second signal (4101). The modeling processor 3520 outputs, using the second signal and the third signal generated through the transmission process 3530 of the second signal, the fourth signal that is an approximated value of a signal which is generated through at least part of the transmission process 3530 (4102). The delta-sigma modulator 3510 performs delta-sigma modulation on the first signal using the fourth signal and outputs the second signal (4103).

The above configuration attains the following effect. By the above-described feedback processing, the delta-sigma modulation apparatus 3500 can suppress transmission distortion that occurs in the transmission process 3530.

7-4. Example Alterations

(1) First Example Alteration

The output of the first model may be a complex number. That is, the output of the first model may contain a signal representing a real component and a signal representing an imaginary component. The first model that outputs such a signal representing a complex number is implemented by extending a coefficient in FIG. 13, FIG. 14, and FIGS. 36 to 40 to a complex number. In another example, the first model that outputs a signal representing a complex number is implemented by extending a weight, a bias and the like of a neural network (NN) to a complex number.

The modeling processor 3520 outputs the fourth signal that is a signal representing a complex number. For example, sometimes a feedback value for the delta-sigma modulator 3510 is limited to a real number. In this case, the delta-sigma modulation apparatus 3500 may further include a converter 4200. The converter 4200 converts the fourth signal that is a signal representing a complex number to the fourth signal that is a signal representing a real number. According to this configuration, the fourth signal that is a real number is fed back to the delta-sigma modulator 3510.

Figure 42:
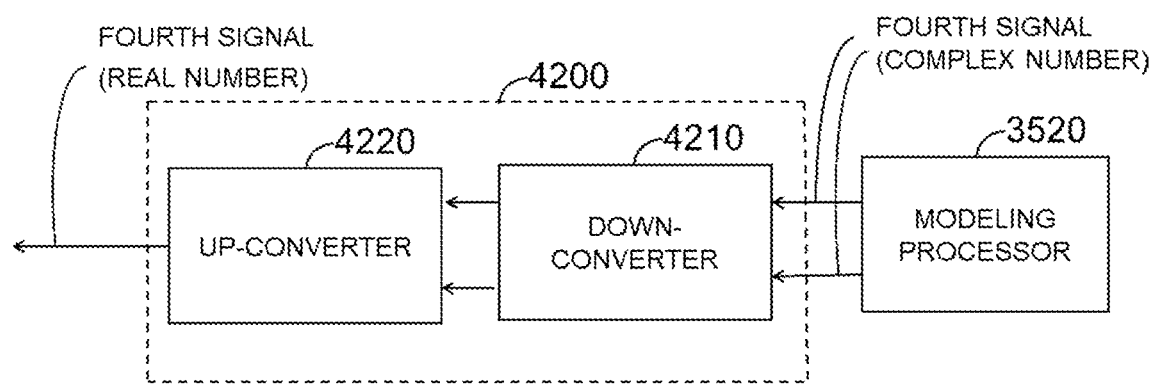
FIG. 42 is a diagram illustrating an example of the configuration of a converter.

FIG. 42 is a diagram illustrating an example of the configuration of the converter 4200. The converter 4200 converts the fourth signal of a complex number to the fourth signal of a real number by operations of frequency conversion and frequency inverse-conversion. The operations of frequency conversion and frequency inverse-conversion are operations to output a signal of a real number by shifting the frequency of the fourth signal from a desired frequency band and restoring the shifted frequency to the original frequency band.

For the above operations, the converter 4200 includes a down-converter 4210 and an up-converter 4220. The down-converter 4210 down-converts the fourth signal of a complex number and outputs the down-converted signal to the up-converter 4220. The up-converter 4220 up-converts the signal and outputs the up-converted signal as the fourth signal of a real number.

Note that, in the processing in the converter 4200, the order of down-conversion and up-conversion may be reversed. That is, the fourth signal of a real number may be obtained by up-converting the fourth signal of a complex number and down-converting the up-converted fourth signal.

The configuration of FIG. 42 can be applied to one selected from the models of FIG. 13, FIG. 14, and FIGS. 36 to 40 or a combination of two or more of them. According to this configuration, it is possible to extend the expressive range of the first model, which results in an improvement in the accuracy of the fourth signal.

(2) Second Example Alteration

Figure 43:
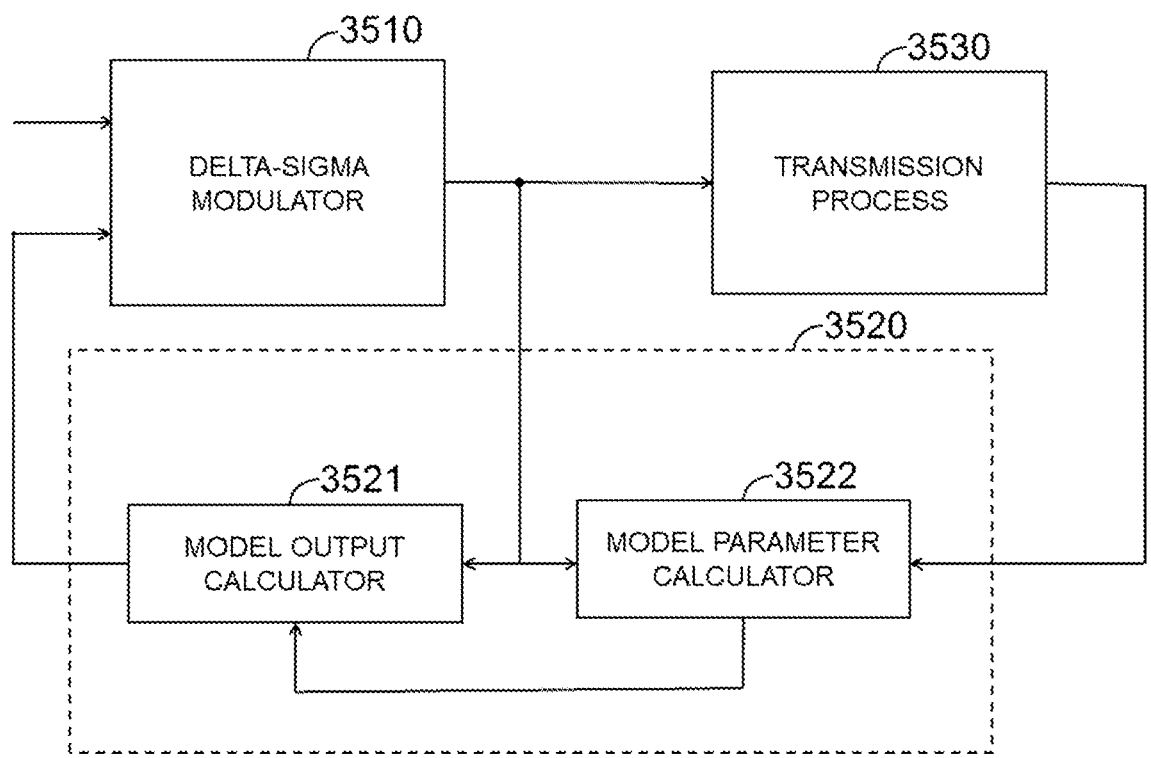
FIG. 43 is a diagram illustrating an example of the configuration of a modeling processor.

FIG. 43 is a diagram illustrating an example of the configuration of the modeling processor 3520. The modeling processor 3520 includes a model output calculator 3521 and a model parameter calculator 3522. The model output calculator 3521 includes a first model that operates according to a predetermined first parameter. The first model may have any one of the configurations described above. The model parameter calculator 3522 calculates the first parameter.

Figure 44:
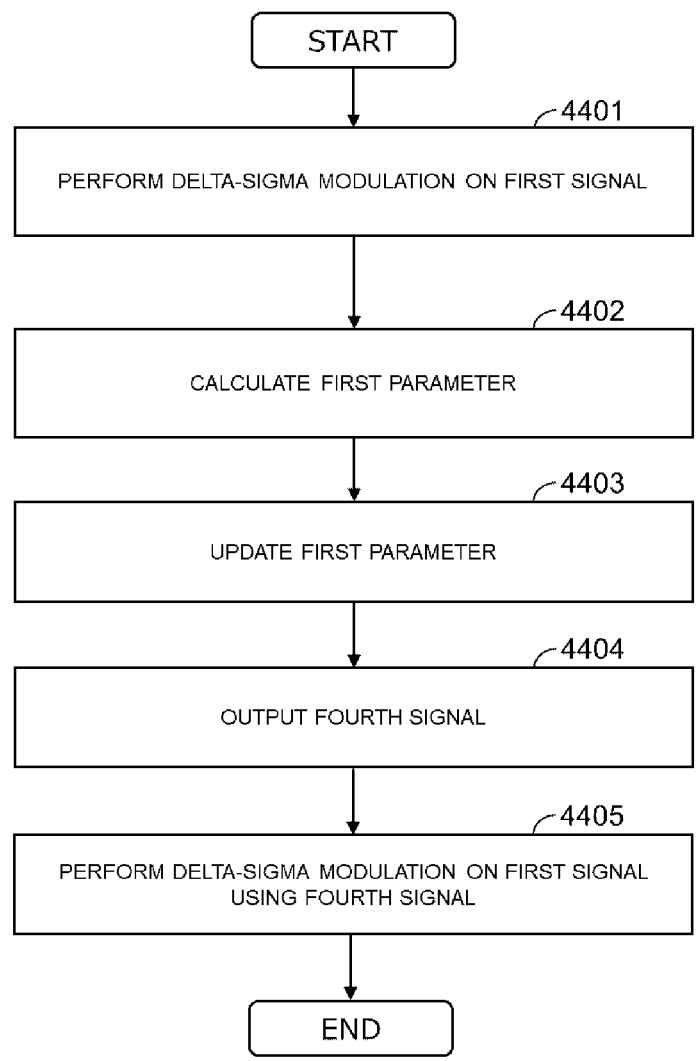
FIG. 44 is a flowchart illustrating a flow of processing of a delta-sigma modulation apparatus according to an example alteration.

FIG. 44 is a flowchart for explaining an example of the flow of processing of the delta-sigma modulation apparatus 3500.

The delta-sigma modulator 3510 performs delta-sigma modulation on the first signal and outputs the second signal (4401).

The model parameter calculator 3522 calculates the first parameter using the second signal, and the third signal generated through the transmission process 3530 of the second signal (4402).

Note that the model parameter calculator 3522 may calculate the first parameter using the third signal generated through the transmission process 3530 of the second signal and a restored signal of the second signal generated from the third signal.

The model output calculator 3521 updates the first parameter to the first parameter calculated by the model parameter calculator 3522 (4403).

The model output calculator 3521 outputs, using the second signal through the first model, the fourth signal that is an approximated value of a signal which is generated through at least part of the transmission process 3530 (4404).

The delta-sigma modulator 3510 performs delta-sigma modulation on the first signal using the fourth signal that is output from the model output calculator 3521, and outputs the second signal (4405).

(3) Third Example Alteration

Figure 45:
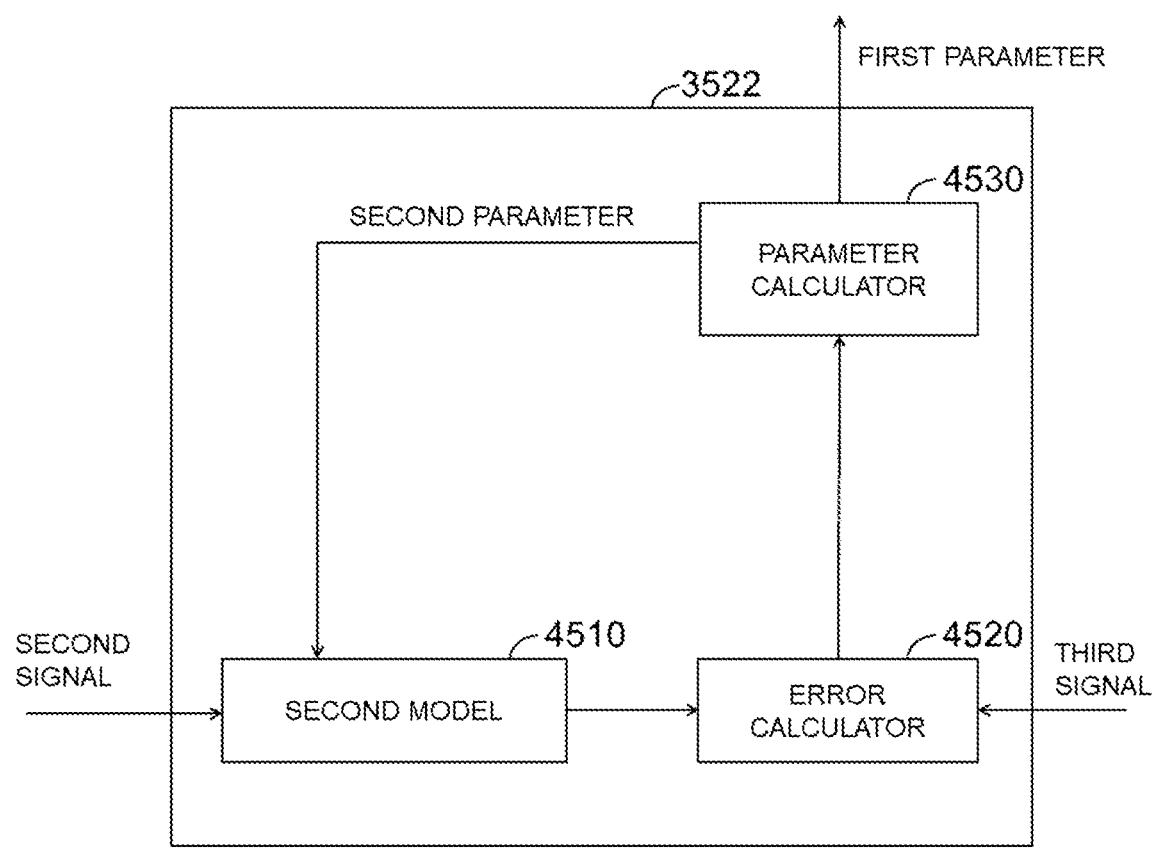
FIG. 45 is a diagram illustrating an example of the configuration of a model parameter calculator.

FIG. 45 is a diagram illustrating an example of the configuration of the model parameter calculator 3522. The model parameter calculator 3522 may include a second model 4510, an error calculator 4520, and a parameter calculator 4530. The second model 4510 is a second model obtained by modeling at least part of the transmission process 3530. The second model 4510 may have the same configuration as the first model described above. The second model 4510 generates, using the second signal, an approximated value of a signal which is generated through at least part of the transmission process 3530, and outputs the approximated value to the error calculator 4520. For example, the second model 4510 outputs an approximated value of the third signal. The error calculator 4520 calculates an error between the approximated value of the third signal and the third signal, and outputs the error to the parameter calculator 4530. The parameter calculator 4530 calculates the first parameter using the error. The parameter calculator 4530 outputs the calculated first parameter to the model output calculator 3521.

The parameter calculator 4530 may calculate the first parameter if the error is greater than a predetermined first magnitude.

The parameter calculator 4530 may continue calculating the first parameter until the error becomes less than a predetermined second magnitude. The second magnitude is smaller than the first magnitude.

Note that the second model 4510 may have a configuration similar to that of the transmission model 410. The error calculator 4520 may perform processing similar to that of the error calculator 420 described above. The parameter calculator 4530 may perform processing similar to that of the parameter calculator 430 described above.

The second model 4510 may operate according to a predetermined second parameter. The parameter calculator 4530 may calculate the second parameter using the error and update the second parameter of the second model 4510 to the second parameter calculated by the parameter calculator 4530.

(4) Fourth Example Alteration

Figure 46:
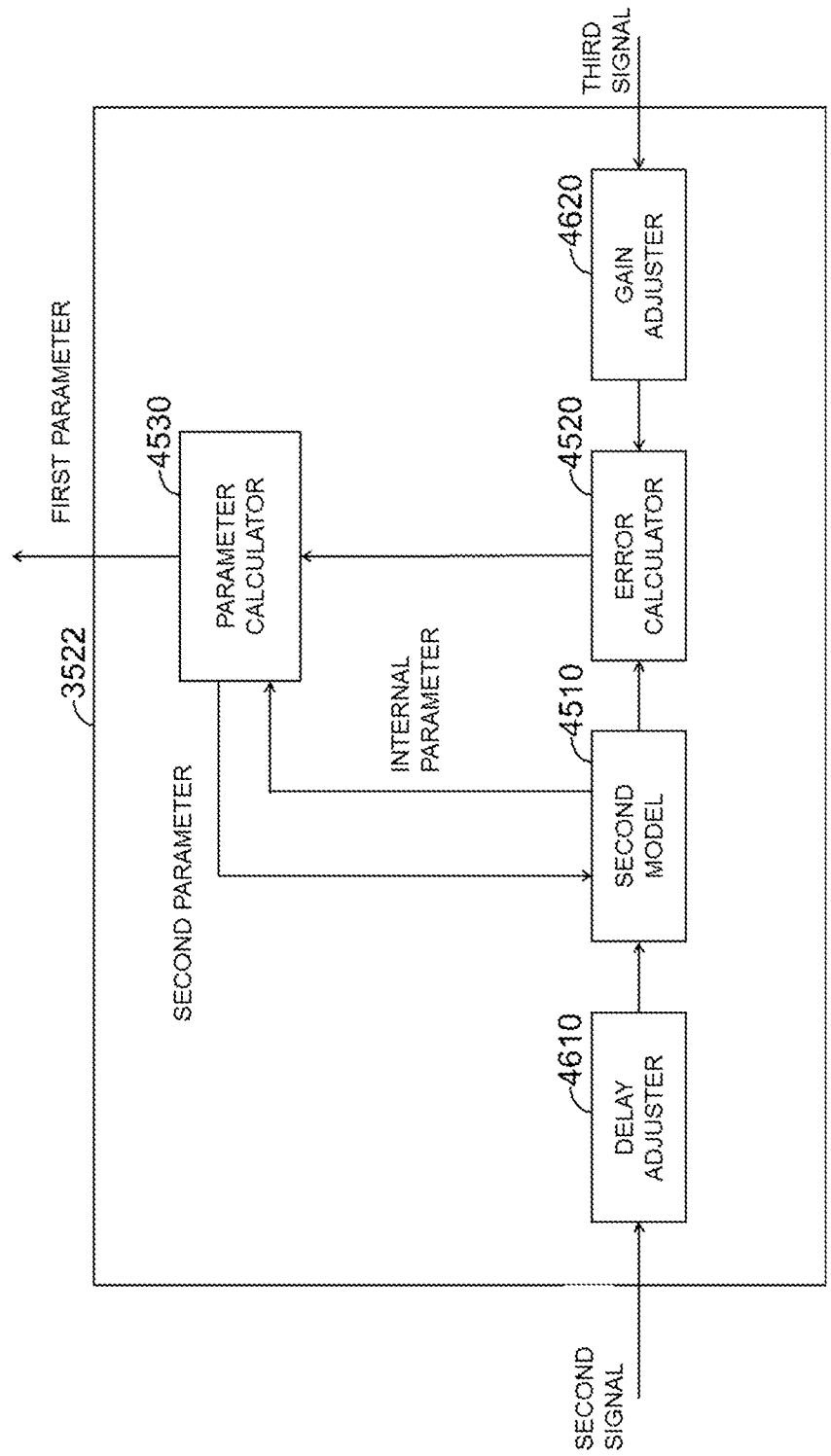
FIG. 46 is a diagram illustrating an example of the configuration of the model parameter calculator.

FIG. 46 is a diagram illustrating an example of the configuration of the model parameter calculator 3522. The model parameter calculator 3522 further includes a delay adjuster 4610 and a gain adjuster 4620. The gain adjuster 4620 multiplies the third signal by a gain. The delay adjuster 4610 delays the second signal such that the timing at which the approximated value of the third signal is input to the error calculator 4520 and the timing at which the third signal is input to the error calculator 4520 are synchronized.

Note that the delay adjuster 4610 may perform processing similar to that of the delay adjuster 1610 described above. The gain adjuster 4620 may perform processing similar to that of the gain adjuster 1620 described above.

The parameter calculator 4530 may calculate the first parameter and the second parameter using the error and an internal parameter of the second model 4510. The internal parameter may contain the second parameter and the output value of at least one node in the second model 4510.

(5) Fifth Example Alteration

The transmission process 3530 may have the configuration of the transmission path 120 described in the first to fifth example embodiments. For example, the transmission process 3530 may include a communication path, a band-pass filter, an amplifier, and a modulator.

The modeling processor 3520 may include the digital restorer 149 described above. The digital restorer 149 generates a restored signal of the second signal from the third signal (in this example, a signal generated through the process of passage of the second signal through the communication path). Such a restored signal of the second signal is referred to as a "fifth signal" as in the case of that described above. The modeling processor 3520 may calculate the first parameter using the fifth signal and the third signal.

The model parameter calculator may calculate the first parameter using the fifth signal and the third signal generated through the transmission process 3530.

The model parameter calculator may calculate the first parameter using the fifth signal and the third signal generated through the process of passage of the fifth signal through the band-pass filter, the amplifier, and the modulator.

The modeling processor 3520 may calculate the second parameter of the second model 4510 using the fifth signal and the third signal.

(6) Sixth Example Alteration

The delta-sigma modulator 3510 may have a configuration similar to that of the delta-sigma modulator 111 described in the first to fifth example embodiments. The modeling processor 3520 may include the NN processor 112 and the NN learner 113 described in the first to fifth example embodiments.

Note that the above-described example embodiments and example alterations are presented by way of example only and the scope of the technical idea of the present disclosure is not limited to the configurations described above. Any other embodiment that is conceivable in the scope of the technical idea of the present disclosure is included in the scope of the present disclosure.

The processing steps shown in the flowcharts or the sequence diagrams do not necessarily have to be performed in the order illustrated therein. The processing steps may be performed in the order different from the order illustrated in the drawing, and two or more processing steps may be performed in parallel. Moreover, a part of the processing steps may be deleted, and another processing step may be added.

An arrow in the drawing is an example of a direction of a flow of a signal (data) from one constituent element to another constituent element and does not exclude bidirectional communication between the two constituent elements.

In the Specification, "to transmit X to Y" is not limited to directly transmitting X to Y and includes indirectly transmitting X to Y (that is, transmitting X to another node and transmitting X to Y from the other node). Likewise, "to receive X from Y" is not limited to directly receiving X from Y and includes indirectly receiving X from Y (that is, transmitting X to another node from Y and receiving X from the other node). Therefore, a relay may be disposed between the first apparatus 810 and the second apparatus 820. The relay may relay transmission of the second signal and/or transmission of the transmission-related information.

The function of the apparatus described in the Specification may be implemented by any one of software, hardware, and a combination of software and hardware. A program code (an instruction) configuring the software may be stored in each apparatus or an external computer-readable recording medium, for example, and read into the memory at the time of execution and executed by the processor. Moreover, a non-transitory computer readable medium storing the program code may be provided.

Part or the whole of the example embodiments and the example alterations can also be described in a manner such as, but not limited to, the following supplementary notes.

(Supplementary Note A1)

A delta-sigma modulation apparatus including:

a delta-sigma modulator configured to perform delta-sigma modulation on a first signal as an external input signal, and output a second signal;

a neural network processor including a first neural network operating according to a predetermined first parameter; and a neural network learner configured to calculate the first parameter, wherein the neural network learner is configured to calculate the first parameter using: a third signal generated through a transmission process of the second signal; and the second signal or a restored signal of the second signal generated from the third signal, wherein the neural network processor is configured to update the first parameter to the first parameter calculated by the neural network learner, wherein the neural network processor is configured to output, using the second signal through the first neural network, a fourth signal that is an approximated value of a signal which is generated through at least part of the transmission process, and wherein the delta-sigma modulator is configured to perform the delta-sigma modulation on the first signal using the fourth signal that is output from the neural network processor, and output the second signal.

(Supplementary Note A2)

The delta-sigma modulation apparatus according to the supplementary note A1, wherein the delta-sigma modulator is configured to calculate, using the fourth signal, a component for suppressing at least part of distortion that occurs in the transmission process, and reflect the component in the second signal.

(Supplementary Note A3)

The delta-sigma modulation apparatus according to the supplementary note A1, wherein the delta-sigma modulator includes:

an up-converter configured to up-convert the first signal;

a loop filter configured to output, using an output of the up-converter and the fourth signal, a signal including a component for suppressing at least part of distortion that occurs in the transmission process; and a quantizer configured to quantize the signal output by the loop filter, and output the second signal.

(Supplementary Note A4)

The delta-sigma modulation apparatus according to the supplementary note A1, wherein the first signal includes a first in-phase component signal and a first quadrature component signal, and wherein the delta-sigma modulator includes:

a down-converter configured to down-convert the fourth signal to a second in-phase component signal and a second quadrature component signal;

a first loop filter configured to output, using the first in-phase component signal and the second in-phase component signal, a signal including a first component for suppressing at least part of distortion that occurs in the transmission process;

a first quantizer configured to quantize the signal output by the first loop filter, and output a first quantized signal;

a second loop filter configured to output, using the first quadrature component signal and the second quadrature component signal, a signal including a second component for suppressing at least part of the distortion;

a second quantizer configured to quantize the signal output by the second loop filter, and output a second quantized signal; and an up-converter configured to up-convert the first quantized signal and the second quantized signal, and output the second signal.

(Supplementary Note A5)

The delta-sigma modulation apparatus according to any one of the supplementary notes A1 to A4, wherein the neural network learner includes:

a transmission model that is obtained by modeling at least part of the transmission process and is configured to output an approximated value of the third signal using the second signal;

an error calculator configured to calculate an error between the approximated value of the third signal and the third signal; and a parameter calculator configured to calculate the first parameter using the error.

(Supplementary Note A6)

The delta-sigma modulation apparatus according to the supplementary note A5, wherein the parameter calculator is configured to calculate the first parameter in a case in which the error is greater than a predetermined first magnitude.

(Supplementary Note A7)

The delta-sigma modulation apparatus according to the supplementary note A6, wherein the parameter calculator is configured to continue calculating the first parameter until the error becomes less than a predetermined second magnitude, and wherein the second magnitude is smaller than the first magnitude.

(Supplementary Note A8)

The delta-sigma modulation apparatus according to any one of the supplementary notes A5 to A7, wherein the transmission model includes a second neural network that is configured to operate according to a predetermined second parameter and output an approximated value of a signal which is generated through at least part of the transmission process, and wherein the parameter calculator is configured to calculate the second parameter using the error, and update the second parameter of the second neural network to the second parameter calculated by the parameter calculator.

(Supplementary Note A9)

The delta-sigma modulation apparatus according to the supplementary note A8, wherein the parameter calculator is configured to calculate the first parameter and the second parameter using the error and an internal parameter of the transmission model, and wherein the internal parameter includes the second parameter and an output value of at least one node in the second neural network.

(Supplementary Note A10)

The delta-sigma modulation apparatus according to any one of the supplementary notes A5 to A9, wherein the neural network learner further includes:

a gain adjuster configured to multiply the third signal by a gain; and a delay adjuster configured to delay the second signal such that the timing at which the approximated value of the third signal is input to the error calculator and the timing at which the third signal is input to the error calculator are synchronized.

(Supplementary Note A11)

The delta-sigma modulation apparatus according to any one of the supplementary notes A1 to A10, wherein the transmission process includes a communication path, a band-pass filter, an amplifier, and a modulator, wherein the delta-sigma modulation apparatus further includes a restorer configured to generate a fifth signal as the restored signal of the second signal from the third signal generated through the communication path, and wherein the neural network learner is configured to calculate the first parameter using the fifth signal and the third signal generated through the transmission process.

(Supplementary Note A12)

The delta-sigma modulation apparatus according to any one of the supplementary notes A1 to A10, wherein the transmission process includes a communication path, a band-pass filter, an amplifier, and a modulator, wherein the delta-sigma modulation apparatus further includes a restorer configured to generate a fifth signal as the restored signal of the second signal from the third signal generated through the communication path, and wherein the neural network learner is configured to calculate the first parameter using: the fifth signal; and the third signal generated through a process of passage of the fifth signal through the band-pass filter, the amplifier, and the modulator.

(Supplementary Note A13)

The delta-sigma modulation apparatus according to any one of the supplementary notes A1 to A12, wherein the first neural network includes an input layer, at least one intermediate layer, and an output layer, wherein the input layer includes a node to which a current value of the second signal is input, and wherein the input layer further includes at least one of a node to which a past value of the second signal is input, a node to which a result of logical operations of two or more nodes in the input layer is input, and a node having an output line through which the current value of the second signal is output to the output layer without passing through the intermediate layer.

(Supplementary Note A14)

The delta-sigma modulation apparatus according to any one of the supplementary notes A1 to A13, wherein the fourth signal includes an approximated value of at least part of distortion that occurs through the at least part of the transmission process.

(Supplementary Note A15)

A delta-sigma modulation method including:

performing delta-sigma modulation on a first signal as an external input signal, and outputting a second signal;

calculating a first parameter of a first neural network using: a third signal generated through a transmission process of the second signal; and the second signal or a restored signal of the second signal generated from the third signal;

updating the first parameter of the first neural network to the calculated first parameter;

outputting, using the second signal through the first neural network, a fourth signal that is an approximated value of a signal which is generated through at least part of the transmission process; and performing the delta-sigma modulation on the first signal using the fourth signal, and outputting the second signal.

(Supplementary Note A16)

A non-transitory computer-readable recording medium on which a program is recorded, the program causing a processor to execute:

performing delta-sigma modulation on a first signal as an external input signal, and outputting a second signal;

calculating a first parameter of a first neural network using: a third signal generated through a transmission process of the second signal; and the second signal or a restored signal of the second signal generated from the third signal;

updating the first parameter of the first neural network to the calculated first parameter;

outputting, using the second signal through the first neural network, a fourth signal that is an approximated value of a signal which is generated through at least part of the transmission process; and performing the delta-sigma modulation on the first signal using the fourth signal, and outputting the second signal.

(Supplementary Note B1)

A delta-sigma modulation apparatus including:

a delta-sigma modulator configured to perform delta-sigma modulation; and a modeling processor configured to approximate transmission characteristics of at least part of a transmission process, wherein the delta-sigma modulator is configured to perform the delta-sigma modulation on a first signal as an input signal, and output a second signal, wherein the modeling processor is configured d to output, using the second signal and a third signal generated through a transmission process of the second signal, a fourth signal that is an approximated value of a signal which is generated through at least part of the transmission process, and wherein the delta-sigma modulator is configured to perform the delta-sigma modulation on the first signal using the fourth signal, and output the second signal.

(Supplementary Note B2)

The delta-sigma modulation apparatus according to the supplementary note B1, wherein the modeling processor includes:

a model output calculator including a first model operating according to a predetermined first parameter; and a model parameter calculator configured to calculate the first parameter, wherein the model parameter calculator is configured to calculate the first parameter using: the third signal; and the second signal or a restored signal of the second signal generated from the third signal, wherein the model output calculator is configured to update the first parameter of the first model to the first parameter calculated by the model parameter calculator, and wherein the model output calculator is configured to output the fourth signal using the second signal through the first model.

(Supplementary Note B3)

The delta-sigma modulation apparatus according to the supplementary note B2, wherein the delta-sigma modulator is configured to perform the delta-sigma modulation on the first signal using the fourth signal that is output from the model output calculator, and output the second signal.

(Supplementary Note B4)

The delta-sigma modulation apparatus according to the supplementary note B1, wherein the delta-sigma modulator is configured to calculate, using the fourth signal, a component for suppressing at least part of distortion that occurs in the transmission process, and reflect the component in the second signal.

(Supplementary Note B5)

The delta-sigma modulation apparatus according to the supplementary note B1, wherein the delta-sigma modulator includes:
an up-converter configured to up-convert the first signal;
a loop filter configured to output, using an output of the up-converter and the fourth signal, a signal including a component for suppressing at least part of distortion that occurs in the transmission process; and
a quantizer configured to quantize the signal output by the loop filter, and output the second signal.

(Supplementary Note B6)

The delta-sigma modulation apparatus according to the supplementary note B1, wherein the first signal includes a first in-phase component signal and a first quadrature component signal, and
wherein the delta-sigma modulator includes:
a down-converter configured to down-convert the fourth signal to a second in-phase component signal and a second quadrature component signal;
a first loop filter configured to output, using the first in-phase component signal and the second in-phase component signal, a signal including a first component for suppressing at least part of distortion that occurs in the transmission process;
a first quantizer configured to quantize the signal output by the first loop filter, and output a first quantized signal;
a second loop filter configured to output, using the first quadrature component signal and the second quadrature component signal, a signal including a second component for suppressing at least part of the distortion;
a second quantizer configured to quantize the signal output by the second loop filter, and output a second quantized signal; and
an up-converter configured to up-convert the first quantized signal and the second quantized signal, and output the second signal.

(Supplementary Note B7)

The delta-sigma modulation apparatus according to the supplementary note B2, wherein the model parameter calculator includes:
a second model that is obtained by modeling at least part of the transmission process and is configured to output an approximated value of the third signal using the second signal;
an error calculator configured to calculate an error between the approximated value of the third signal and the third signal; and
a first parameter calculator configured to calculate the first parameter using the error.

(Supplementary Note B8)

The delta-sigma modulation apparatus according to the supplementary note B7, wherein the first parameter calculator is configured to calculate the first parameter in a case in which the error is greater than a predetermined first magnitude.

(Supplementary Note B9)

The delta-sigma modulation apparatus according to the supplementary note B8, wherein the first parameter calculator is configured to continue calculating the first parameter until the error becomes less than a predetermined second magnitude, and
wherein the second magnitude is smaller than the first magnitude.

(Supplementary Note B10)

The delta-sigma modulation apparatus according to the supplementary note B7, wherein the second model is configured to operate according to a predetermined second parameter, and
wherein the first parameter calculator is configured to calculate the second parameter using the error, and update the second parameter of the second model to the second parameter calculated by the first parameter calculator.

(Supplementary Note B11)

The delta-sigma modulation apparatus according to the supplementary note B10, wherein the first parameter calculator is configured to calculate the first parameter and the second parameter using the error and an internal parameter of the transmission model, and
wherein the internal parameter includes the second parameter and an output value of at least one node in the second model.

(Supplementary Note B12)

The delta-sigma modulation apparatus according to the supplementary note B7, wherein the model parameter calculator further includes:
a gain adjuster configured to multiply the third signal by a gain; and
a delay adjuster configured to delay the second signal such that the timing at which the approximated value of the third signal is input to the error calculator and the timing at which the third signal is input to the error calculator are synchronized.

(Supplementary Note B13)

The delta-sigma modulation apparatus according to the supplementary note B2, wherein the transmission process includes a communication path, a band-pass filter, an amplifier, and a modulator,
wherein the delta-sigma modulation apparatus further includes a restorer configured to generate a fifth signal as the restored signal of the second signal from the third signal generated through the communication path, and
wherein the model parameter calculator is configured to calculate the first parameter using the fifth signal and the third signal generated through the transmission process.

(Supplementary Note B14)

The delta-sigma modulation apparatus according to the supplementary note B2, wherein the transmission process includes a communication path, a band-pass filter, an amplifier, and a modulator,
wherein the delta-sigma modulation apparatus further includes a restorer configured to generate a fifth signal as the restored signal of the second signal from the third signal generated through the communication path, and
wherein the model parameter calculator is configured to calculate the first parameter using: the fifth signal; and the third signal generated through a process of passage of the fifth signal through the band-pass filter, the amplifier, and the modulator.

(Supplementary Note B15)

The delta-sigma modulation apparatus according to the supplementary note B1, wherein the fourth signal includes an approximated value of at least part of distortion that occurs through the at least part of the transmission process.

(Supplementary Note B16)

The delta-sigma modulation apparatus according to any one of the supplementary notes B1 to B15, wherein the fourth signal is a signal representing a complex number, and wherein the delta-sigma modulation apparatus further includes a converter configured to convert the fourth signal representing the complex number to the fourth signal representing a real number.

(Supplementary Note B17)

The delta-sigma modulation apparatus according to the supplementary note B16, wherein the converter includes an up-converter and a down-converter.

(Supplementary Note B18)

A delta-sigma modulation method including:

performing delta-sigma modulation on a first signal as an input signal, and outputting a second signal;

outputting, using the second signal and a third signal generated through a transmission process of the second signal, a fourth signal that is an approximated value of a signal which is generated through at least part of the transmission process; and performing the delta-sigma modulation on the first signal using the fourth signal, and outputting the second signal.

(Supplementary Note B19)

A non-transitory computer-readable recording medium on which a program is recorded, the program causing a processor to execute:

performing delta-sigma modulation on a first signal as an input signal, and outputting a second signal;

outputting, using the second signal and a third signal generated through a transmission process of the second signal, a fourth signal that is an approximated value of a signal which is generated through at least part of the transmission process; and performing the delta-sigma modulation on the first signal using the fourth signal, and outputting the second signal.

In the process of transmission of a signal output through delta-sigma modulation, it is possible to suppress distortion which occurs in the signal.

What is claimed is:

1. A delta-sigma modulation apparatus comprising:
 a memory configured to store an instruction; and
 at least one processor configured to execute the instruction,
 wherein the processor is configured to
  perform delta-sigma modulation; and
  approximate transmission characteristics of at least part of a transmission process, and
 wherein the processor is further configured to
  perform the delta-sigma modulation on a first signal as an input signal and output a second signal;
  output, using the second signal and a third signal generated through a transmission process of the second signal, a fourth signal that is an approximated value of a signal which is generated through at least part of the transmission process; and
  perform the delta-sigma modulation on the first signal using the fourth signal and output the second signal.

2. The delta-sigma modulation apparatus according to claim 1,
 wherein the processor is further configured to
  operate as a first model that operates according to a predetermined first parameter; and
  calculate the first parameter, and
 wherein the processor is further configured to
  calculate the first parameter using: the third signal; and the second signal or a restored signal of the second signal generated from the third signal;
  update the first parameter of the first model to the calculated first parameter; and
  output the fourth signal using the second signal through the first model.

3. The delta-sigma modulation apparatus according to claim 2,
 wherein the processor is further configured to perform the delta-sigma modulation on the first signal using the fourth signal that is output through the first model, and output the second signal.

4. The delta-sigma modulation apparatus according to claim 1,
 Wherein the processor is further configured to calculate, using the fourth signal, a component for suppressing at least part of distortion that occurs in the transmission process, and reflect the component in the second signal.

5. The delta-sigma modulation apparatus according to claim 1,
 wherein the processor is further configured to perform
  up-conversion processing to up-convert the first signal;
  loop filtering processing to output, using an output of the up-conversion processing and the fourth signal, a signal including a component for suppressing at least part of distortion that occurs in the transmission process; and
  quantization processing to quantize the signal output by the loop filtering processing and output the second signal.

6. The delta-sigma modulation apparatus according to claim 1,
 wherein the first signal includes a first in-phase component signal and a first quadrature component signal, and
 wherein the processor is further configured to perform
  down-conversion processing to down-convert the fourth signal to a second in-phase component signal and a second quadrature component signal;
  first loop filtering processing to output, using the first in-phase component signal and the second in-phase component signal, a signal including a first component for suppressing at least part of distortion that occurs in the transmission process;
  first quantization processing to quantize the signal output by the first loop filtering processing and output a first quantized signal;
  second loop filtering processing to output, using the first quadrature component signal and the second quadrature component signal, a signal including a second component for suppressing at least part of the distortion;
  second quantization processing to quantize the signal output by the second loop filtering processing and output a second quantized signal; and
  up-conversion processing to up-convert the first quantized signal and the second quantized signal and output the second signal.

7. The delta-sigma modulation apparatus according to claim 2,
 wherein the processor is further configured to operate as a second model that is obtained by modeling at least part of the transmission process and is configured to output an approximated value of the third signal using the second signal, and
 wherein the processor is further configured to
  perform error calculation processing to calculate an error between the approximated value of the third signal and the third signal; and
  calculate the first parameter using the error.

8. The delta-sigma modulation apparatus according to claim 7,
wherein the processor is further configured to calculate the first parameter in a case in which the error is greater than a predetermined first magnitude.

9. The delta-sigma modulation apparatus according to claim 8,
wherein the processor is further configured to continue calculating the first parameter until the error becomes less than a predetermined second magnitude, and
wherein the second magnitude is smaller than the first magnitude.

10. The delta-sigma modulation apparatus according to claim 7,
wherein the second model is configured to operate according to a predetermined second parameter, and
wherein the processor is further configured to
calculate the second parameter using the error; and
update the second parameter of the second model to the calculated second parameter.

11. The delta-sigma modulation apparatus according to claim 10,
wherein the processor is further configured to calculate the first parameter and the second parameter using the error and an internal parameter of the second model, and
wherein the internal parameter includes the second parameter and an output value of at least one node in the second model.

12. The delta-sigma modulation apparatus according to claim 7,
wherein the processor is further configured to
multiply the third signal by a gain; and
delay the second signal such that the timing at which the approximated value of the third signal is input to the error calculation processing and the timing at which the third signal is input to the error calculation processing are synchronized.

13. The delta-sigma modulation apparatus according to claim 2,
wherein the transmission process includes a communication path, a band-pass filter, an amplifier, and a modulator,
wherein the processor is further configured to generate a fifth signal as the restored signal of the second signal from the third signal generated through the communication path, and
wherein the processor is further configured to calculate the first parameter using the fifth signal and the third signal generated through the transmission process.

14. The delta-sigma modulation apparatus according to claim 2,
wherein the transmission process includes a communication path, a band-pass filter, an amplifier, and a modulator,
wherein the processor is further configured to generate a fifth signal as the restored signal of the second signal from the third signal generated through the communication path, and
wherein the processor is further configured to calculate the first parameter using: the fifth signal; and the third signal generated through a process of passage of the fifth signal through the band-pass filter, the amplifier, and the modulator.

15. The delta-sigma modulation apparatus according to claim 1,
wherein the fourth signal includes an approximated value of at least part of distortion that occurs through the at least part of the transmission process.

16. The delta-sigma modulation apparatus according to claim 1,
wherein the fourth signal is a signal representing a complex number, and
wherein the processor is further configured to perform conversion processing to convert the fourth signal representing the complex number to the fourth signal representing a real number.

17. The delta-sigma modulation apparatus according to claim 16,
wherein the conversion processing includes up-conversion processing and down-conversion processing.

18. A delta-sigma modulation method comprising:
performing delta-sigma modulation on a first signal as an input signal, and outputting a second signal;
outputting, using the second signal and a third signal generated through a transmission process of the second signal, a fourth signal that is an approximated value of a signal which is generated through at least part of the transmission process; and
performing the delta-sigma modulation on the first signal using the fourth signal, and outputting the second signal.

19. A non-transitory computer-readable recording medium on which a program is recorded, the program causing a processor to execute:
performing delta-sigma modulation on a first signal as an input signal, and outputting a second signal;
outputting, using the second signal and a third signal generated through a transmission process of the second signal, a fourth signal that is an approximated value of a signal which is generated through at least part of the transmission process; and
performing the delta-sigma modulation on the first signal using the fourth signal, and outputting the second signal.

* * * * *